United States Patent
Durcan et al.

(10) Patent No.: US 7,625,795 B2
(45) Date of Patent: *Dec. 1, 2009

(54) CONTAINER CAPACITOR STRUCTURE AND METHOD OF FORMATION THEREOF

(75) Inventors: D. Mark Durcan, Boise, ID (US); Trung T. Doan, Boise, ID (US); Roger R. Lee, Boise, ID (US); Fernando Gonzalez, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 356 days.

This patent is subject to a terminal disclaimer.

(21) Appl. No.: 11/217,742

(22) Filed: Sep. 1, 2005

(65) Prior Publication Data

US 2006/0006445 A1 Jan. 12, 2006

Related U.S. Application Data

(60) Division of application No. 10/138,458, filed on May 3, 2002, now abandoned, which is a continuation of application No. 09/652,852, filed on Aug. 31, 2000, now Pat. No. 6,608,342, which is a division of application No. 09/389,866, filed on Sep. 2, 1999, now Pat. No. 6,159,818.

(51) Int. Cl.
*H01L 21/8242* (2006.01)

(52) U.S. Cl. ............................. 438/254; 257/E21.649

(58) Field of Classification Search ................. 257/308, 257/E27.087, E27.089, E21.649; 438/254, 438/255

See application file for complete search history.

(56) References Cited

U.S. PATENT DOCUMENTS

| | | | |
|---|---|---|---|
| 4,937,096 A | 6/1990 | Arakawa et al. | |
| 5,338,700 A | 8/1994 | Dennison et al. | |
| 5,340,763 A | 8/1994 | Dennison | |
| 5,362,666 A | 11/1994 | Dennison | |
| 5,409,858 A | * 4/1995 | Thakur et al. | 438/760 |
| 5,488,011 A | 1/1996 | Figura et al. | |
| 5,498,562 A | * 3/1996 | Dennison et al. | 438/253 |
| 5,702,968 A | 12/1997 | Chen | |

(Continued)

FOREIGN PATENT DOCUMENTS

JP 11074354 A 3/1999

*Primary Examiner*—Allan R. Wilson
(74) *Attorney, Agent, or Firm*—Leffert Jay & Polglaze, P.A.

(57) ABSTRACT

Container capacitor structure and method of construction. An etch mask and etch are used to expose portions of an exterior surface of an electrode ("bottom electrodes") of the structure. The etch provides a recess between proximal pairs of container capacitor structures, which is available for forming additional capacitance. A capacitor dielectric and top electrode are formed on and adjacent to, respectively, both an interior surface and portions of the exterior surface of the first electrode. Surface area common to both the first electrode and second electrodes is increased over using only the interior surface, providing additional capacitance without decreasing spacing for clearing portions of the capacitor dielectric and the second electrode away from a contact hole location. Clearing of the capacitor dielectric and the second electrode portions may be done at an upper location of a substrate assembly in contrast to clearing at a bottom location of a contact via.

19 Claims, 53 Drawing Sheets

U.S. PATENT DOCUMENTS

| | | |
|---|---|---|
| 5,786,250 A | 7/1998 | Wu et al. |
| 5,793,076 A | 8/1998 | Fazan et al. |
| 5,851,875 A | 12/1998 | Ping |
| 5,866,453 A | 2/1999 | Prall et al. |
| 5,874,756 A | 2/1999 | Ema et al. |
| 5,885,864 A | 3/1999 | Ma |
| 5,925,921 A | 7/1999 | Susak |
| 5,930,641 A | 7/1999 | Pan |
| 6,028,360 A | 2/2000 | Nakamura et al. |
| 6,037,218 A | 3/2000 | Dennison et al. |
| RE36,644 E | 4/2000 | Dennison |
| 6,048,763 A | 4/2000 | Doan et al. |
| 6,063,656 A | 5/2000 | Clampitt |
| 6,130,449 A | 10/2000 | Matsuoka et al. |
| 6,215,144 B1 | 4/2001 | Saito et al. |
| 6,348,411 B1 * | 2/2002 | Ireland et al. ............... 438/672 |

* cited by examiner

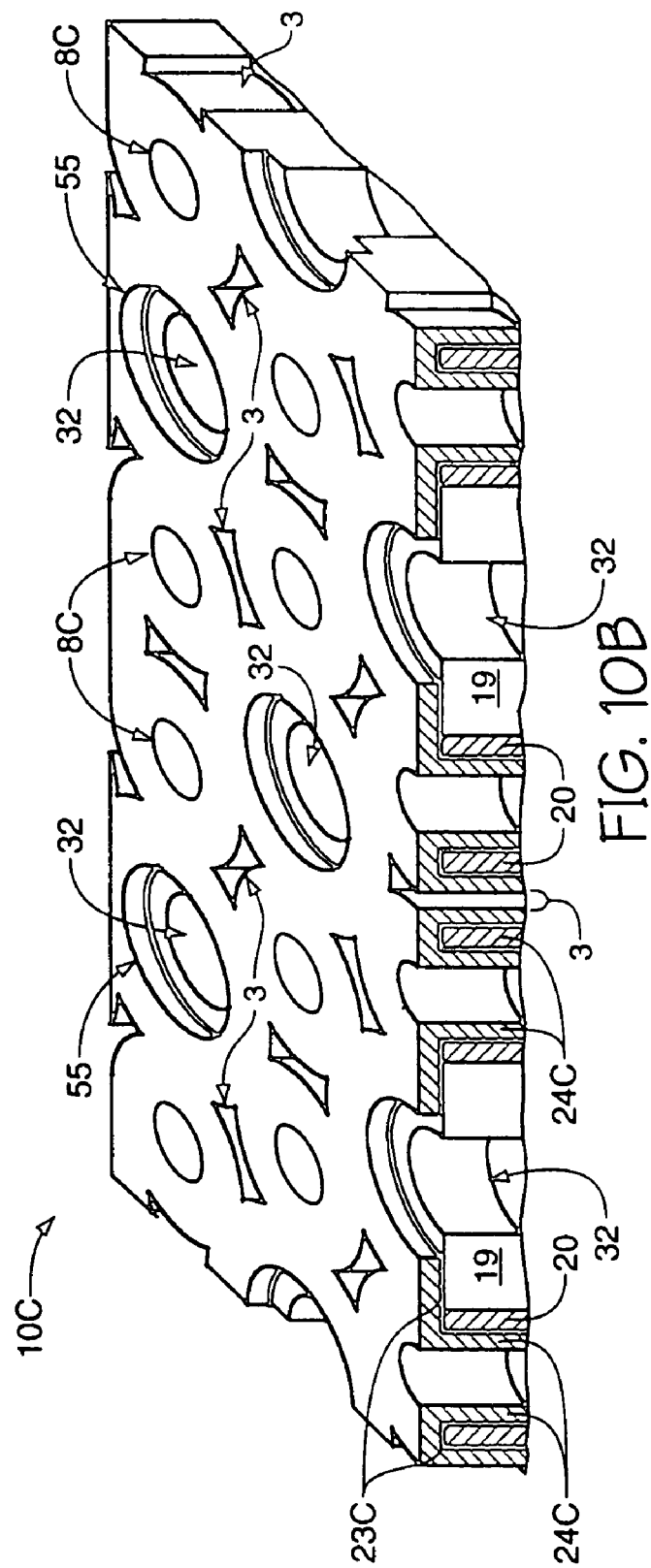

CONTAINER CAPACITOR STRUCTURE AND METHOD OF FORMATION THEREOF

RELATED APPLICATIONS

This application is a divisional application of U.S. Ser. No. 10/138,458, filed May 3, 2002, now abandoned which is a continuation of U.S. Ser. No. 09/652,852, filed Aug. 31, 2000 (now U.S. Pat. No. 6,608,342, issued Aug. 19, 2003) which is a divisional of U.S. Ser. No. 09/389,866, filed Sep. 2, 1999 (now U.S. Pat. No. 6,159,818, issued Dec. 12, 2000).

FIELD OF THE INVENTION

The present invention relates generally to capacitor structures, and more particularly to capacitor container structures for dense memory arrays.

BACKGROUND OF THE INVENTION

Advances in miniaturization of integrated circuits have led to smaller areas available for devices such as transistors and capacitors. For example, in semiconductor manufacture of a memory array for a dynamic random access memory (DRAM), each memory cell comprises a capacitor and a transistor. In a conventional DRAM, pairs of memory cells are located within regions ("memory cell areas") defined by intersecting row lines ("word lines") and column lines ("bit lines" or "digit lines"). Accordingly, to increase memory cell density of the memory array, row lines and column lines are positioned with minimal spacing ("pitch"). Using minimal pitch in turn constrains memory cell area.

In conflict with reducing memory cell area is maintaining a sufficient amount of memory cell charge storage capacitance. Each DRAM memory comprises a capacitor for storing charge. A capacitor is two conductors separated by a dielectric, and its capacitance, C, is mathematically determinable as:

$$C = (\in_r \in_o A)/d,$$

where $\in_o$ is a physical constant; dielectric constant, $\in_r$, is a material dependant property; distance, d, is distance between conductors; and area, A, is common surface area of the two conductors.

Thus, to increase capacitance, C, by increasing area, A, the DRAM industry has shifted from planar capacitor structures (e.g., "parallel plate capacitors") to vertical capacitor structures (e.g., "container capacitors"). As suggested by its name, one version of a "container capacitor" may be envisioned as including cup-shape electrodes, one stacked within the other, separated by a dielectric layer or layers. Accordingly, a container capacitor structure provides more common surface area, A, within a memory cell area than its planar counterpart, and thus, container capacitors do not have to occupy as much memory cell area as their planar counterparts in order to provide an equivalent capacitance.

To increase a container capacitor's capacitance, others have suggested etching to expose exterior surface 9 of capacitor bottom electrode 20 all around each in-process container capacitor 8A, as illustratively shown in the top plan view of FIG. 1 and in the cross-sectional view of FIG. 2. This is in contrast to the conventional approach of only using interior surface 2, as illustratively shown in the cross-sectional view of FIG. 3.

With respect to FIG. 2, capacitor dielectric layer 23A and capacitor top electrode layer 24A are deposited on interior surface 2 and exterior surface 9 of capacitor bottom electrode 20. With respect to FIG. 3, capacitor dielectric layer 23B and capacitor top electrode layer 24B are deposited on interior surface 2 of capacitor bottom electrode 20. Accordingly, surface area, A, of container capacitor 8A of substrate assembly 10A will be greater than that of container capacitor 8B of substrate assembly 10B. By substrate assembly as used herein, it is meant a substrate having one or more layers formed thereon or therein. Moreover, in the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above.

Container capacitor 8A poses problems for high-density memory array architectures. By high-density memory array architecture, it is meant a memory array with a bit line-to-bit line pitch equal to or less than 0.5 microns. Combined thickness of capacitor dielectric layer 23A and top capacitor electrode layer 24A is approximately 50 nm to 150 nm, and space 7 between capacitor bottom electrodes 20 exterior surface 9 and the contact site 5, indicated by dashed-lines, is approximately 200 nm or less. The contact site 5 designates a contact's current or eventual location. Forming capacitor dielectric layer 23A and top capacitor electrode layer 24A all around exterior surface 9 of capacitor bottom electrodes 20 encroaches upon nearby contact sites 5. While not wishing to be bound by theory, it is believed that this causes an increase in shorts between container capacitor 8A and contacts. This shorting may be due to diffusion and/or stress migration of material from capacitor top electrode layer 24A to one or more contacts. Moreover, such shorting may be due to residue left from a contact etch, as is explained below with respect to substrate assembly 10A.

With respect to substrate assembly 10A of FIG. 2, dielectric layer 60A is deposited on capacitor top electrode layer 24A, and then etch mask 61 is deposited and patterned for etching a contact via at the contact site 5. However, to provide the contact via, a portion of capacitor top electrode layer 24A and a portion of dielectric layer 23A at the bottom of the contact via must be cleared. Clearing materials at the bottom of a contact via is more problematic than clearing them at the top where they are more accessible. For example, a photo processes may not be tolerant enough to clear material from the bottom of the via given the via's diameter and depth.

In substrate assembly 10B of FIG. 3, dielectric layer 60B is deposited before deposition of capacitor top electrode layer 24B and dielectric layer 23B. Accordingly, those portions of capacitor top electrode layer 24B and dielectric layer 23B to be cleared for forming a contact via at the contact site 5 are more accessible than their counterparts in substrate assembly 10A.

Thus, there is a need in the art of container capacitors to provide a structure and process therefor which increases capacitance with less likelihood of the above-mentioned problems of shorts. Such structures and processes should also be more able to accommodate process limitations such as photo tolerance.

SUMMARY OF THE INVENTION

Accordingly, the embodiments of the present invention provide capacitor structures and methods for forming them.

One exemplary apparatus embodiment includes a cup-shaped bottom electrode defining an interior surface and an exterior surface. A capacitor dielectric is disposed on the interior surface and on portions of the exterior surface. A top electrode is also disposed on the interior surface and on portions of the exterior surface. An insulating layer contacts other portions of the bottom electrode's exterior surface. The top electrode is not deposited between a contact and surrounding bottom electrodes due to the presence of the insulating layer.

Other exemplary apparatus embodiment concern a memory array and, more particularly, a high-density memory array structure. In one exemplary embodiment of this type, a portion of a memory array comprises a contact surrounded by a plurality of container capacitors. Each capacitor has a cup-shaped bottom electrode, a dielectric, and a top electrode. Further, each contact is separated from each bottom electrode by a buffer material such as an insulating layer. Recesses between adjacent bottom electrodes are formed in the insulating layer, and a capacitor dielectric layer and top electrode layer are deposited in those recesses.

Other exemplary embodiments include methods for forming at least one capacitor. One such exemplary embodiment includes providing a plurality of cup-shaped bottom electrodes. A recess or trench between adjacent bottom electrodes is formed, thereby exposing a portion of the adjacent bottom electrodes' exterior surfaces. A capacitor dielectric is deposited at the interior of the cup-shaped bottom electrode as well as the interior of the recess. A top electrode is then deposited in the interior of the cup-shaped bottom electrode and the interior of the recess.

BRIEF DESCRIPTION OF THE DRAWINGS

Features and advantages of the present invention will become more apparent from the following description of the preferred embodiments described below in detail with reference to the accompanying drawings where:

FIG. 10B is a three-dimensional view of an in-process DRAM substrate assembly having undergone exemplary steps within the scope of the current invention.

Reference numbers refer to the same or similar parts of embodiments of the present invention throughout the several figures of the drawing.

DESCRIPTION OF THE PREFERRED EMBODIMENTS

In the following detailed Description of the Preferred Embodiments section, reference is made to the accompanying drawings which form a part of this disclosure, and which, by way of illustration, are provided for facilitating understanding of the specific embodiments. It is to be understood that embodiments, other than the specific embodiments disclosed herein, may be practiced without departing from the scope of the present invention. The following exemplary embodiments, directed to manufacture of dynamic random access memories (DRAMs), are provided to facilitate understanding of the present invention. Accordingly, some conventional details with respect to manufacture of DRAMs have been omitted to more clearly describe the exemplary embodiments herein.

Figure 4:
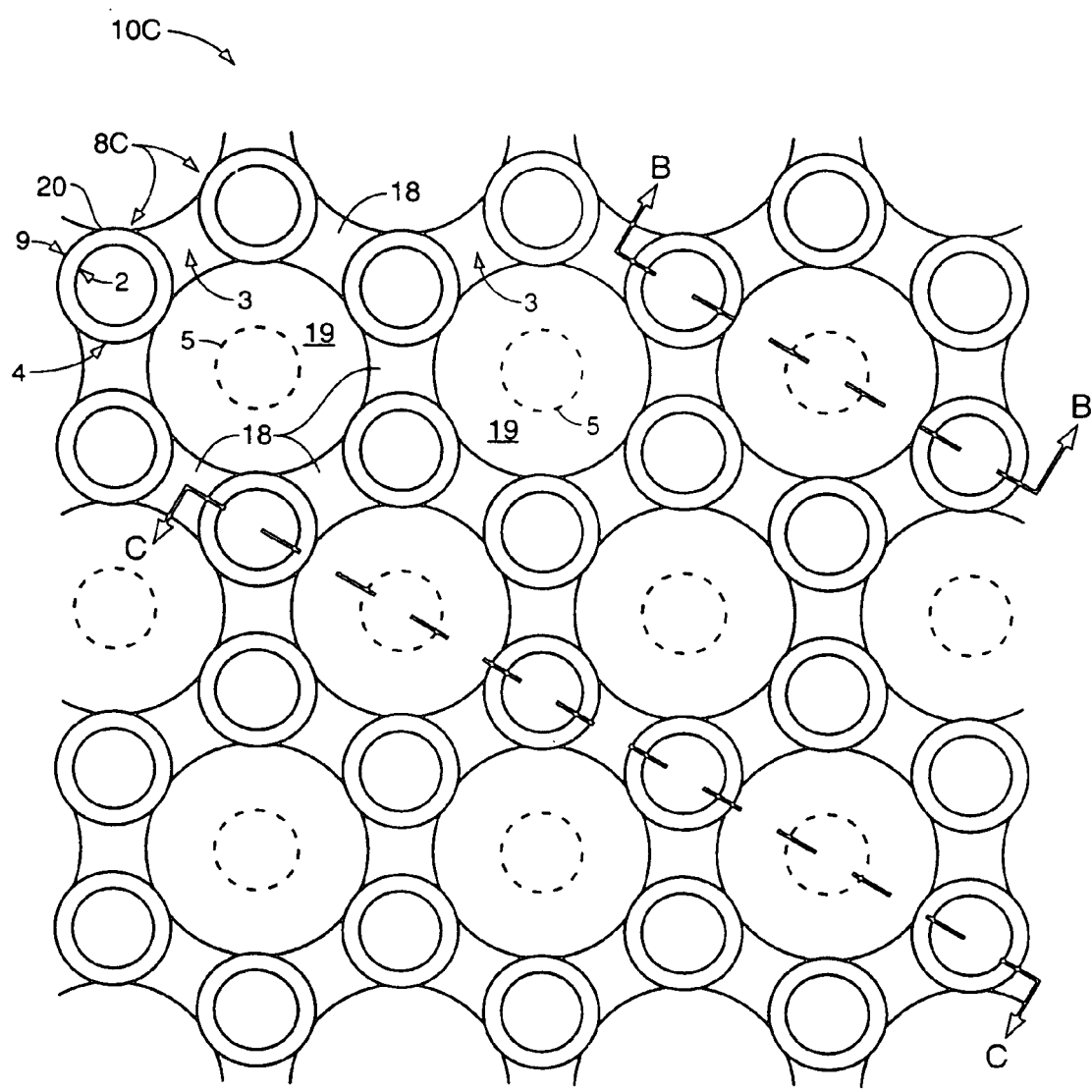
FIG. 4 is a partial top plan view illustrating an exemplary embodiment of the present invention as applied to an in-process DRAM substrate assembly.

FIG. 4 is a top plan view of an in-process substrate assembly 10C forming a portion of a memory array and serving as one exemplary embodiment of the current invention. Recesses 3 are formed in dielectric 19 and expose exterior surface portions 4 of exterior surface 9 of in-process container capacitor structures 8C. Accordingly, recesses 3 between adjacent container capacitors are available for depositing dielectric layer 23C and conductive layer 24C (shown in FIGS. 8A and B) on exterior surface portions 4, thereby allowing for additional capacitance. Other portions of exterior surface 9 of in-process container capacitor structures 8C are in contact with dielectric layer 19. Hence, deposition of dielectric layer 23C and conductive layer 24C does not reach the exterior surface 9 at those portions. As a result, adequate spacing between container capacitors and contacts is maintained.

Figure 5:
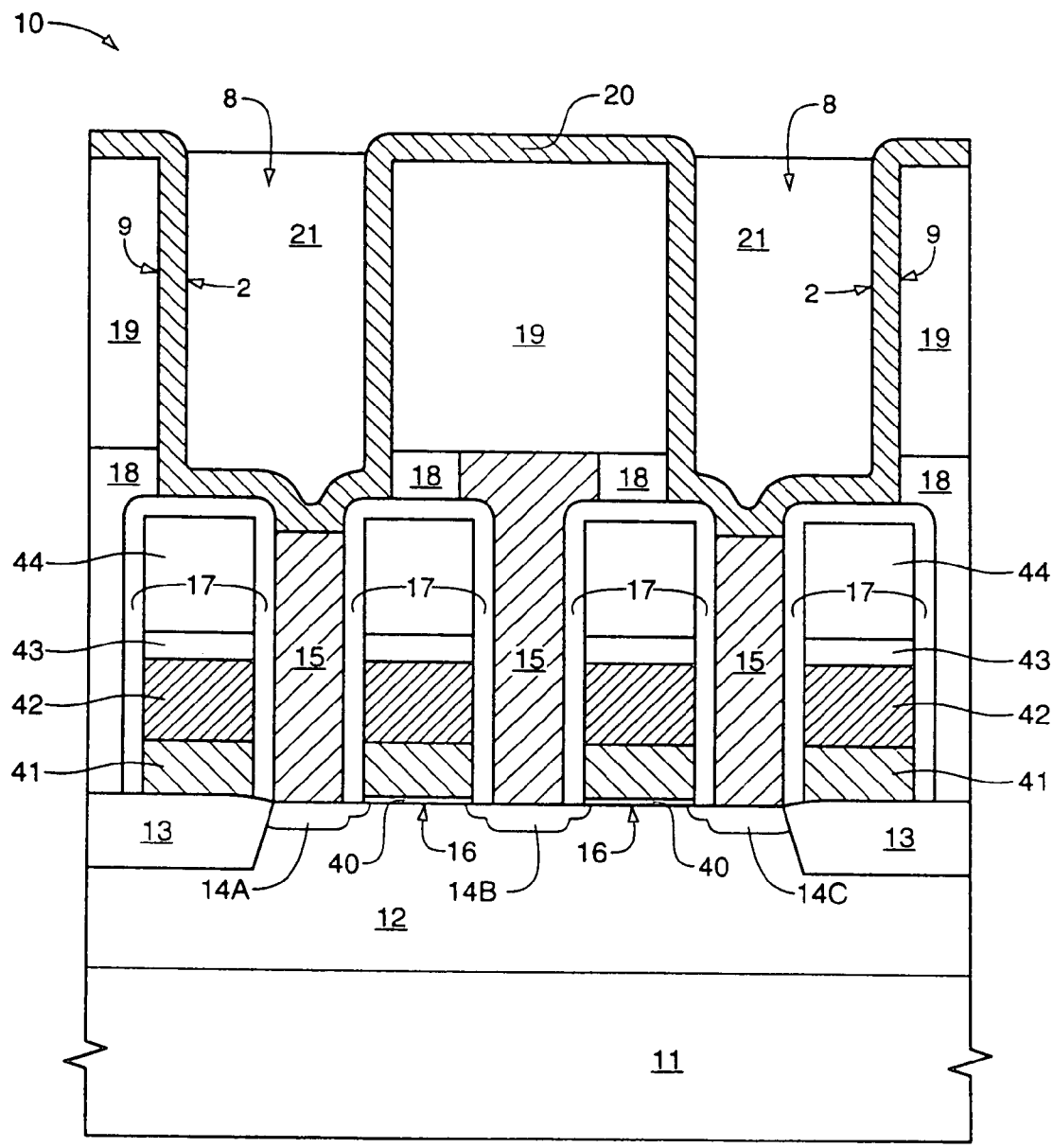
FIG. 5 is a cross-sectional view of an in-process DRAM substrate assembly of the prior art.

The stage of the in-process substrate assembly 10C achieved in FIG. 4 is reached through steps depicted in the subsequent figures. Referring to FIG. 5, there is shown a cross-sectional view of an exemplary portion of an embodiment of an in-process DRAM substrate assembly 10 of the prior art. Substrate 11 is a slice of single crystalline silicon. Conventionally, as a DRAM memory array uses NMOSFETs (n-channel metal-oxide-semiconductor field effect transistors), a P-well 12 is formed in substrate 11. Moreover, substrate 11 may have P-type impurities (e.g., boron) added thereto. Though NMOSFETs are described herein, it should be understood that alternatively P-channel MOSFETs may be used. Isolation regions 13 provide isolation from adjacent pairs of memory cells, such regions may be field oxides or shallow trench isolations (STIs). STI regions 13 may be formed in substrate 11 and filled with a combination of a thermal oxide and a high-density plasma (HDP) oxide.

N-type source, drain and contact regions 14A, 14B and 14C, formed in P-well 12, are for transistor stacks 16 and for electrical contact to conductive studs 15. N-type regions 14A, 14B and 14C may include lightly doped drains (LDDs). Conductive studs 15 may comprise polycrystalline silicon ("polysilicon") having N-type impurities (e.g., phosphorous and/or arsenic) added thereto, for conductivity; however, other conductive materials may be used.

Transistor stacks 16 are formed over substrate 11. Each transistor stack 16 may comprise gate dielectric 40 (e.g., a thermal oxide), gate conductors 41 and 42 (e.g., a conductive polysilicon under tungsten silicide), dielectric anti-reflective coating (DARC) 43 (e.g., a nitride), and dielectric cap 44 (e.g., a nitride). One or both of gate conductors 41 and 42 may be used as a row line in a memory array. Spacer layer 17 is illustratively shown as covering transistor gate stack 16; however, spacer layer 17 may be etched or otherwise removed such that it is not disposed above dielectric cap 44.

Dielectric layers 18 and 19 are separate layers, which may be made of the same or different materials. By way of example and not limitation, a silicon oxide having impurities ("dopants") added thereto may be used for dielectric layers 18 and 19. Moreover impurities such as phosphorous and boron may be used to enhance flow characteristics for deposition of dielectric layers 18 and 19. Accordingly, dielectric layers 18 and 19 may comprise boro-phospho-silicate glass (BPSG) or phospho-silicate glass (PSG). Alternatively, other low dielectric constant materials may be used including but not limited to other oxides, especially porous oxides.

Conductive layer 20, which may comprise one or more layers of one or more materials, forms a cup-shaped bottom electrode of each container capacitor structure. Notably, by cup-shaped bottom electrode, it should be understood to include any of circular, square, rectangular, trapezoidal, triangular, oval, or rhomboidal, among other shapes, with respect to the top down view of bottom electrodes shown in FIG. 4. Conventionally, conductive layer 20 is formed of N-type hemispherical grain silicon (HSG). However, a P-type material may be used. Accordingly, impurities such as boron, phosphorous and/or arsenic may be used. Moreover, a conductively formed polysilicon, ruthenium, ruthenium oxide, or like material may be used for conductive layer 20. A flow-fill material 21, such as photosensitive polymer ("photoresist"), is provided within the capacitor structures 8 and cured.

Figure 6:
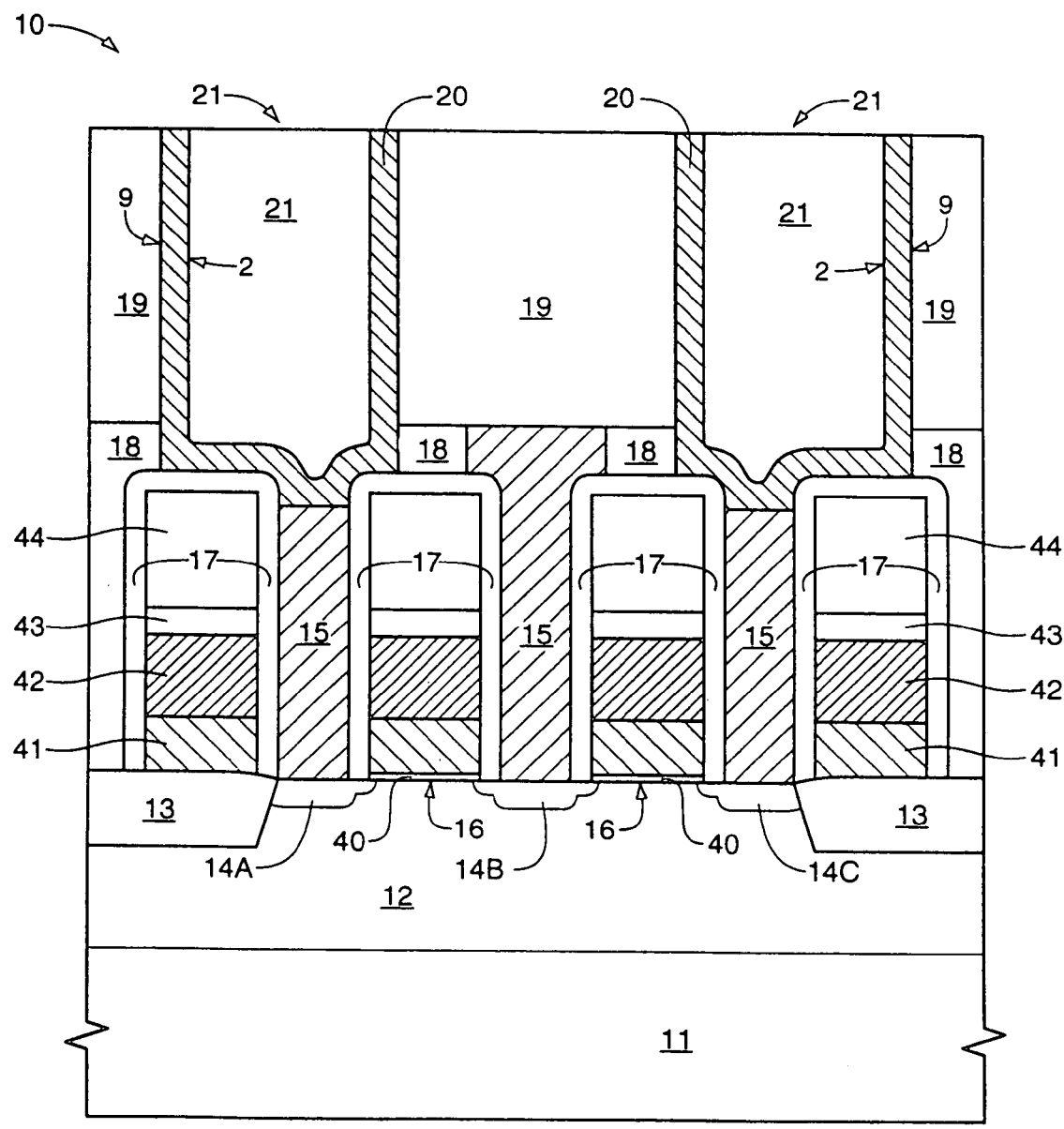
FIG. 6 is a cross-sectional view of the in-process DRAM substrate assembly having undergone at least one additional process known in the art.

Referring to FIG. 6, there is shown a cross-sectional view of substrate assembly 10 of FIG. 5 after a planarization step separating the bottom electrodes.

Figure 1:
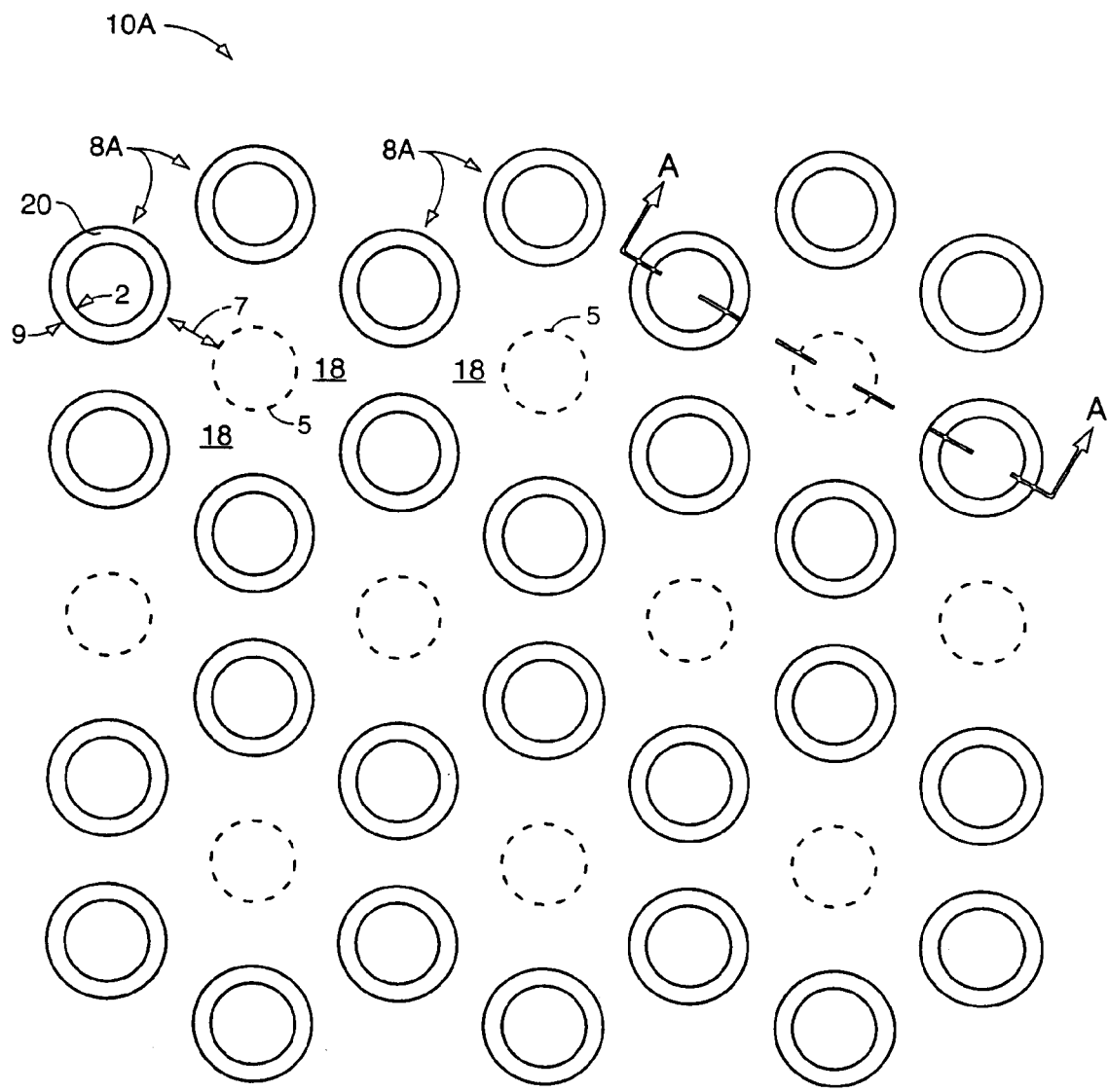
FIG. 1 is a top plan view of a portion of an in-process DRAM substrate assembly of the prior art.
Figure 7A:
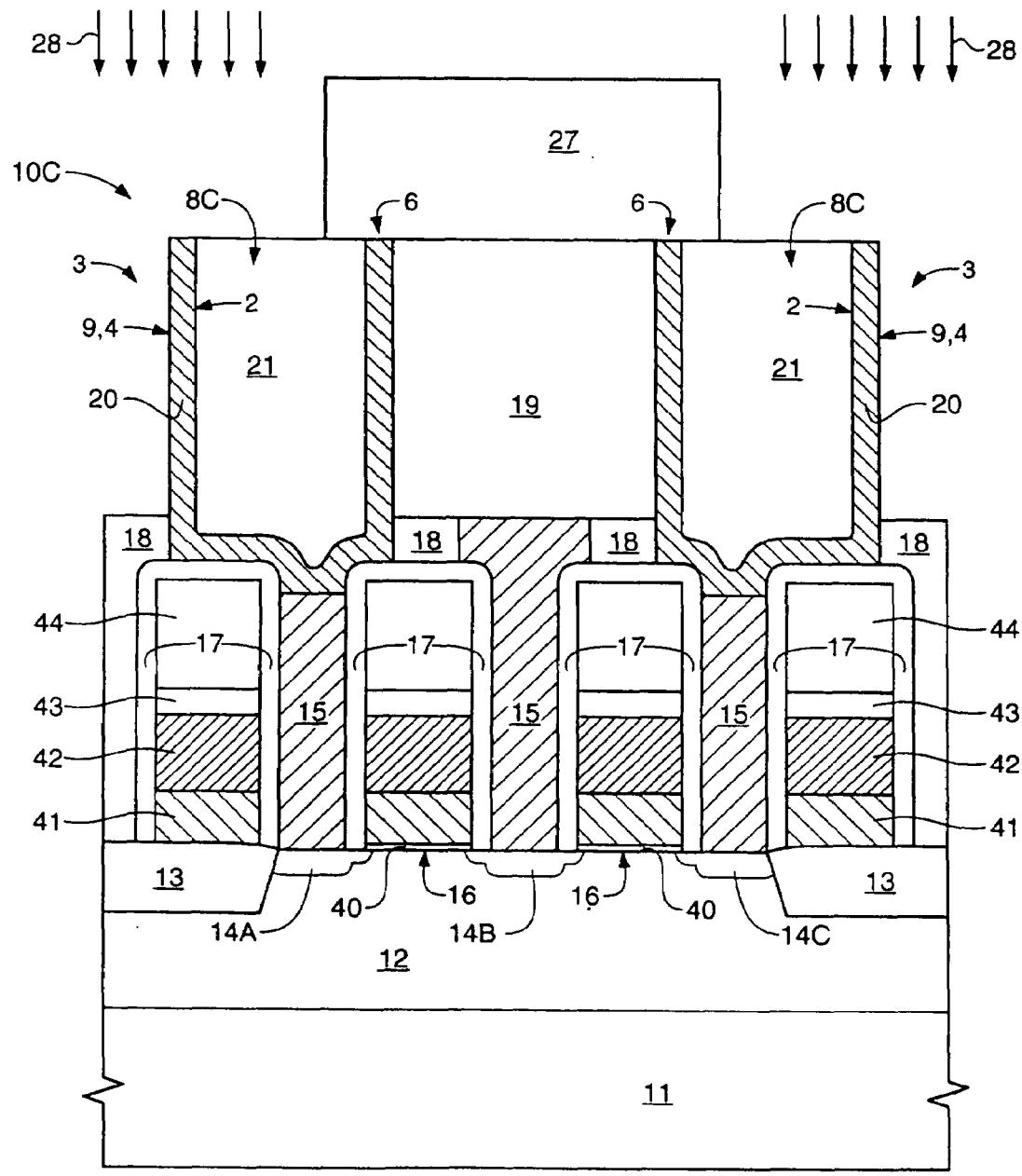
FIG. 7A is a cross-sectional view along B-B of FIG. 4 illustrating steps in a first exemplary embodiment of the present invention.
Figure 7B:
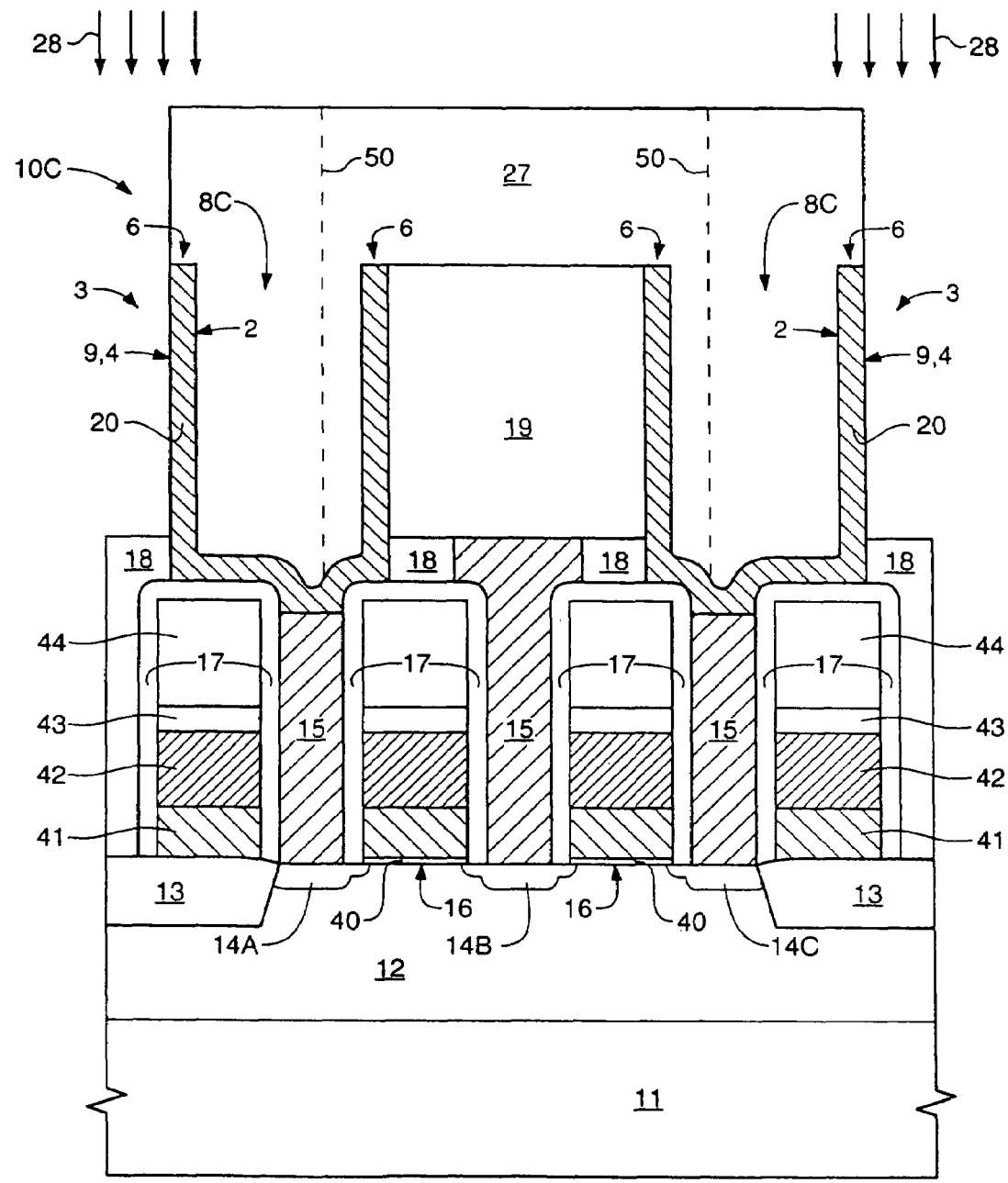
FIG. 7B is a cross-sectional view along B-B of FIG. 4 illustrating alternate steps in a second exemplary embodiment of the present invention.

FIG. 7A illustrates that etch mask 27 is then deposited and patterned. Etch mask 27 may comprise a photosensitive polymer. Alternatively, as illustratively shown in the cross-sectional view of FIG. 7B, flow-fill material 21 may be removed prior to depositing etch mask 27. In addition, FIG. 7B shows that etch mask 27 may extend to exterior surface portions 4. However, it may be difficult from a lithography standpoint to precisely align the edges of etch mask 27 with the exterior surface portions 4. Misalignment may result in the etch mask 27 being shifted to one side so that it extends past an exterior surface portion 4. As a result, the etch 28 would not expose the conductive layer 20 underlying that extension, and subsequent steps may not achieve the additional capacitance desired. Therefore, to ease lithographic tolerances, the etch mask 27 can be made to extend only within the boundary of the exterior surface portions 4, as exemplified by dashed lines 50. Also to ease the lithography, dielectric layer 19 should be planar (within plus or minus 50 nm (500 angstroms)) with upper surface 6 of conductive layer 20 of in-process container capacitor structures 8C. Thus, assuming that a "stacked" capacitor (such as the one disclosed in FIG. 1 of U.S. Pat. No. 5,145,801) could be considered to be "cup-shaped," the planarity of upper surface 6 distinguishes the current embodiment from such a configuration.

With continuing reference to FIG. 7A, a portion of dielectric layer 19 is removed by etch 28. Dielectric layer 19 may be removed to some level above, down to, or into dielectric layer 18. By way of example (and not limitation), it is assumed that dielectric layer 19 is BPSG and is to be etched down to a level above another BPSG dielectric layer 18. In such an embodiment, a silicon oxide etch selective to the polysilicon forming conductive layer 20 may be used. If dielectric layer 19 is removed down to or into dielectric layer 18, it may be advantageous to form dielectric layers 18 and 19 of different materials for purposes of etch selectivity. Moreover, if dielectric layer 19 removal involves etching into dielectric layer 18, it is understood that the etching process should selectively etch dielectric layers 18 and 19 rather than the material forming cap 44 and/or spacer 17.

Figure 7C:
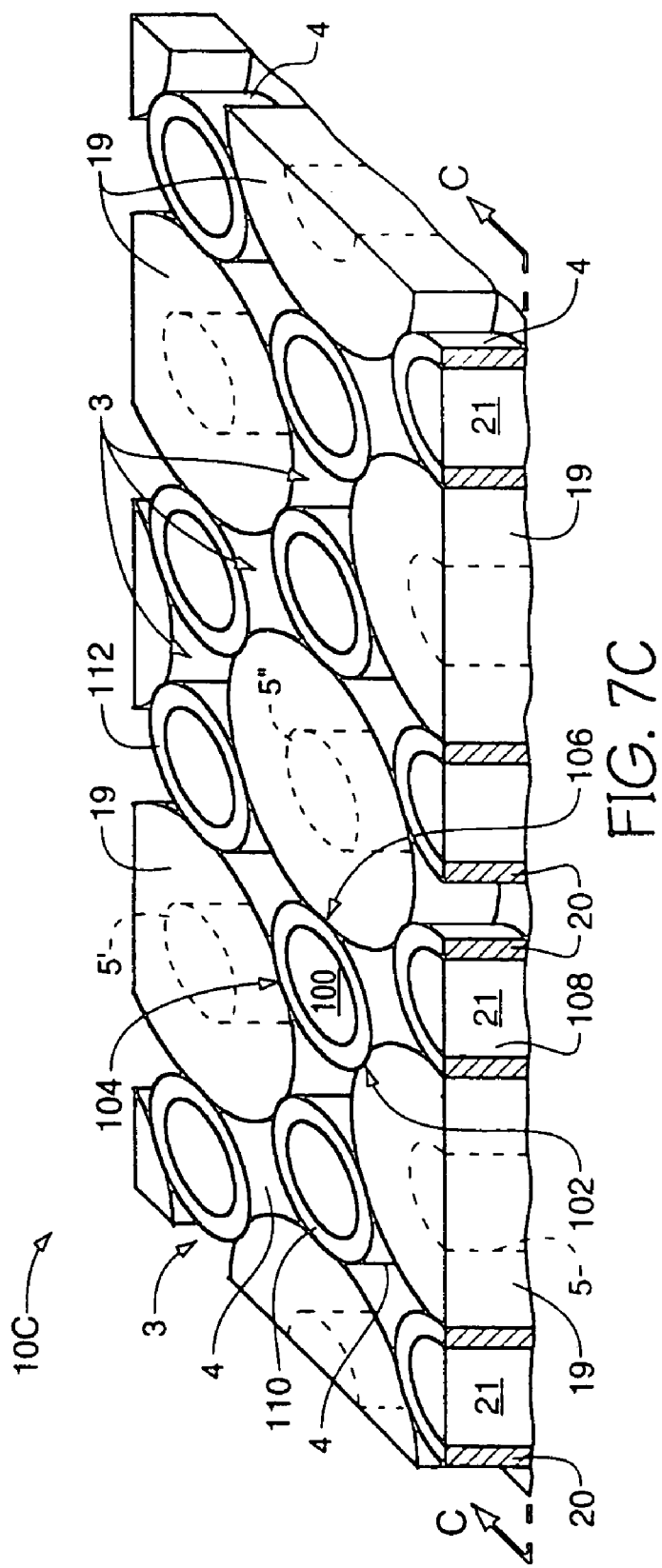
FIG. 7C is a three-dimensional view indicating additional steps taken in accordance with an exemplary embodiment of the current invention.

Regardless of whether masking occurs as illustrated in FIG. 7A or 7B, once the etch mask 27 is removed, the substrate assembly 10C appears as illustrated in FIG. 7C. This figure depicts a portion of the DRAM substrate assembly 10C of FIG. 4 but from a different perspective and with emphasis on the contact sites 5 along or near axis C-C. Each contact site 5 is surrounded by a discrete portion of dielectric layer 19. As this portion of dielectric layer 19 not only encompasses the contact site 5 but also extends beyond the site to the neighboring conductive layers 20, the dielectric could be described as "over-encompassing" the contact site 5. Of special note are the areas of the electrodes that face a contact site 5 and hence abut the dielectric layer 19. For example, areas 102, 104, and 106 of electrode 100 face contact sites 5, 5', and 5" and contact dielectric layer 19 accordingly. Areas of electrode 100 that are askew or face away from a contact site 5 are distal from and do not contact dielectric layer 19. More specifically, such areas face another electrode through the recesses 3 formed in dielectric layer 19. For example, dielectric layer 19 has been recessed from between electrode 100 and electrode 108, electrode 100 and electrode 110, and electrode 100 and electrode 112.

Preferably, the areas 102, 104 or 106 abutting the dielectric layer 19 represent no more than 50% of the total exterior vertical surface area of the relevant bottom plate. More preferably, areas such as 102, 104 or 106 represent no more than 20% of a given plate's total exterior vertical surface area. Alternatively, it could be expressed that etch 28 preferably exposes at least 50% of the total exterior vertical surface area of the bottom plate, and even more preferably exposes at least 80%. These preferences could also be expressed in terms of the circumference defined by the exterior of the cup-shaped capacitor electrode. Thus, it is preferred that dielectric layer 19 abut no more than 50% of that circumference, and it is even more preferred that dielectric layer 19 remain separate from at least 50% (and more preferably 80%) of that circumference.

Figure 8A:
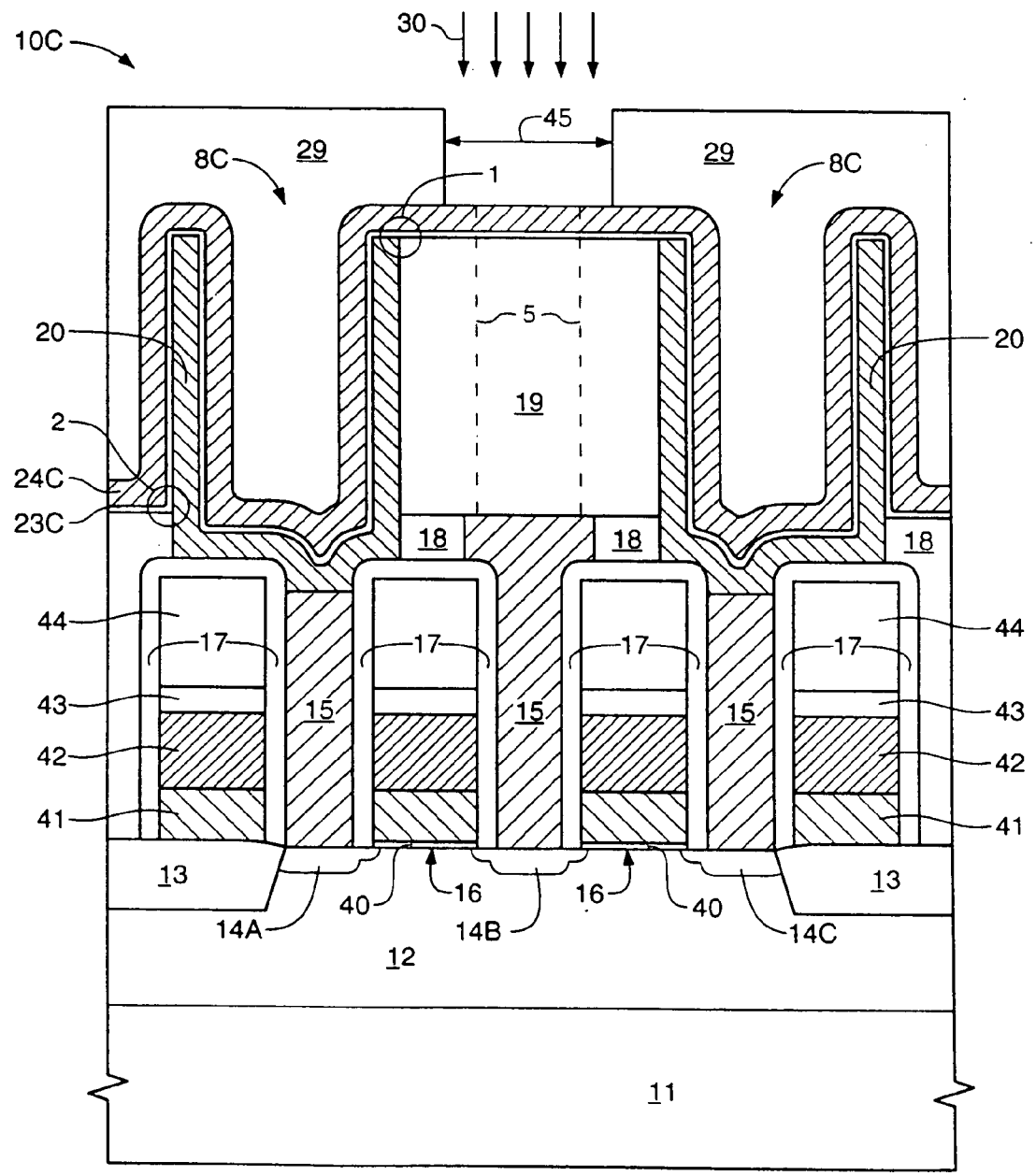
FIG. 8A is a cross-sectional view of the in-process DRAM substrate assembly having undergone additional processing under an exemplary embodiment of the current invention.

One skilled in the art can now appreciate that, when a dielectric and top electrode are subsequently deposited, those layers will not deposit between a bottom electrode and its neighboring contact site 5 because of the presence of dielectric layer 19. However, the layers will deposit within the recesses 3 and thereby add to the capacitance of all capacitors sharing those layers. FIG. 8A illustrates such depositions. FIG. 8A shows that, after etch mask 27 is removed, capacitor dielectric 23C is formed. Capacitor dielectric 23C is formed of one or more layers and/or materials. Capacitor dielectric 23C may be a nitride film; however, a tantalum oxide may be used. A nitride film equal to or less than 6 nm (60 angstroms) thick may be deposited followed by exposure to a dry or a wet oxygenated environment to seal it. In this embodiment with a nitride film equal to or less than 6 nm thick, oxygen may diffuse through it causing a silicon dioxide to form underneath. Accordingly, an oxide-nitride-oxide (ONO) thin film dielectric may be formed.

After forming capacitor dielectric 23C, conductive layer 24C is formed to provide a second electrode of each container capacitor structure. This electrode is sometimes referred to as a "top electrode" or cell plate. Conductive layer 24C may comprise one or more layers of one or more materials. A polysilicon, with N-type or P-type impurities added thereto for conductivity, may be used. However, a platinum, ruthenium, or ruthenium oxide-like material (including other conductive oxides) may be used. Notably, if a conductive nitride or oxide is used, a barrier material (not shown) may be inserted between conductive layer 20 and the conductive stud 15 to prevent oxidation.

Of further note in FIG. 8A is that, for a particular capacitor, there are at least two elevations within the substrate assembly 10C at which the dielectric 23C or conductive material 24C extends away from the conductive layer 20. In region 1, facing the contact site 5, the dielectric 23C and conductive material 24C extend away from the conductive material 20 and toward the contact site 5 at a level near the top of dielectric 19 or the top of the conductive material 20. At region 2, however, the dielectric 23C and conductive material 24C extend away from the conductive material 20 and away from the contact site 5 at a level near the bottom of dielectric 19.

An alternative way of describing the configuration in FIG. 8A involves referring to a material next to but not included as part of the capacitor—perhaps a material supporting the capacitor structure. In FIG. 8A, such a material could include dielectric 19 (and dielectric 18 as well). FIG. 8A reveals that the capacitor dielectric 23C, conductive layer 20, and dielectric support material 19/18 meet at different levels. In region 1, capacitor dielectric 23C, conductive layer 20, and dielectric 19 meet at a level commensurate with the top of conductive layer 20; whereas in region 2, capacitor dielectric 23C, conductive layer 20, and dielectric 18 meet at a lower level. Regardless of the particular elevations, an exemplary difference in elevations of these levels is at least 500 angstroms. More specific differences in elevations include ones of at least 1000 or 2000 angstroms.

Subsequent steps are also addressed in FIG. 8A and beyond. After formation of conductive layer 24C, etch mask 29 is deposited and patterned. Etch mask 29 may comprise a photosensitive polymer. Etch 30 is used to remove portions of conductive layer 24C and capacitor dielectric layer 23C. However, etch 30 need not remove capacitor dielectric layer 23C at this stage, as it is not required to expose underlying dielectric layer 19 at this point in the process.

Figure 8B:
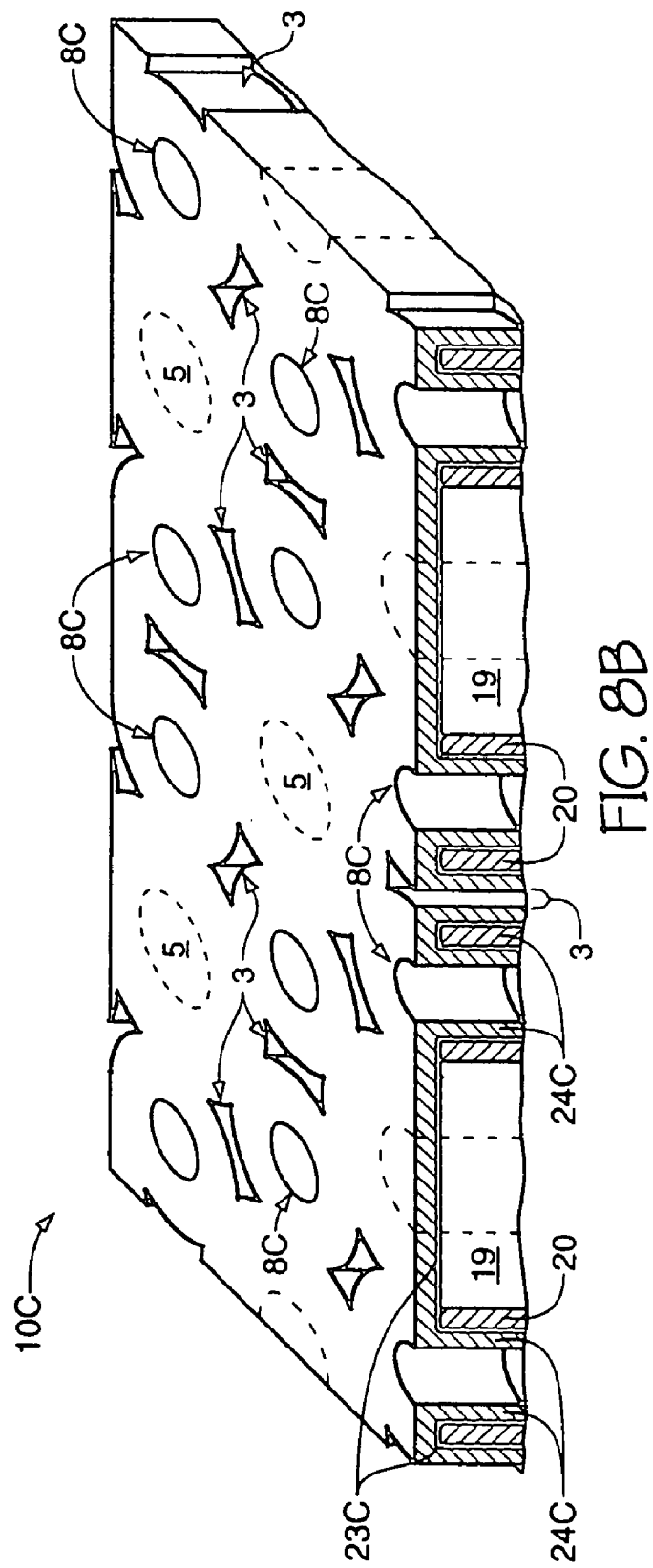
FIG. 8B is a three-dimensional view of the in-process DRAM substrate assembly having undergone exemplary steps within the scope of the current invention.

FIG. 8B offers another perspective. FIG. 8B shows that, initially after deposition yet before masking and etching, conductive layer 24C blankets the in-process substrate assembly 10C. In doing so, conductive layer 24C inhabits the interior of the bottom electrodes as well as the interior of the recesses 3. Moreover, in this embodiment, the deposition of the conductive layer 24C is commensurate with the extent of deposition of the underlying capacitor dielectric layer 23C.

Figure 2:
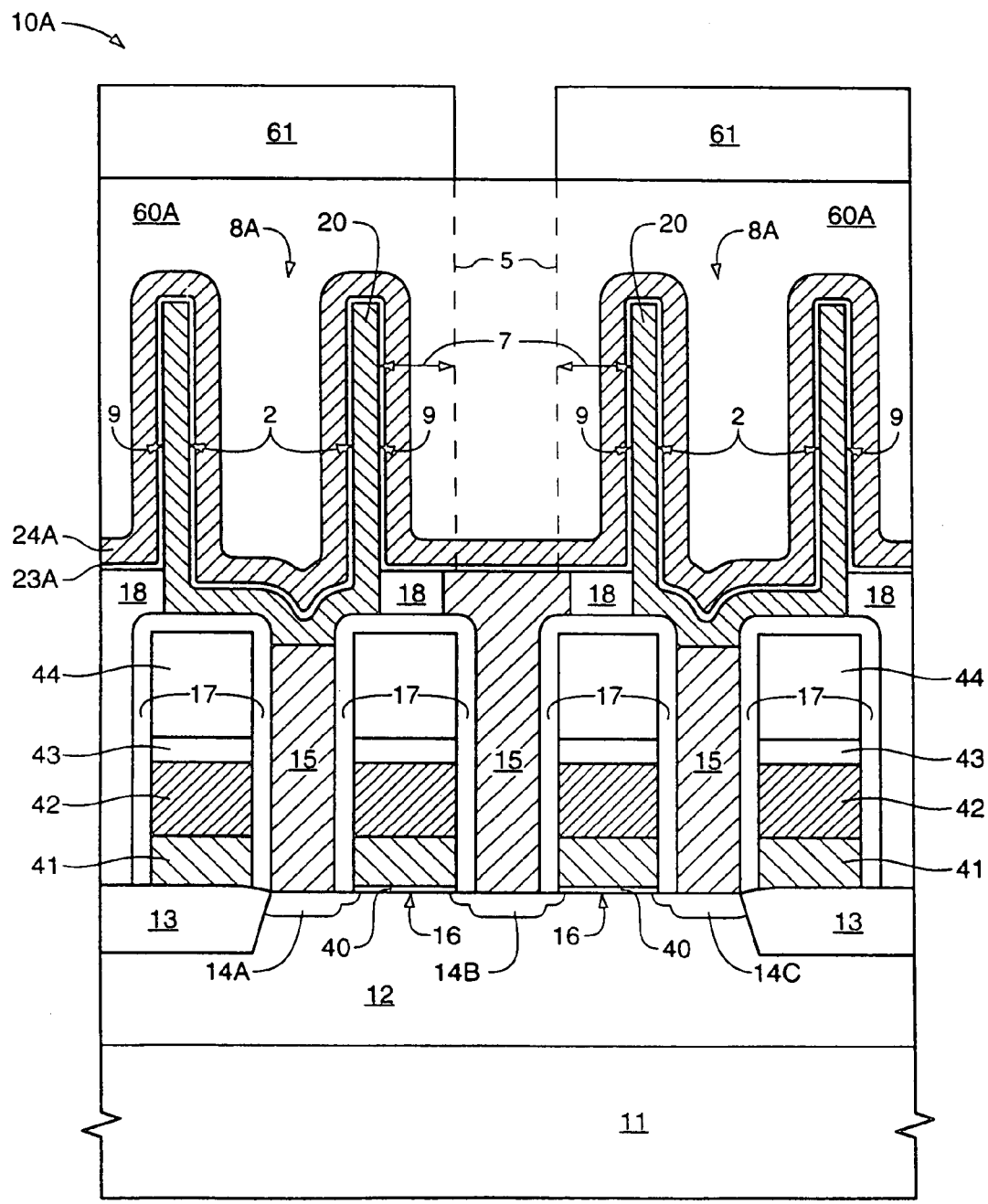
FIG. 2 is a cross-sectional view of the in-process DRAM substrate assembly having undergone known processes in the art.
Figure 3:
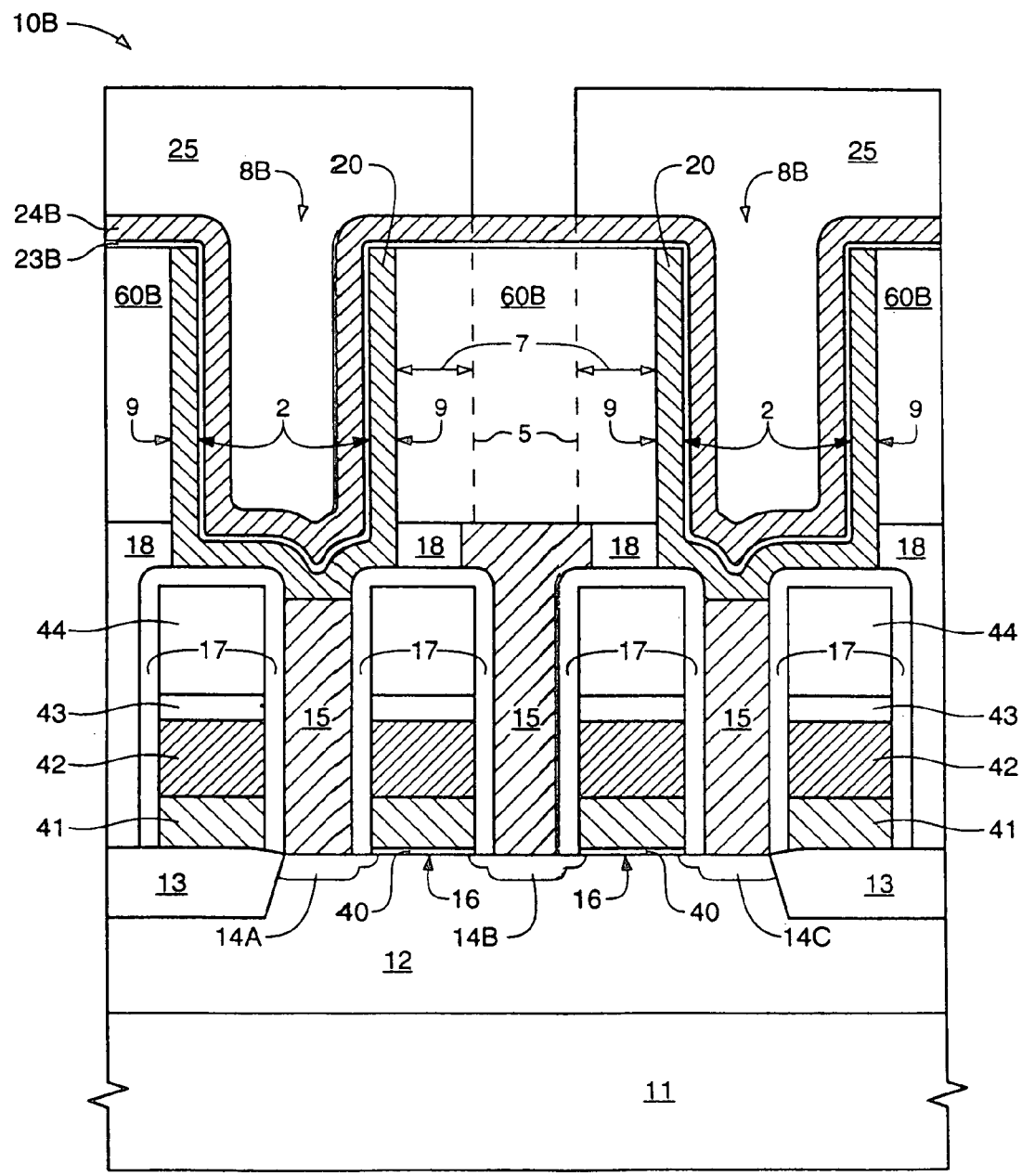
FIG. 3 is a cross-sectional view of the in-process DRAM substrate assembly having undergone alternative known processes in the art.
Figure 9A:
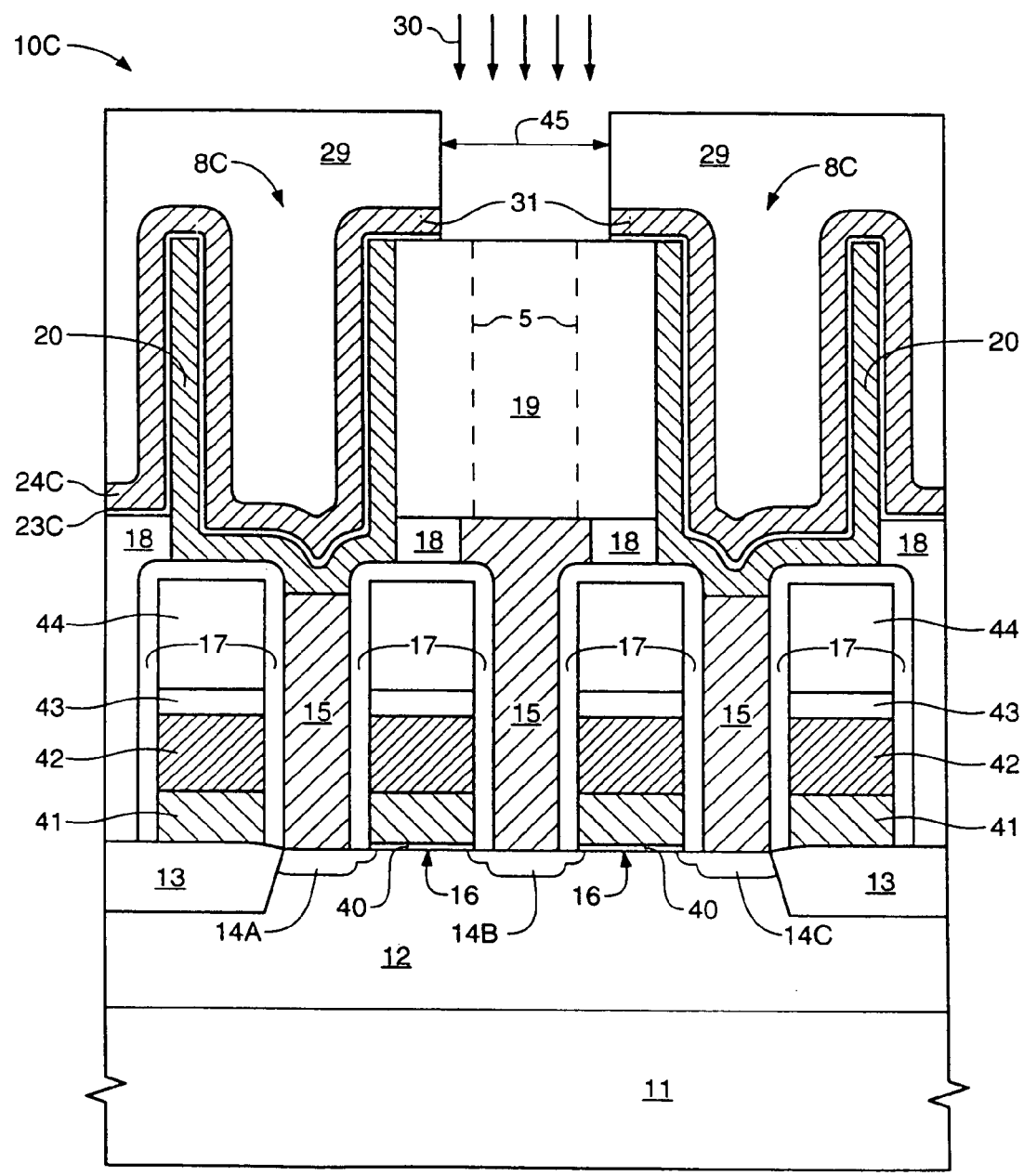
FIG. 9A is a cross-sectional view of an in-process DRAM substrate assembly having undergone still more processing according to an exemplary embodiment of the current invention.
Figure 9B:
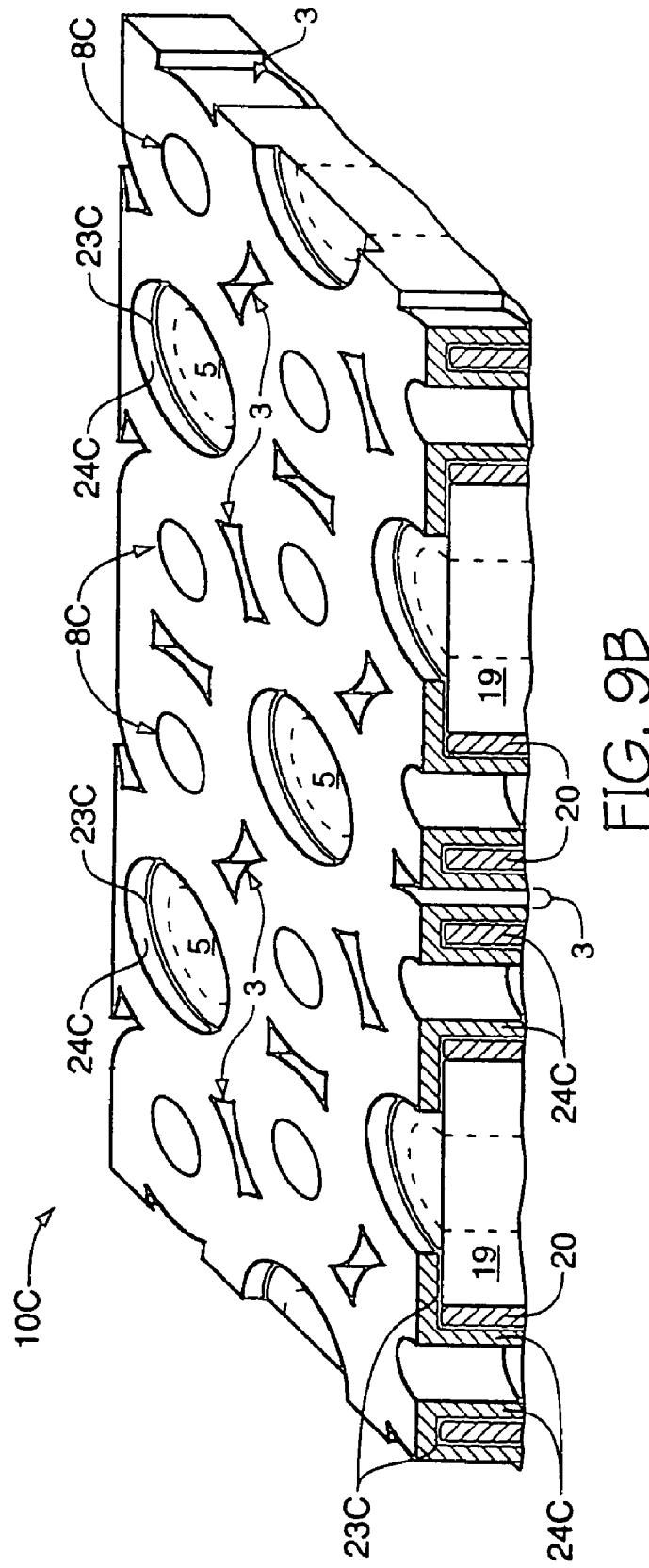
FIG. 9B is a three-dimensional view of the in-process DRAM substrate assembly having undergone additional exemplary steps within the scope of the current invention.

FIG. 9A illustrates the subsequent removal by etch 30 of a portion of conductive layer 24C and capacitor dielectric layer 23C. It should be noted that the opening 45 caused by etch 30 is wider than the contact site 5. By having a wider opening 45, capacitor dielectric layer 23C and conductive layer 24C are removed farther away from contact site 5 as compared to a narrower contact etch that may be practiced in the prior art assembly of FIG. 2. FIG. 9A shows that this embodiment allows for portions of capacitor dielectric layer 23C and conductive layer 24C to be removed at a relatively high level with respect to the bottom of the contact site 5. As discussed previously, this allows for easier and more effective removal. Moreover, etch 30 may be used to undercut etch mask 29 as illustratively indicated by dashed-lines 31. FIG. 9B offers another perspective of the substrate assembly 10C after etch mask 29 has been removed.

Figure 10A:
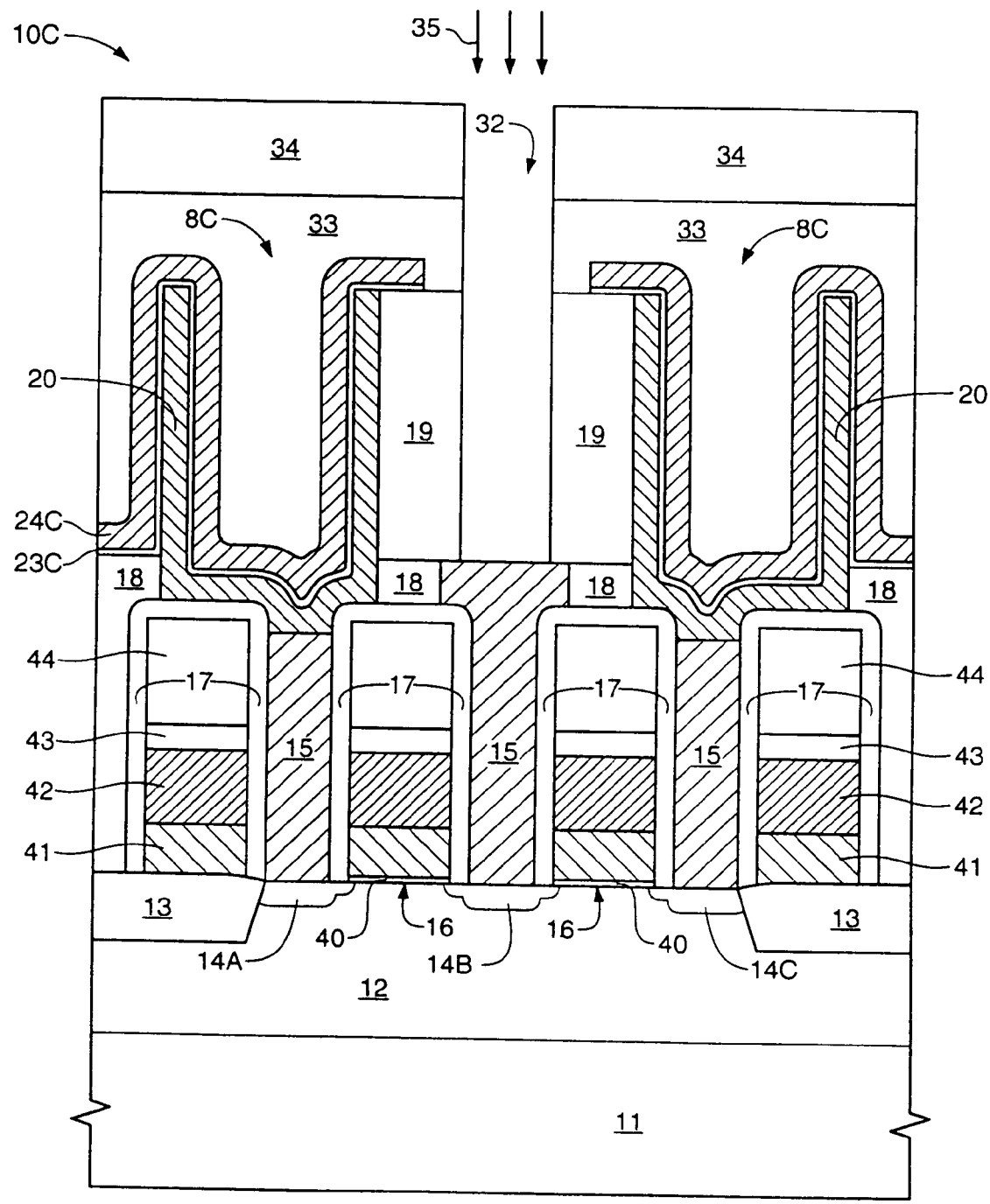
FIG. 10A is a cross-sectional view of an in-process DRAM substrate assembly illustrating yet more processing according to an exemplary embodiment of the current invention.

Referring to FIG. 10A, there is shown a cross-sectional view of substrate assembly 10C after dielectric layer 33, which may comprise a silicon oxide such as PSG or BPSG, is deposited. After depositing dielectric layer 33, etch mask 34 is deposited and patterned. Etch mask 34 may comprise a photosensitive polymer. Etch 35 forms contact via 32 by removing portions of dielectric layer 33 and dielectric layer 19, thereby exposing conductive stud 15 above N-type region 14B. Notably, if a portion of capacitor dielectric layer 23C is not previously removed to expose underlying dielectric layer 19, then etch 35 may be used to remove that portion. FIG. 10B shows a three-dimensional viewpoint of this stage, with the dielectric layer 33 and etch mask 34 not shown for the sake of clarity.

Figure 11A:
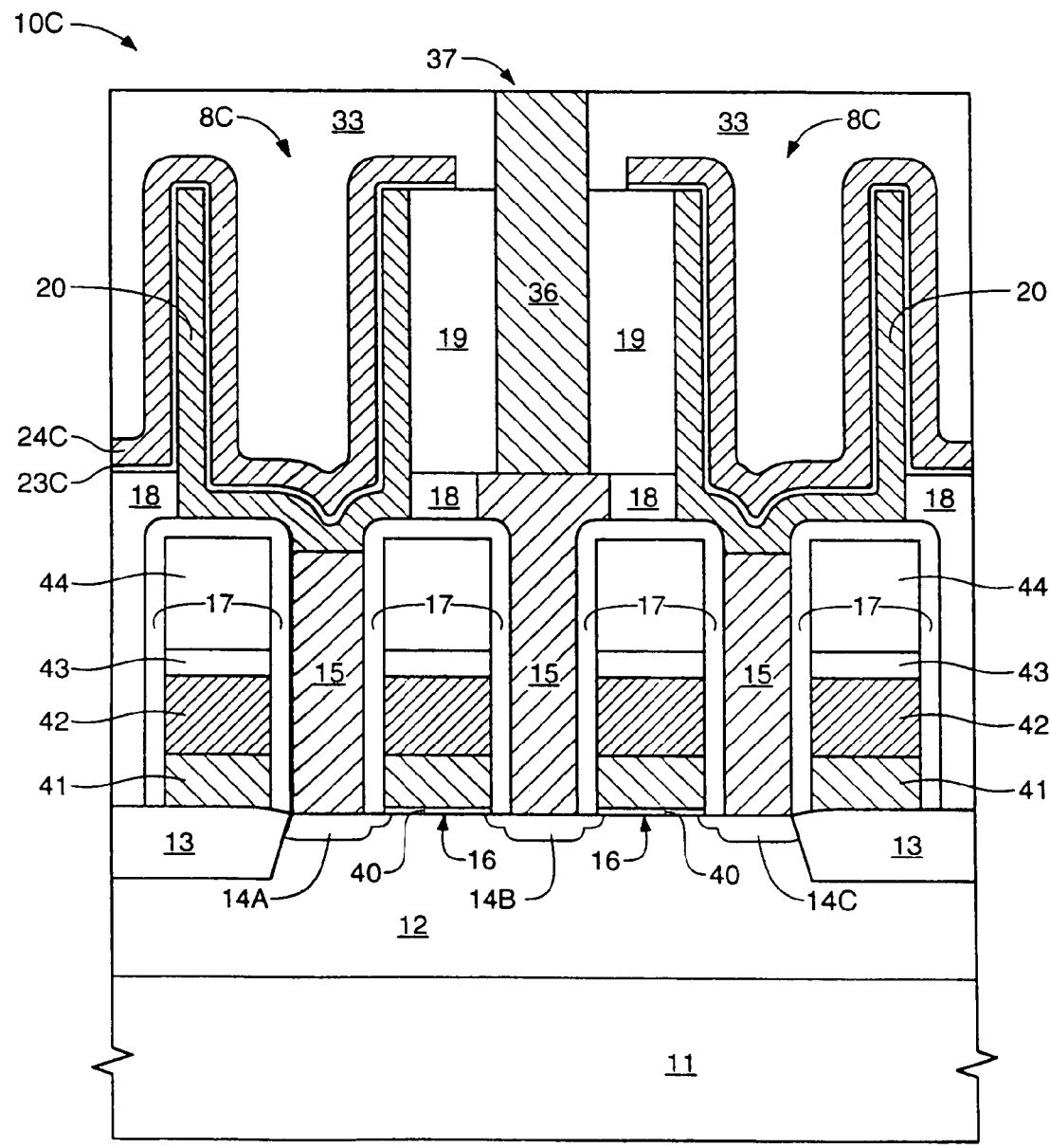
FIG. 11A is a cross-sectional view of an in-process DRAM substrate assembly after even more steps covered by an exemplary embodiment of the current invention.
Figure 11B:
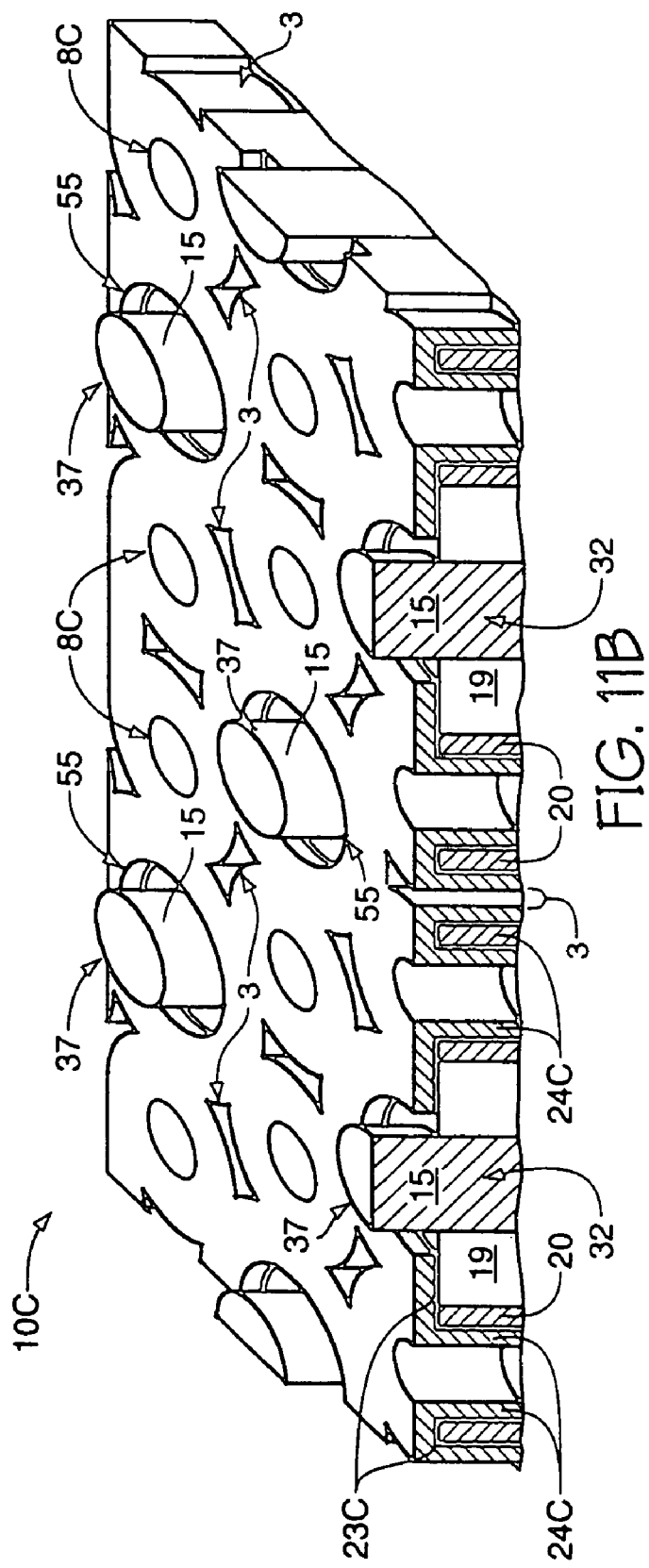
FIG. 11B is a three-dimensional view of an in-process DRAM substrate assembly having undergone exemplary steps within the scope of the current invention.

Referring to FIG. 11A, there is shown a cross-sectional view of substrate assembly 10C after removing etch mask 34. Conductive layer 36 is subsequently deposited and at least partially fills the contact via 32 identified in FIG. 10A. If conductive layer 36 forms over dielectric layer 33, it may be subjected to CMP or etch back, as in a damascene process, or patterned and etched, as in a photo/metal etch process. Accordingly, contact plug 37 and contact stud 15 in combination provide a contact for electrical connection to region 14B for accessing transistors on either side thereof. FIG. 11B offers the three-dimensional perspective, with dielectric layer 33 once again removed for clarity's sake.

As a result, the capacitors are configured to allow for capacitance using a portion of a particular bottom electrode's exterior surface 9 that is askew from a plug 37, while another portion of the exterior surface 9 facing a plug 37 is not used for capacitance.

Figure 12:
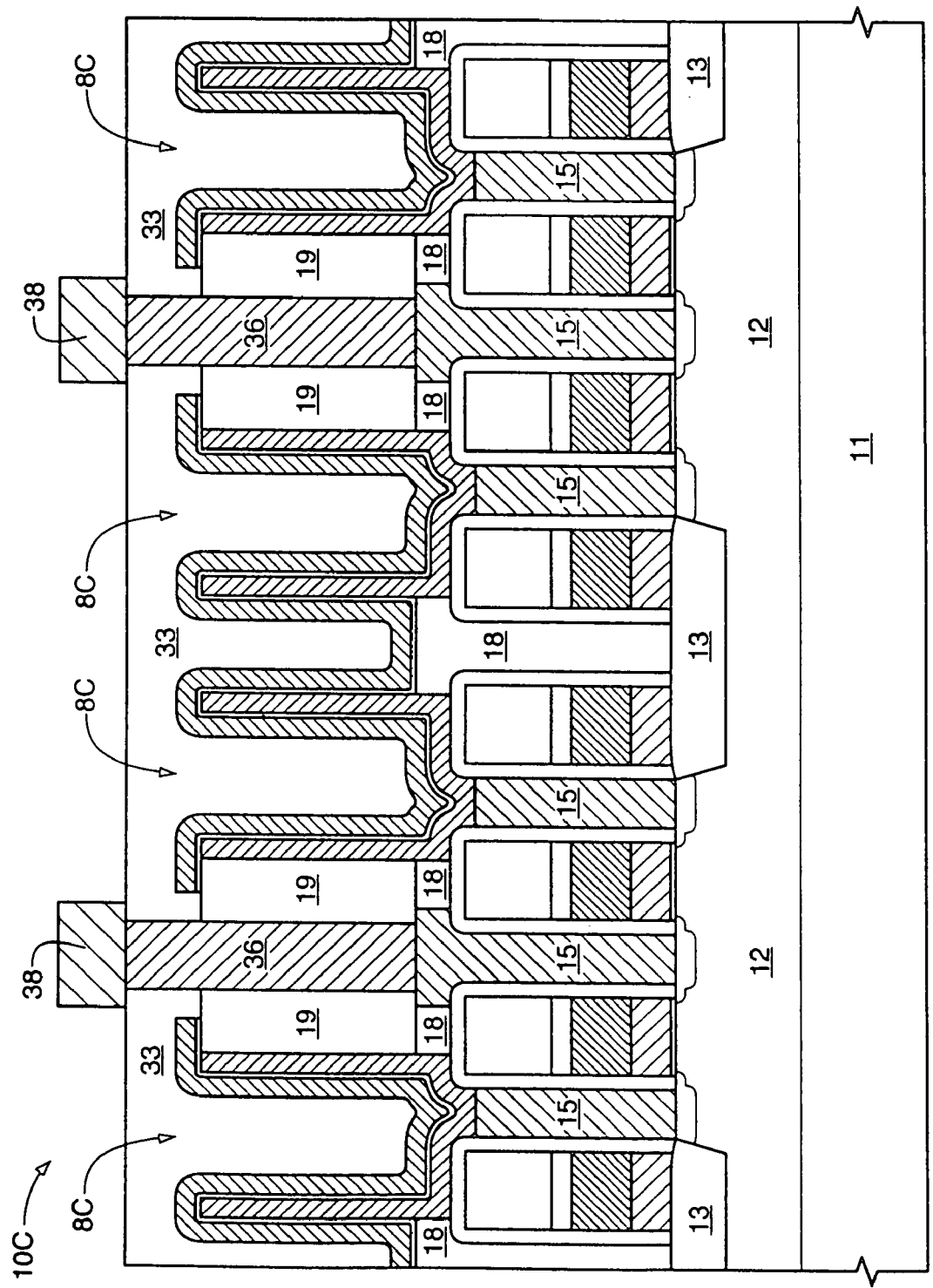
FIG. 12 is a cross-sectional view along C-C of the in-process DRAM substrate assembly with bit lines.

Referring to FIG. 12, there is shown a cross-sectional view of substrate assembly 10C along C-C of FIG. 4 after forming bit lines 38.

A container capacitor structure of the present invention is particularly well-suited for high-density memory array architectures. In one exemplary embodiment, the container capacitor structure may have a bottom electrode with a maximum interior width equal to or less than 0.15 microns and/or a maximum exterior width equal to or less than 0.35 microns. Such a high-density memory array architecture may have adjacent bit lines 38 (shown in FIG. 12) with a pitch equal to or less than 0.40 microns. Though a bit line over contact formation is described herein, it should be understood that buried bit line architecture may be used as well. In a high-density memory array, critical dimension (CD) of a contact may be equal to or less than 0.32 microns wide, and word line-to-word line pitch in such an array may be equal to or less than 0.40 microns.

The above-discussed exemplary embodiments of the present invention provide a container capacitor structure and process of constructing it. Such a container capacitor structure provides increased capacitance without having to clear a portion of a capacitor top electrode from a bottom of a contact via. Moreover, such a container capacitor structure provides space between a contact plug and a capacitor top electrode such that probability of shorting therebetween is not increased.

Figure 13:
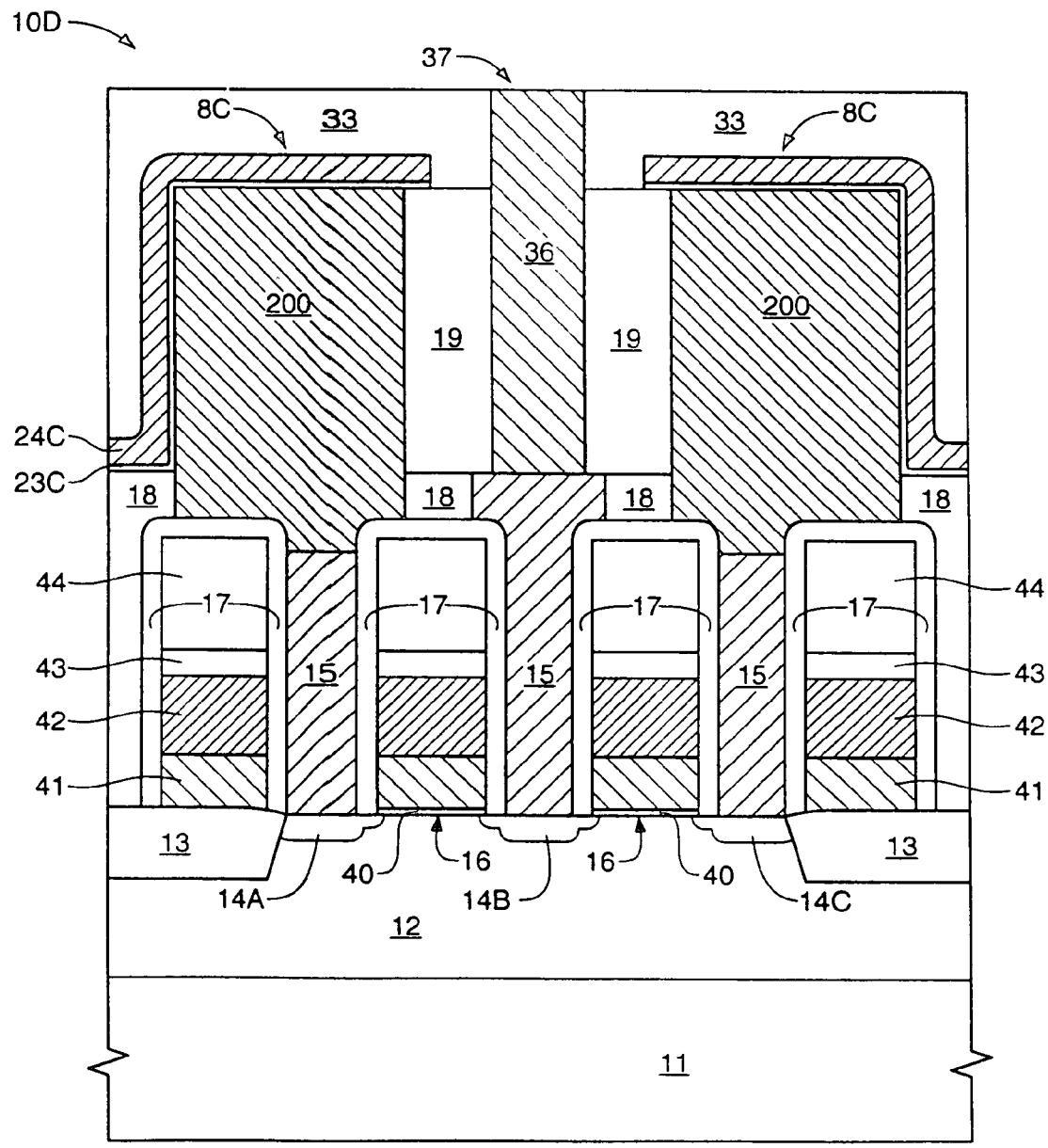
FIG. 13 is a cross-sectional view of an alternative exemplary apparatus embodiment of the current invention that also illustrates the steps to be taken in an exemplary process embodiment of the current invention.

While the above-described embodiments of the present invention were directed to DRAM manufacture, the present invention may be implemented in a variety of other integrated circuit devices (memory devices, logic devices having embedded memory, application specific integrated circuits, microprocessors, microcontrollers, digital signal processors, and the like incorporating a memory array) which employ one or more container capacitors. Moreover, a memory or a memory module having a container capacitor formed in accordance with the present invention may be employed in various types of information handling systems (network cards, telephones, scanners, facsimile machines, routers, televisions, video cassette recorders, copy machines, displays, printers, calculators, and personal computers, and the like incorporating memory). In addition, the current invention is not limited to container capacitors. Also included within the scope are other non-planar devices or devices having a component that is vertical with respect to the underlying support surface. FIG. 13, for example, illustrates a substrate assembly 10D including stud capacitors rather than container capacitors, wherein studs 200 are made of a conductive material and serve as bottom electrodes. The portions of studs 200 facing the contact plug 37 are free of conductive layer 24C. This can be achieved using methods such as the ones described above for a container capacitor.

Figure 14A:
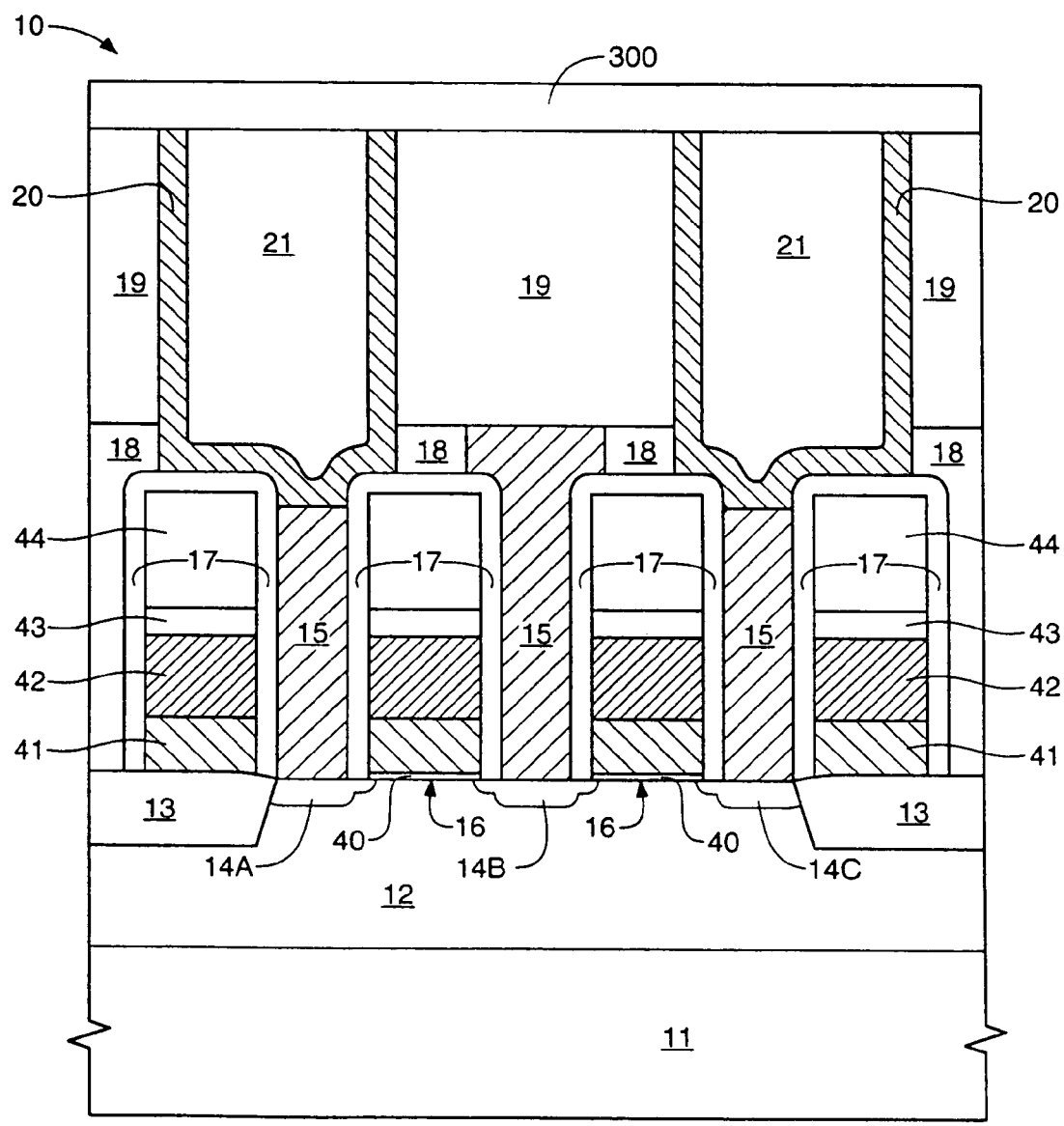
FIGS. 14A-F are cross-sectional views of yet another alternative exemplary embodiment of the current invention.
Figure 14B:
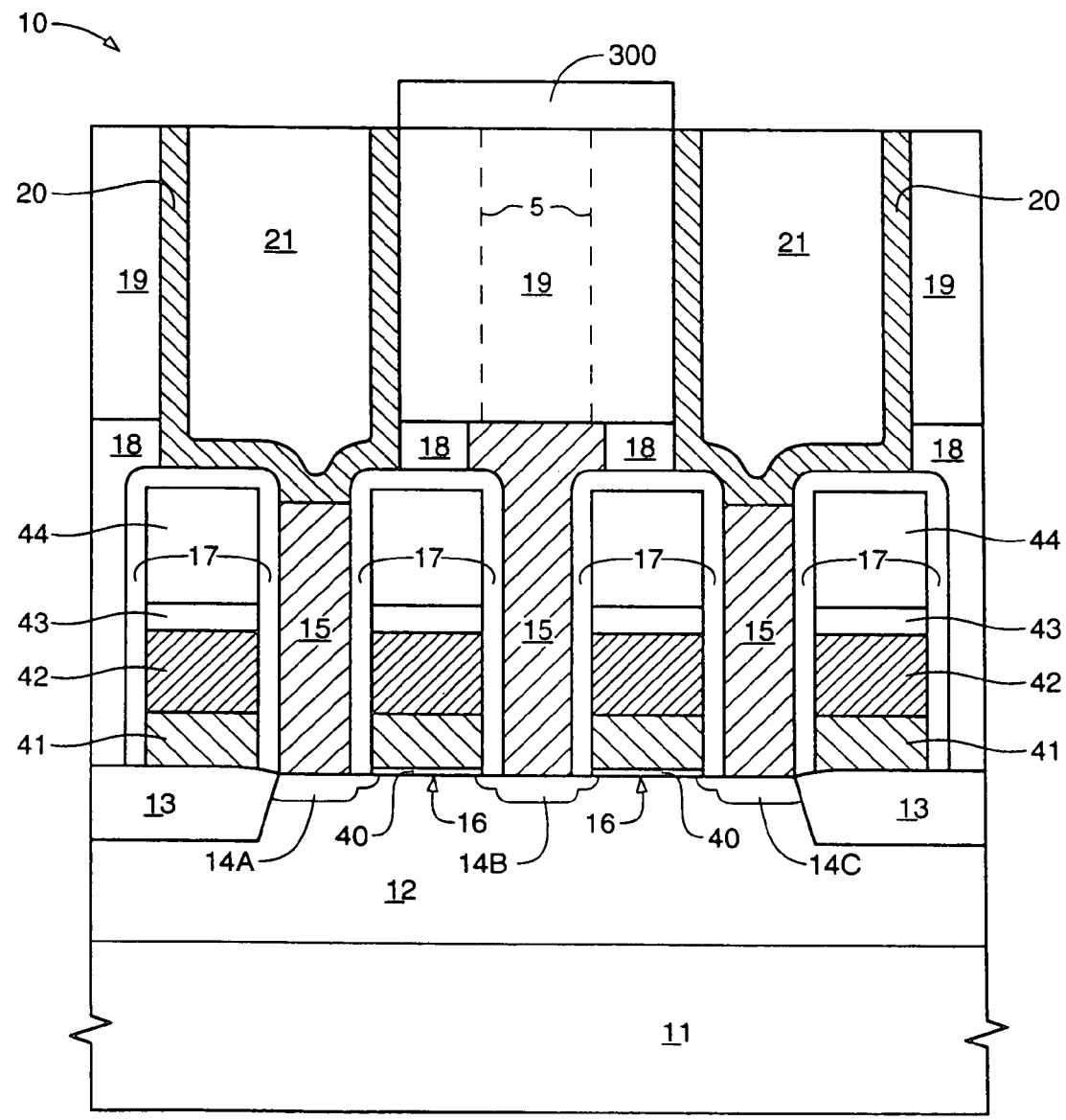
Figure 14C:
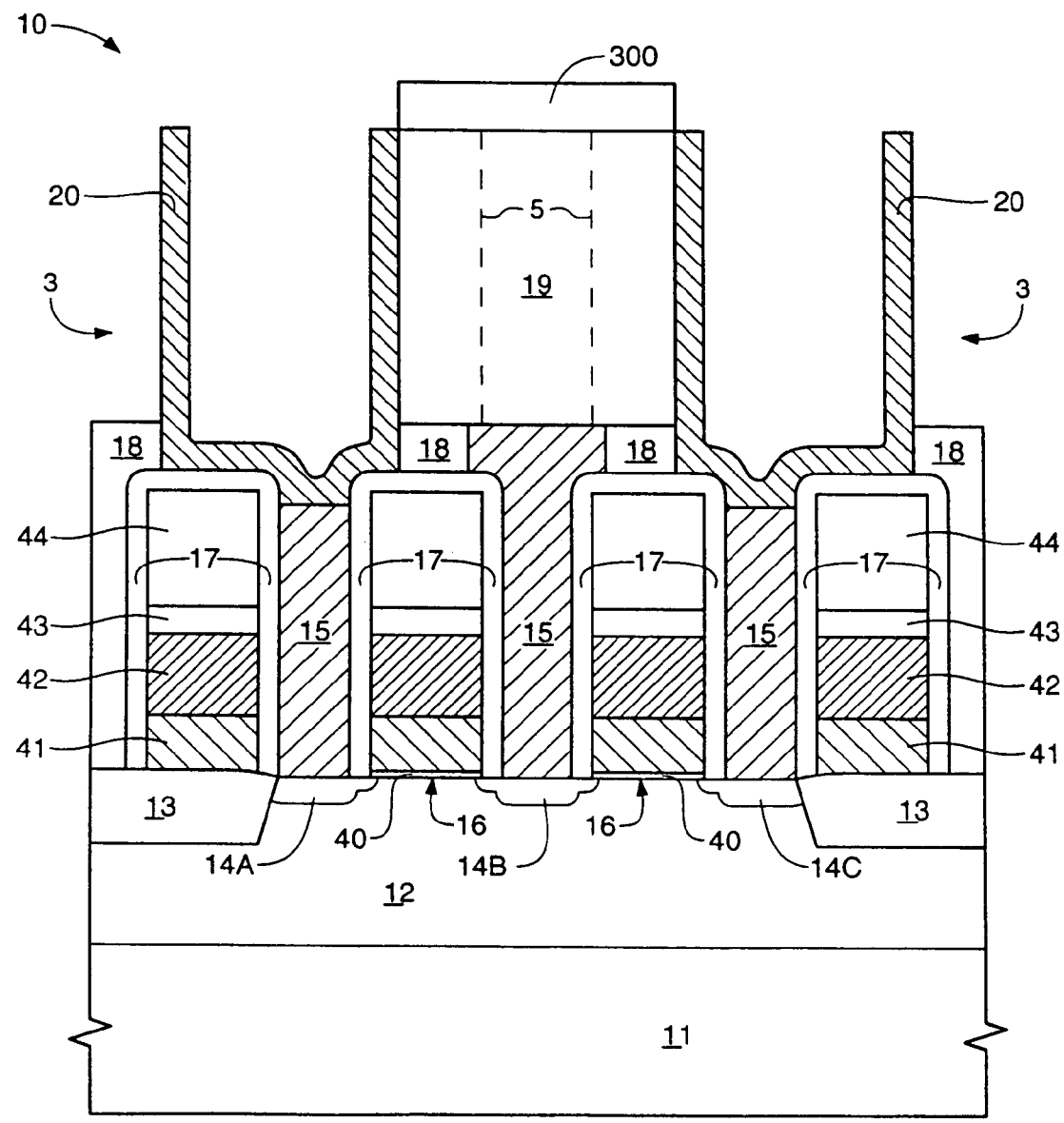
Figure 14D:
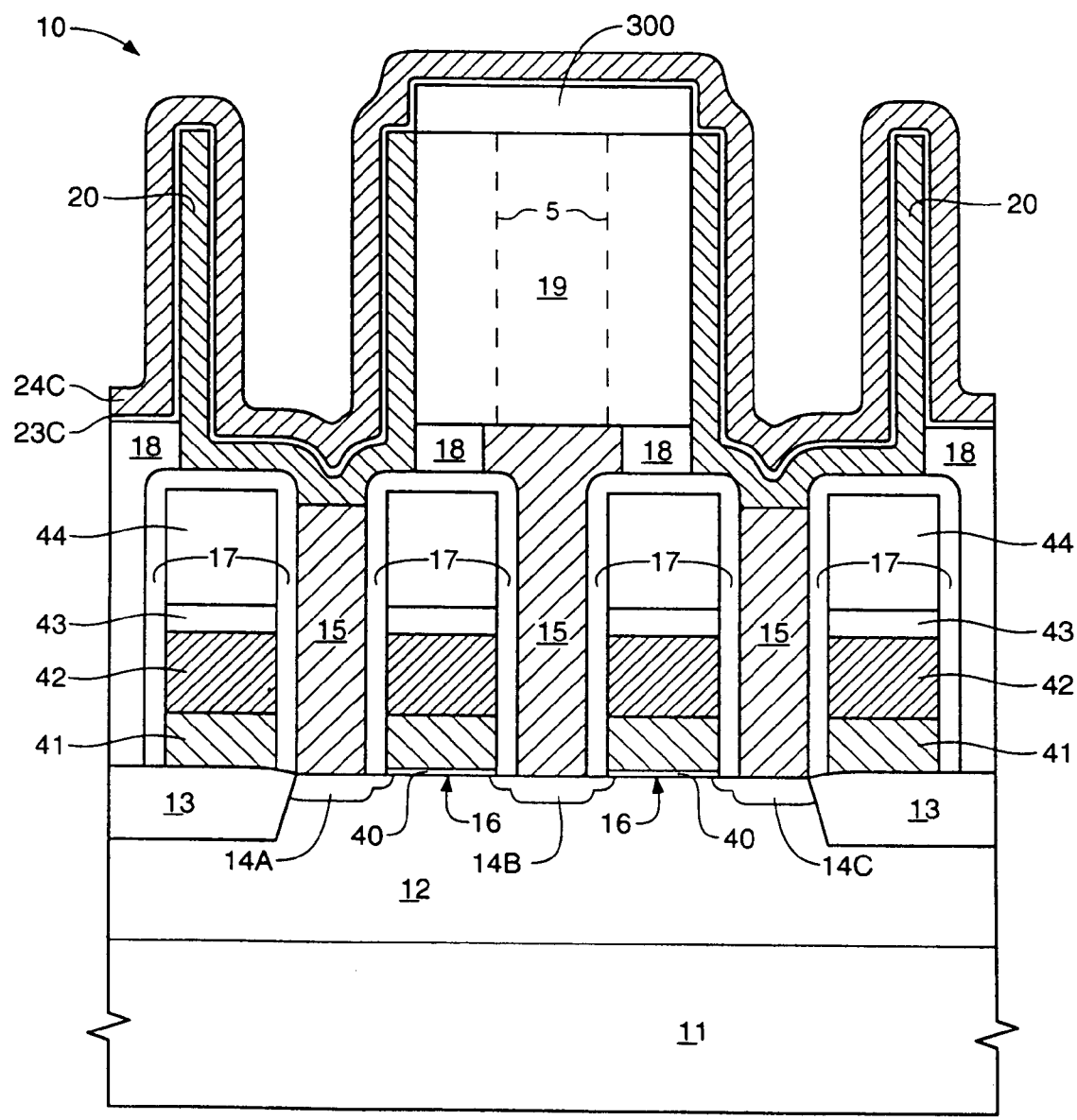
Figure 14E:
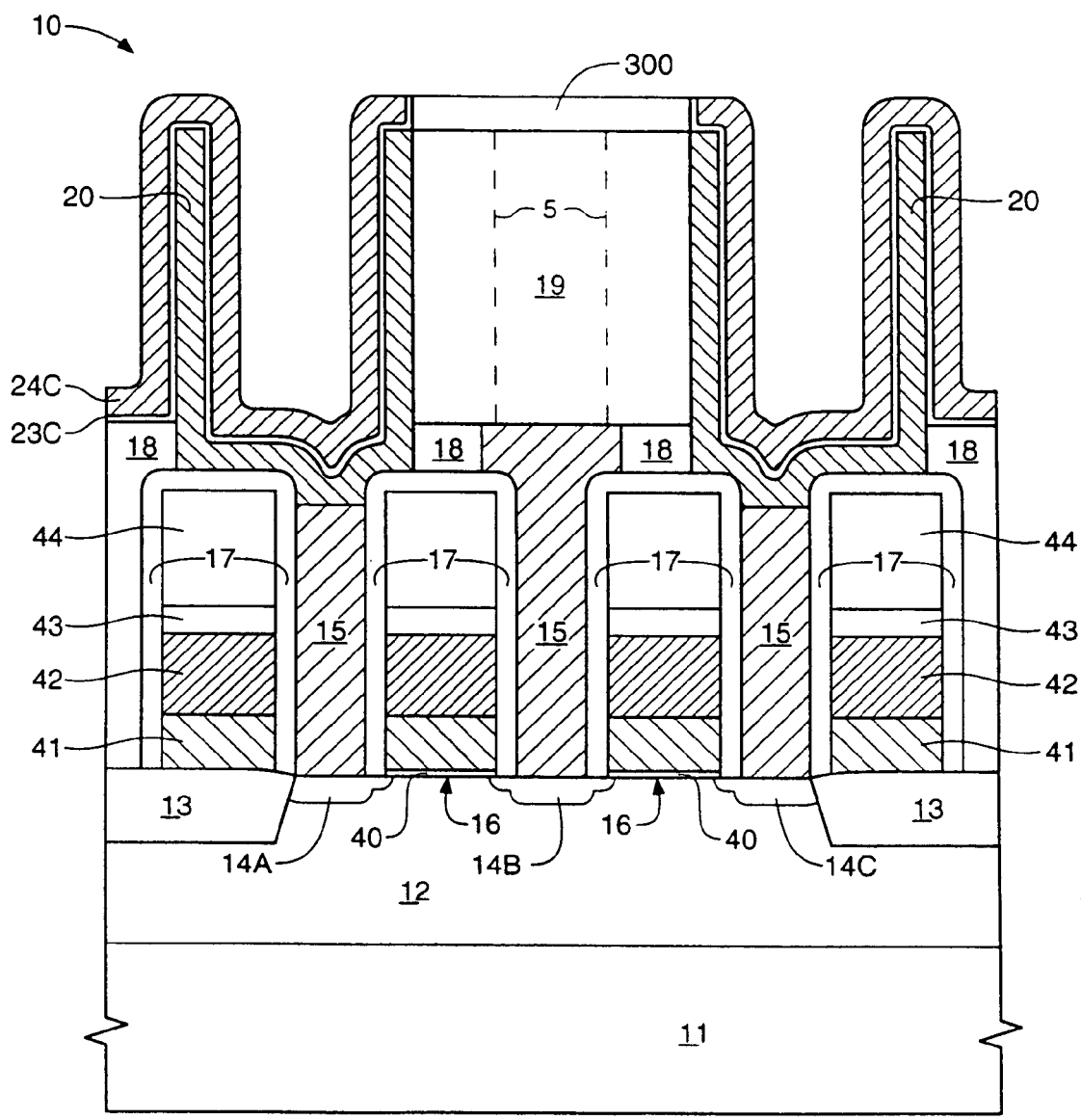
Figure 14F:
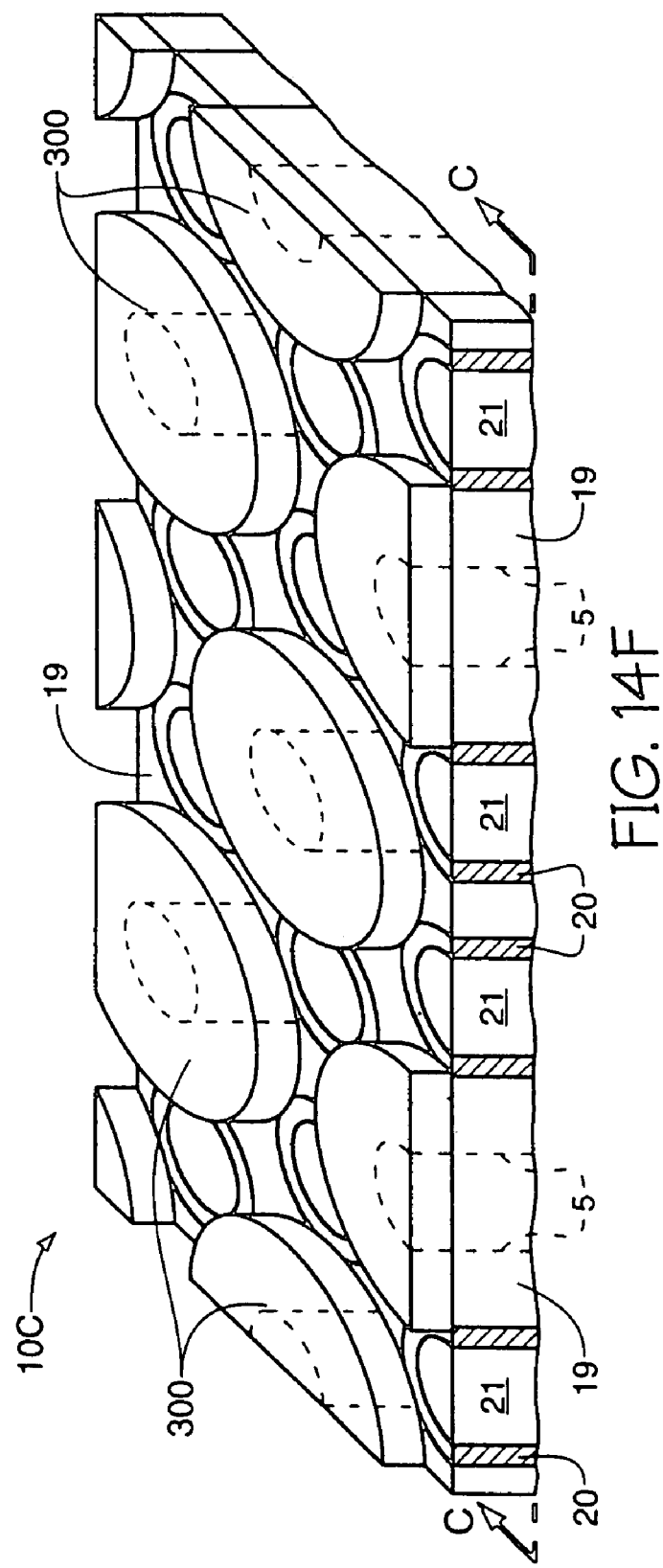

Moreover, alternative methods that fall within the scope of the current embodiment may be used to provide partial double-sided capacitance. For example, processing may proceed as described above to achieve the structure depicted in FIG. 6. Rather than depositing and patterning etch mask 27 at that point (shown in FIG. 7A), another alternative (shown in FIG. 14A) is to layer an oxide 300 over dielectric layer 19 (and the tops of conductive layer 20). Preferably, this oxide 300 is provided using a low temperature process, such as a plasma deposition with tetraethylorthosilicate (TEOS) as a precursor, as is known in the art. The oxide is subsequently patterned (FIG. 14B) so that it covers at least portions of dielectric 19 that are between a conductive layer 20 and a contact site 5. As seen in FIG. 14C, a subsequent dry etch removes uncovered portions of dielectric 19 (thereby forming recesses 3) and flow-fill material 21. Optionally, the in-process device may also be subjected to a wet dip at this stage. FIG. 14D shows that capacitor dielectric 23C and conductive layer 24C are then deposited over conductive layer 20 and oxide 300. In doing so, the capacitor dielectric 23C and conductive layer 24C at least line if not completely fill the recesses 3 and interiors of the cup-shaped bottom capacitor plates. Next, as seen in FIG. 14E, the surface is planarized down to the oxide 300 using, for example, CMP. Subsequent steps, such as those described above, may then be used to clear at least a portion of oxide 300 from above the contact site 5, and to form and fill the via at the contact site 5. This method helps to further ensure that the conductive layer 24C does not encroach too closely to the contact site 5. Preferably, the patterned oxide 300 is aligned with the remaining portions of dielectric 19 as depicted in FIG. 14B and again in three-dimensions in FIG. 14F. However, alignment of the patterned oxide 300 over contact site 5 and the surrounding dielectric 19 may be somewhat challenging to accomplish.

Figure 15A:
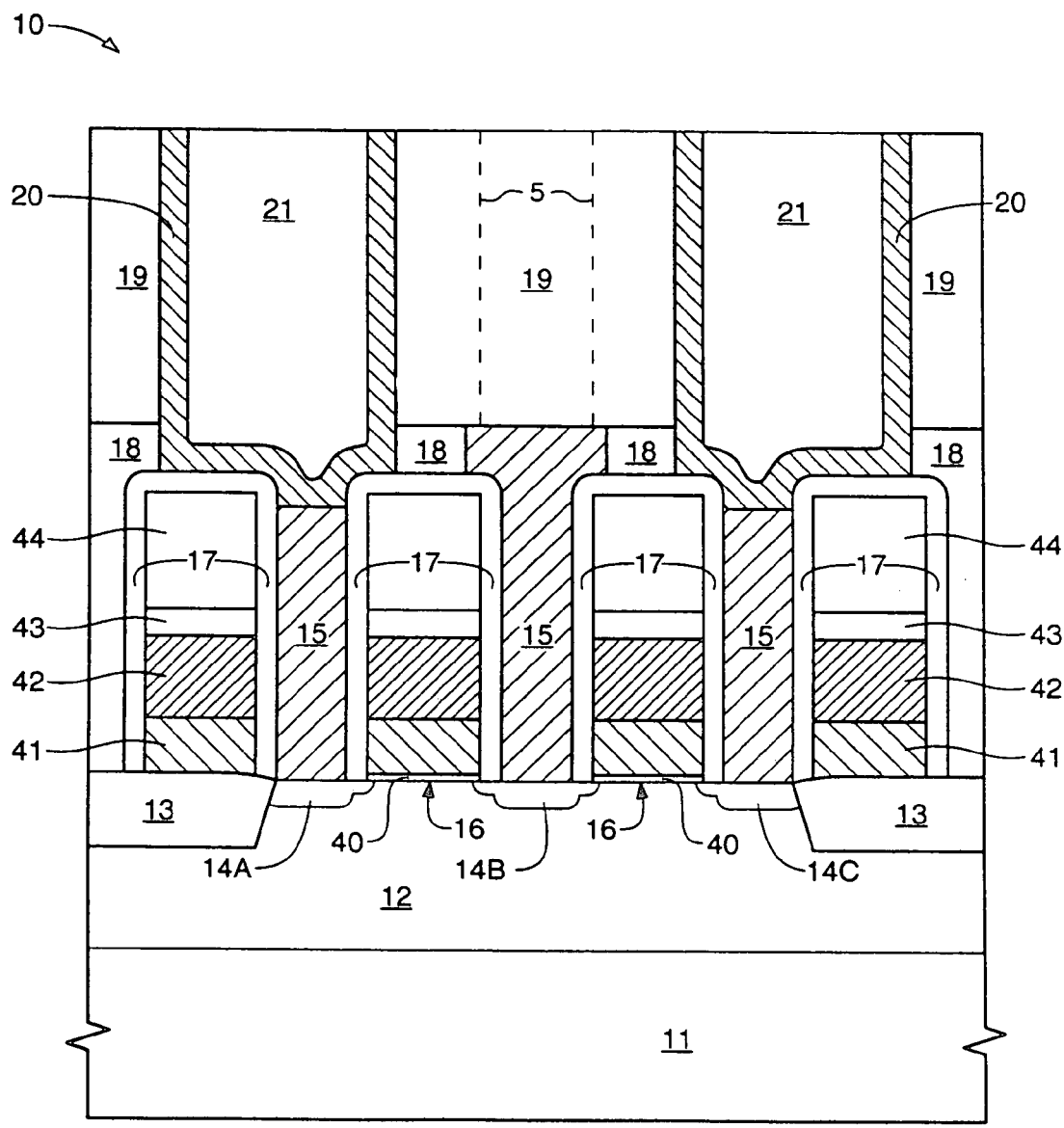
FIGS. 15A-G are cross-sectional views of still another alternative exemplary embodiment of the current invention.
Figure 15B:
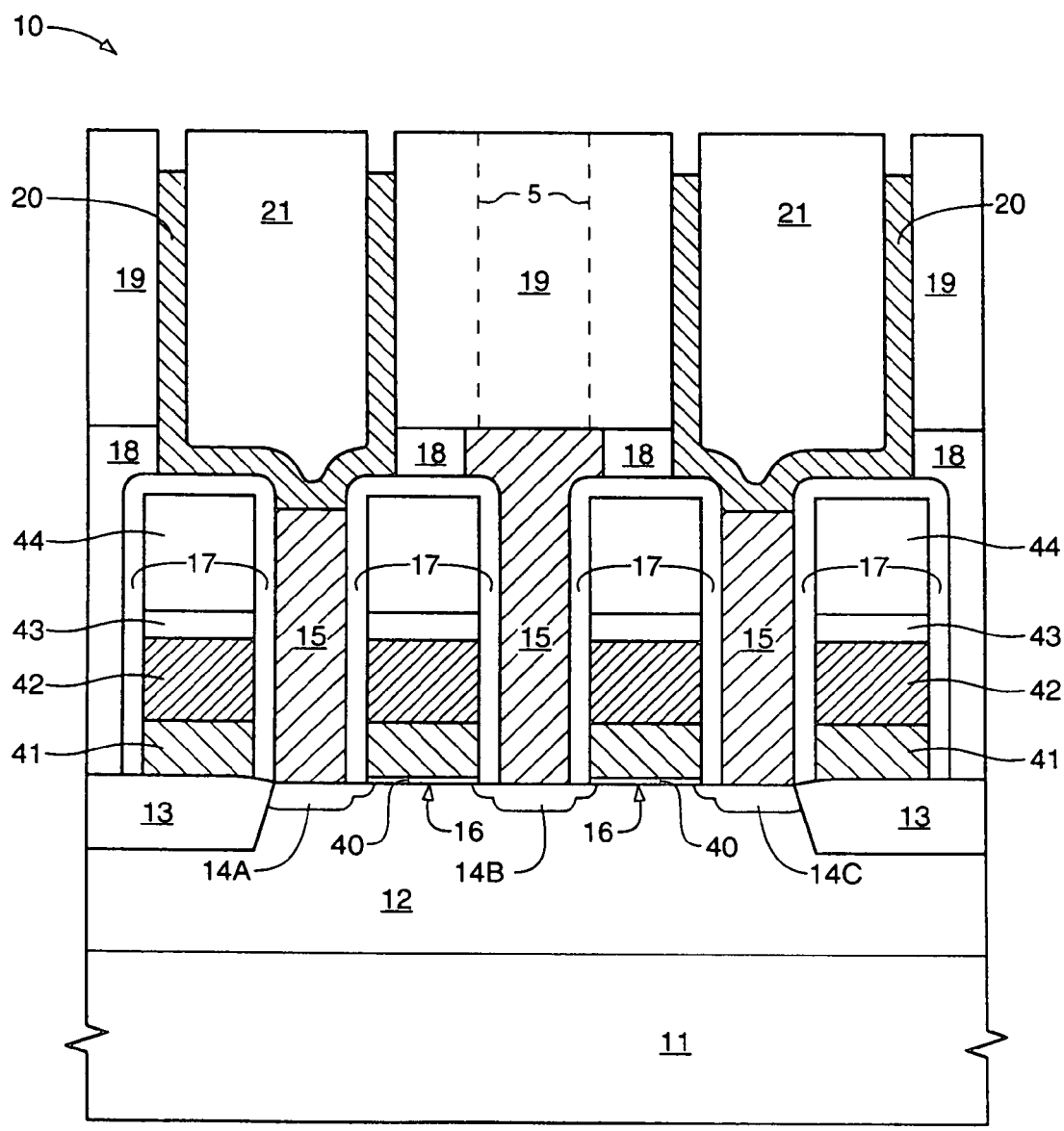
Figure 15C:
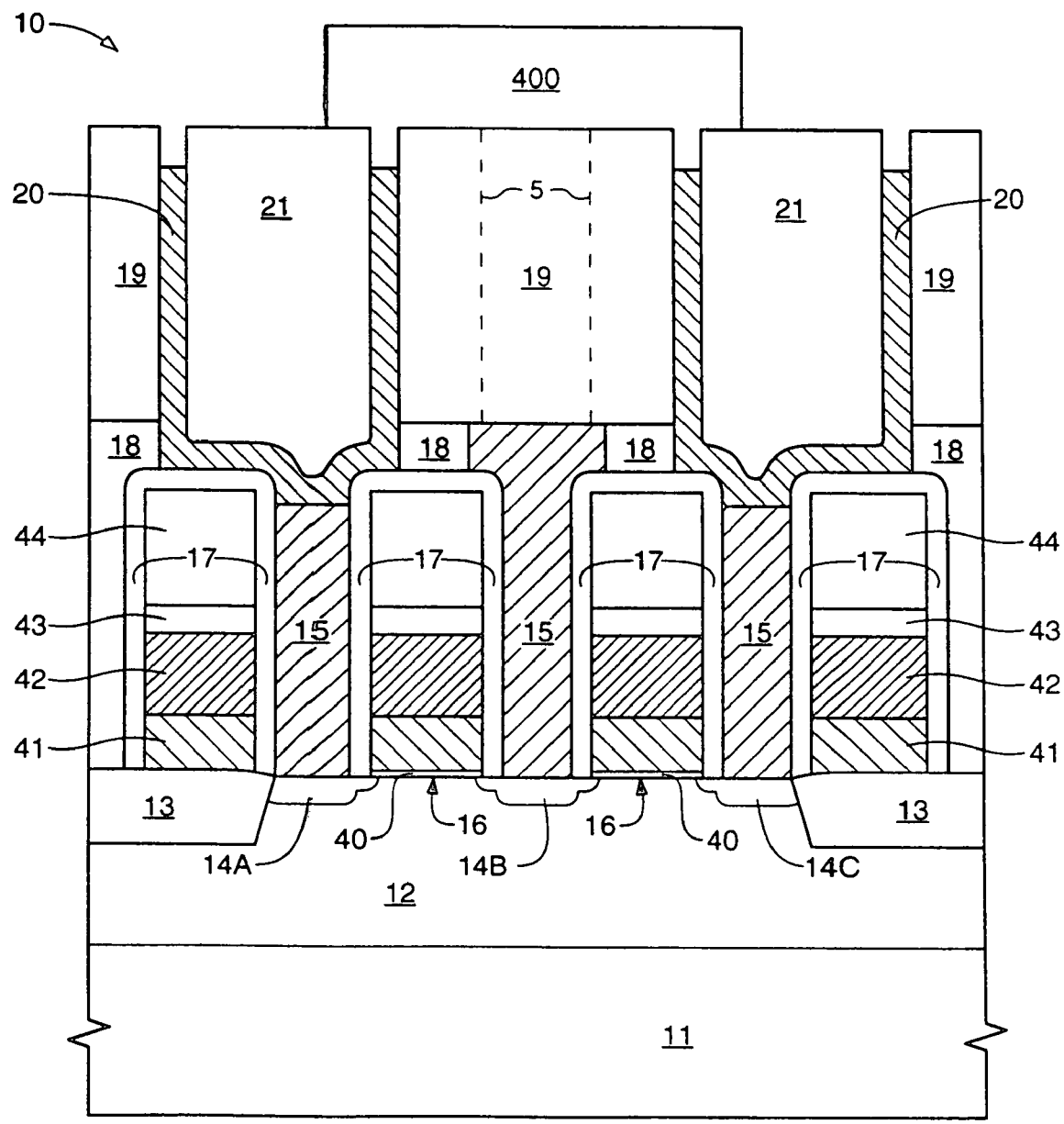
Figure 15D:
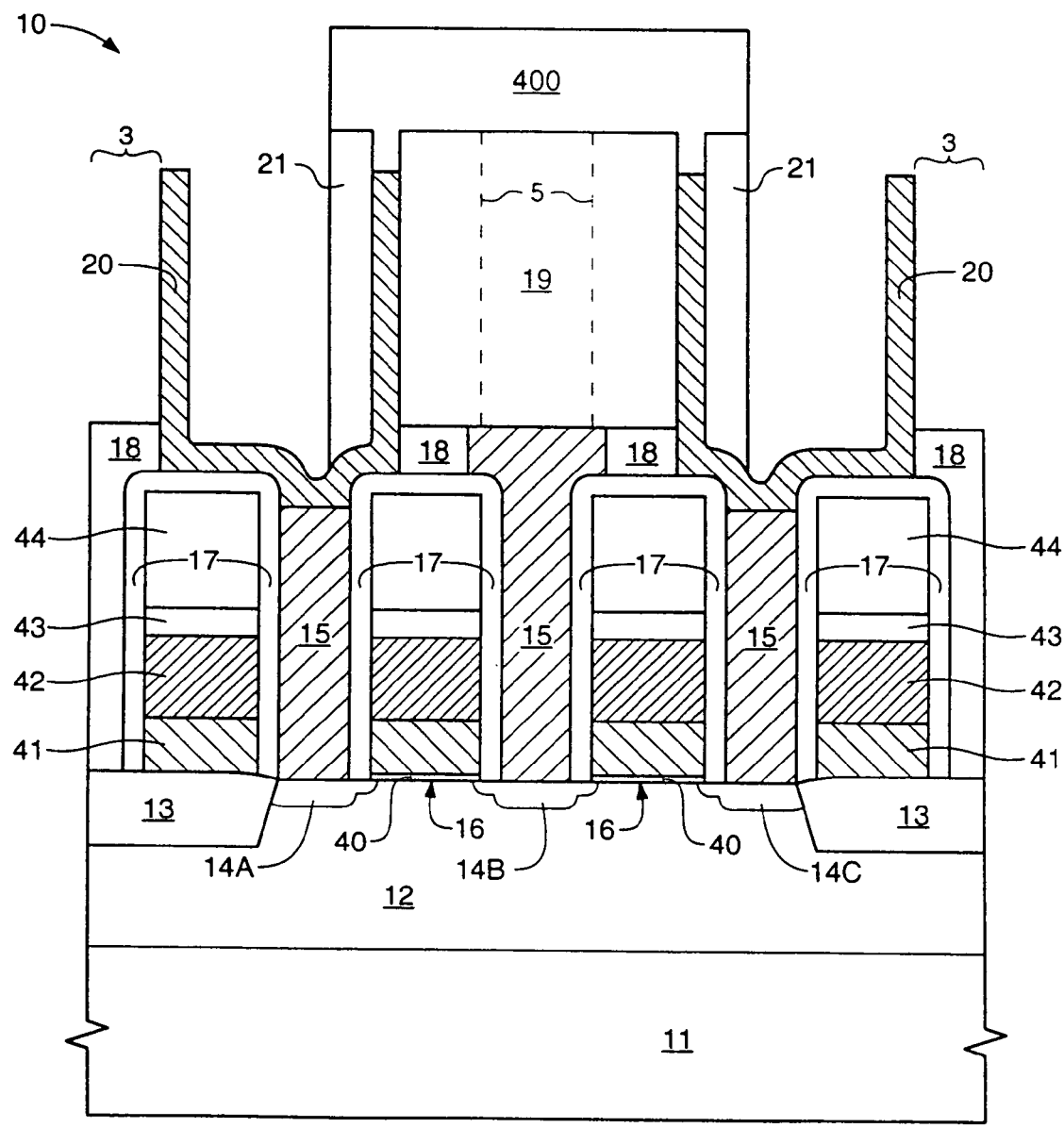
Figure 15E:
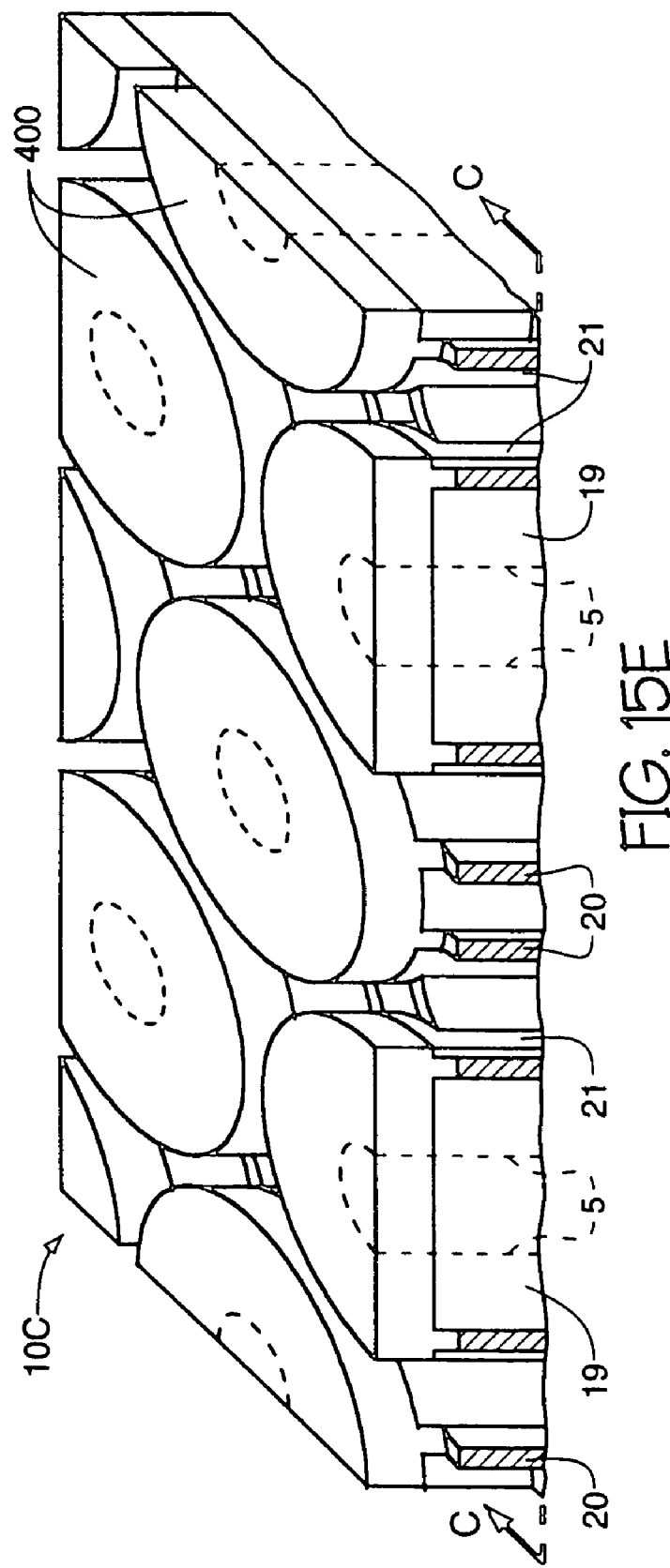
Figure 15F:
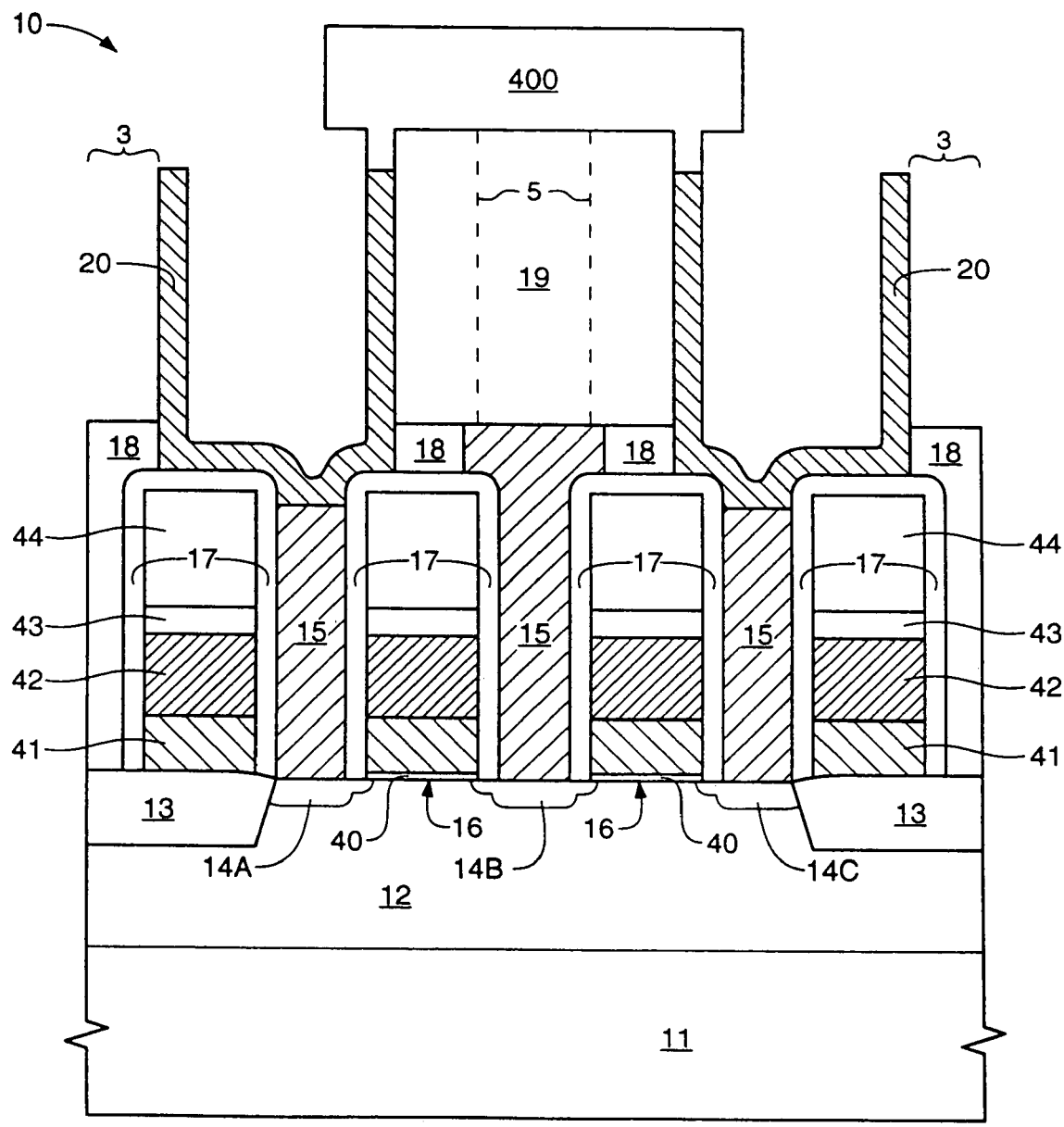
Figure 15G:
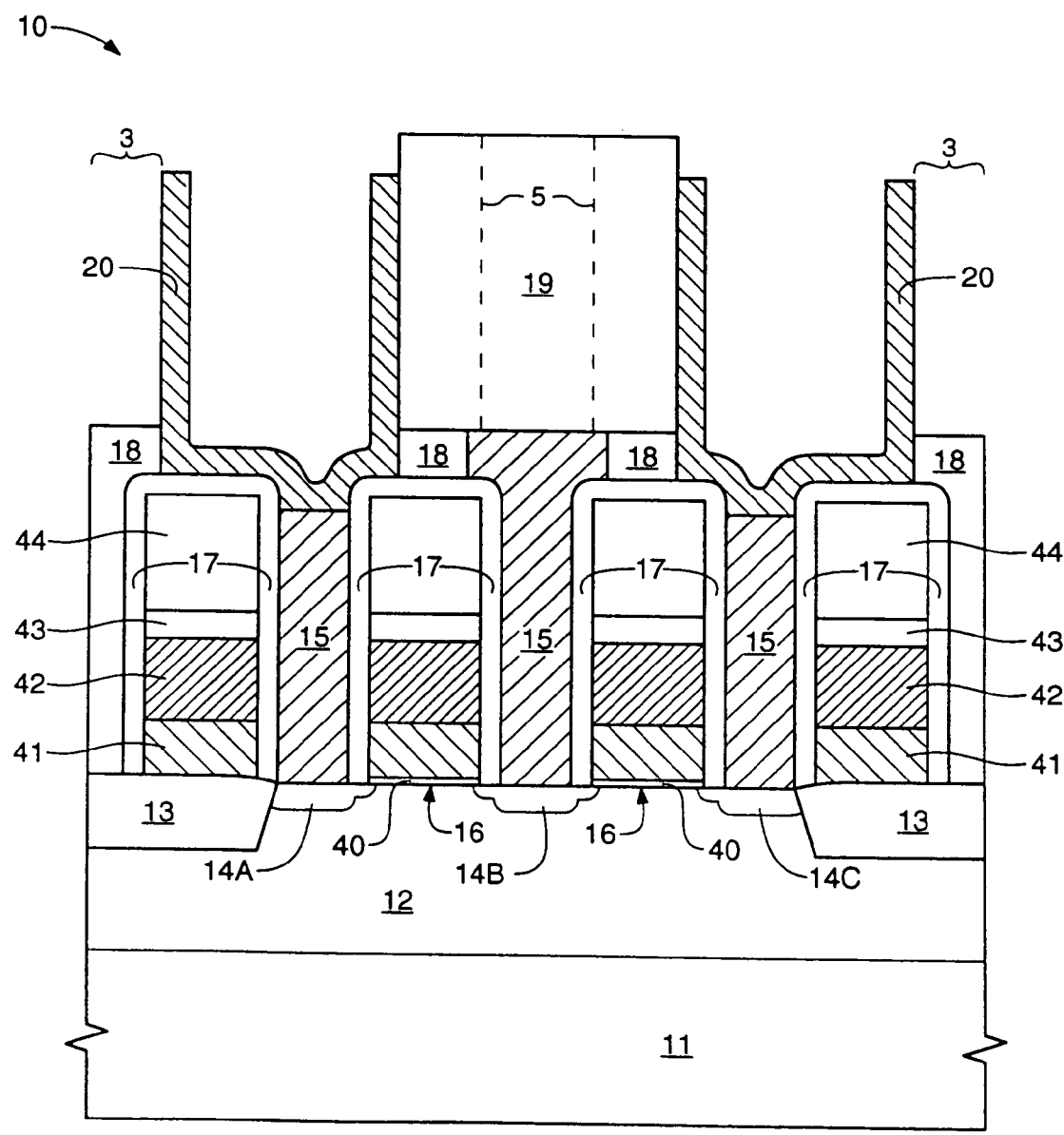

Thus, an alternative embodiment helpful in keeping the conductive layer 24C from the contact site 5 is illustrated in FIGS. 15A-F. FIG. 15A is similar to FIG. 6, with the stipulation that conductive layer 20 and dielectric 19 extend vertically enough to account for a subsequent etchback of conductive layer 20 using techniques known in the art. Accordingly, this etchback is performed, and FIG. 15B illustrates the result. FIG. 15C demonstrates that photoresist 400 is subsequently deposited and patterned to cover the contact site 5 and its surrounding dielectric 19. A dry etch is then performed, removing portions of the dielectric that are distal from a contact site—thereby forming the recesses 3 pictured in FIG. 15D and addressed in previous embodiments. This dry etch also clears at least a portion of the interior of the container shape defined by conductive layer 20. However, it is possible that the patterned photoresist 400 will extend over that interior, in which case some amount of flow-fill 21 will remain despite the dry etch. This can be seen in FIGS. 15D and 15E. A wet etch can be performed to remove the remaining flow-fill 21, and the result of such an etch is seen in FIG. 15F. FIG. 15G indicates that the next step is to remove the photoresist 400, thereby leaving a portion of dielectric 19 extending higher than the conductive layer 20. Subsequent steps track those seen in FIGS. 14D, 14E, and the relevant text: the capacitor dielectric 23C and conductive layer 24C are deposited, and a CMP step removes at least the conductive layer 24C from over the contact site 5 and surrounding dielectric 19. It is preferable that the etchback in illustrated in FIG. 15B be sufficient to ensure that the CMP step does not remove other portions of the conductive layer 24C needed to generate capacitance.

Figure 16A:
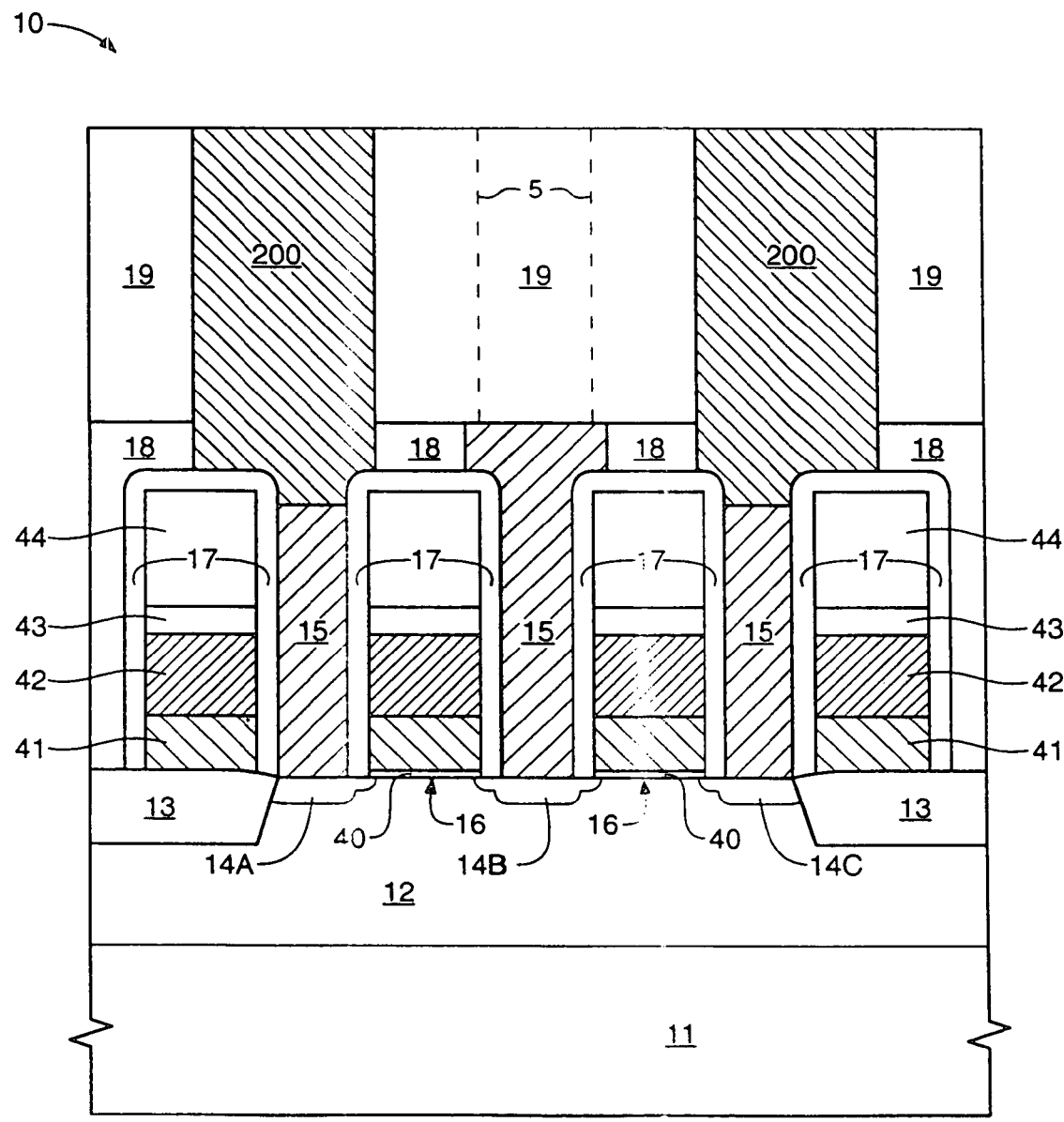
FIGS. 16A-G are cross-sectional views of another alternative exemplary embodiment of the current invention.
Figure 16B:
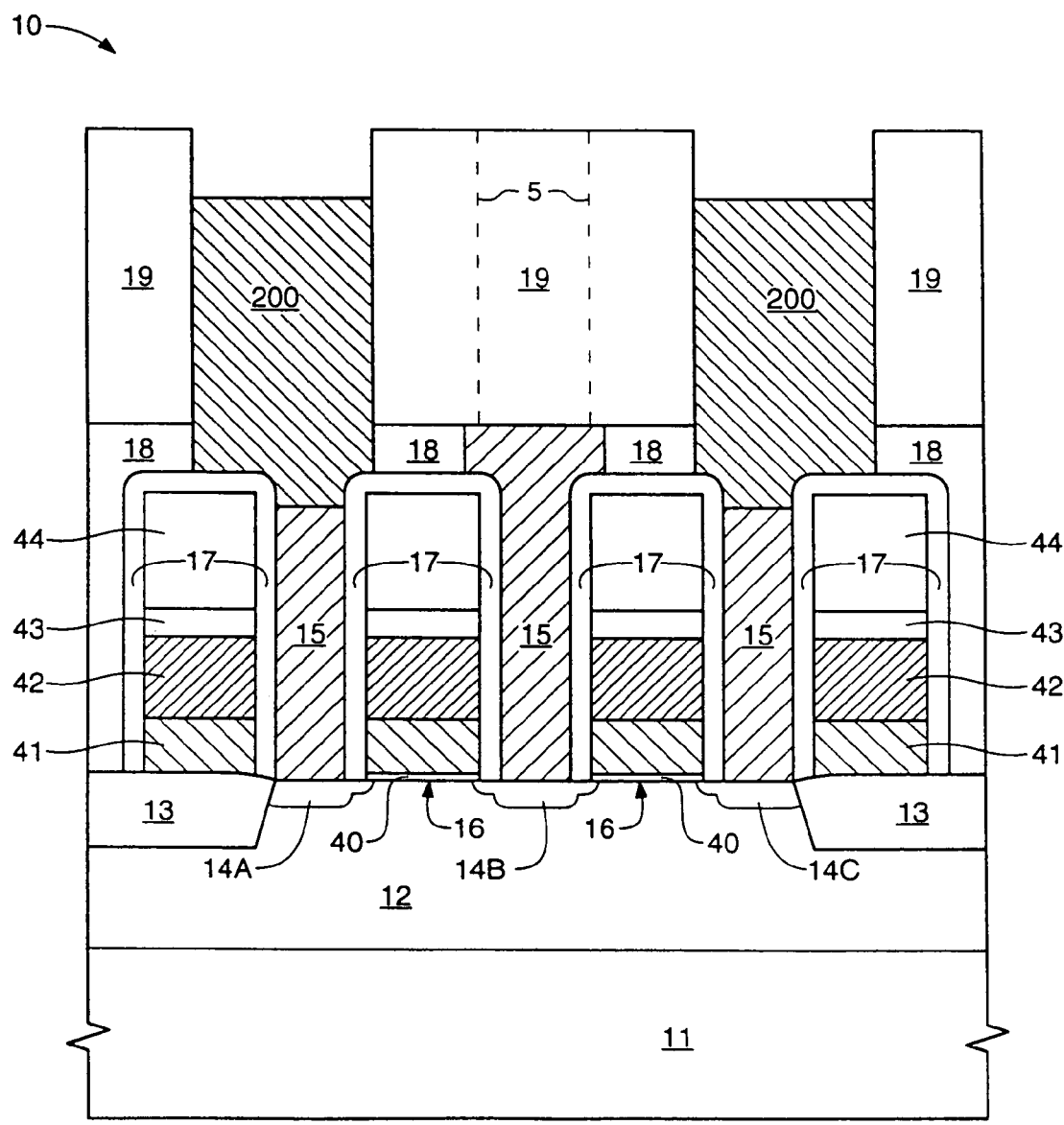
Figure 16C:
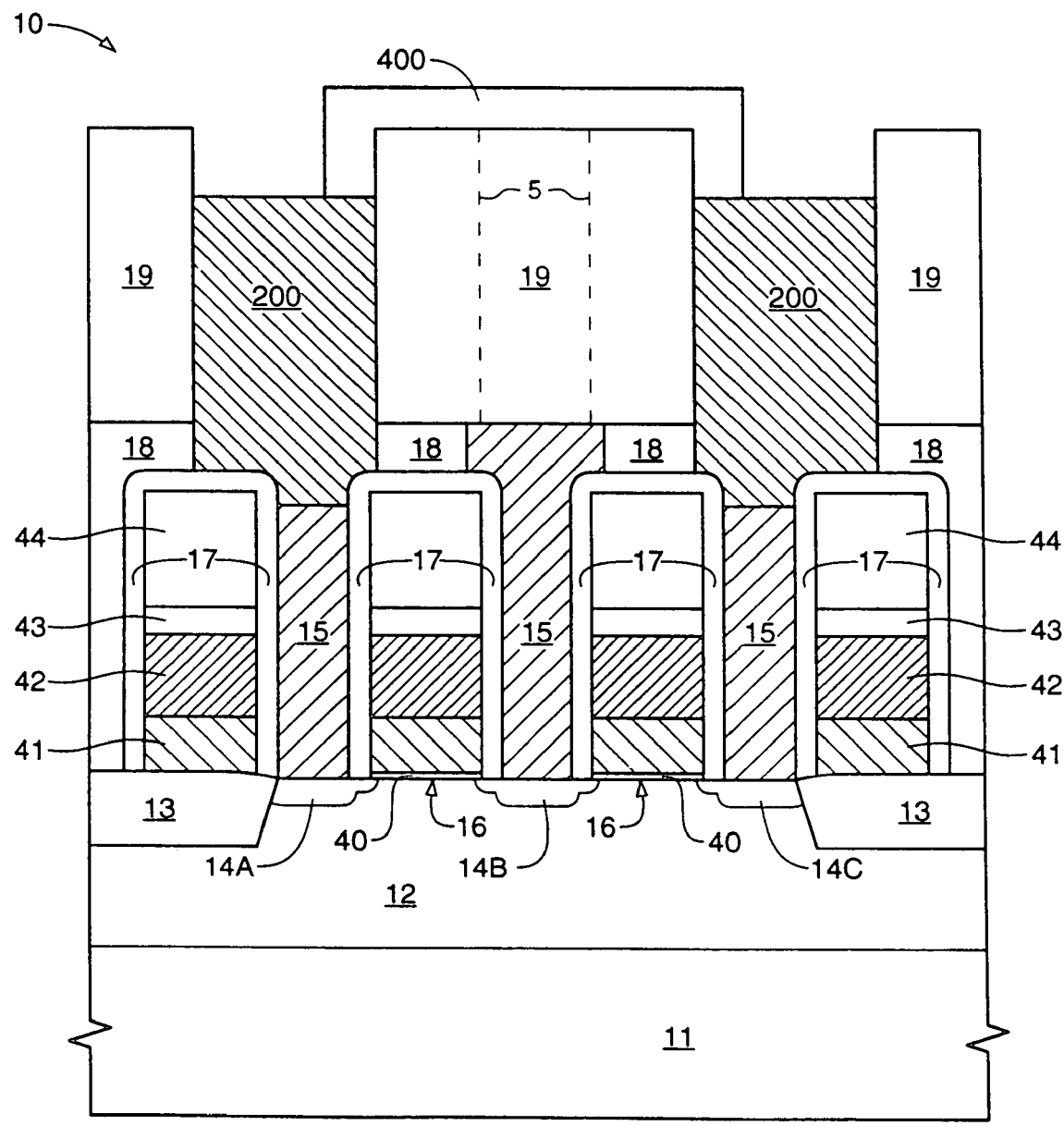
Figure 16D:
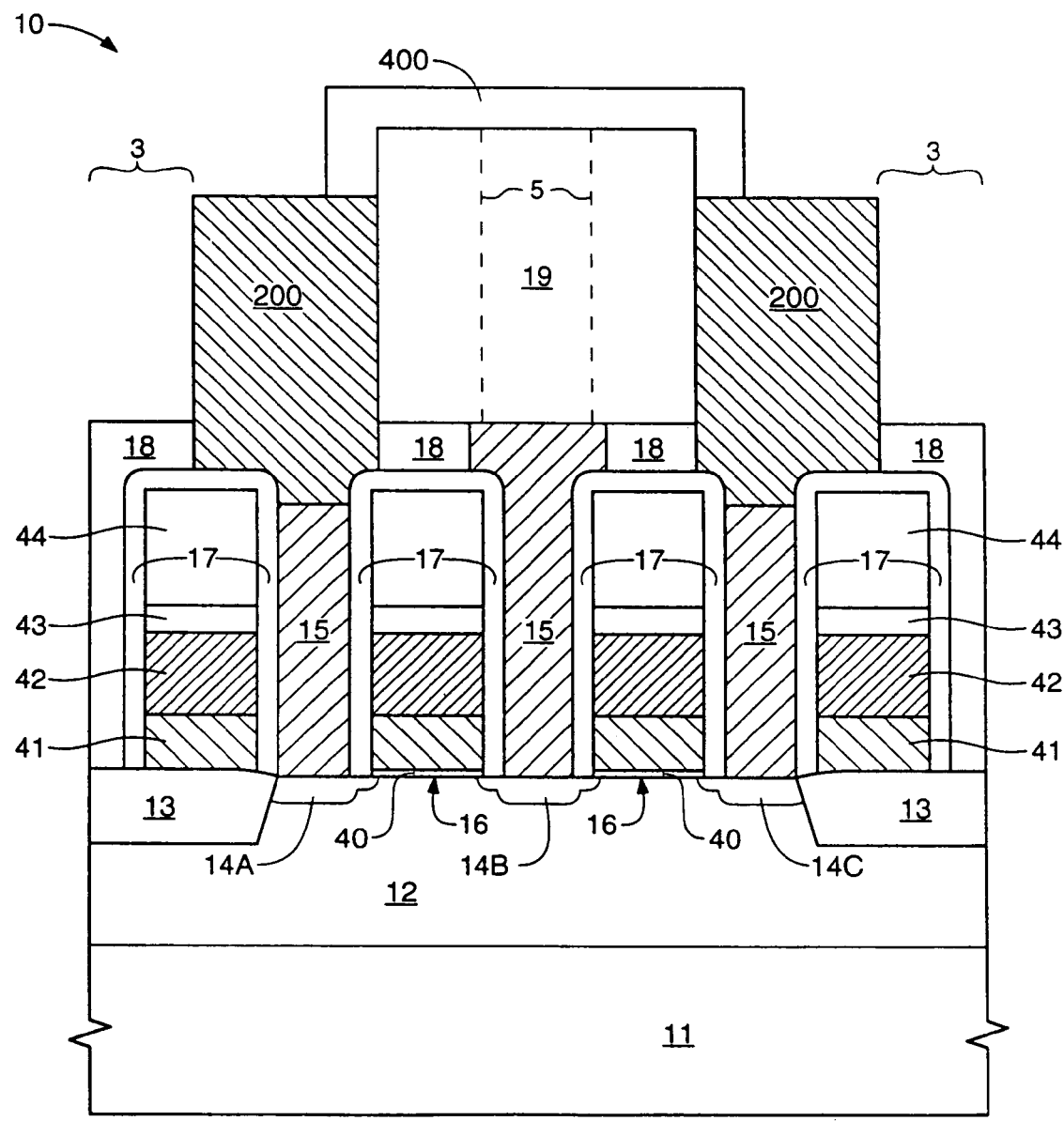
Figure 16E:
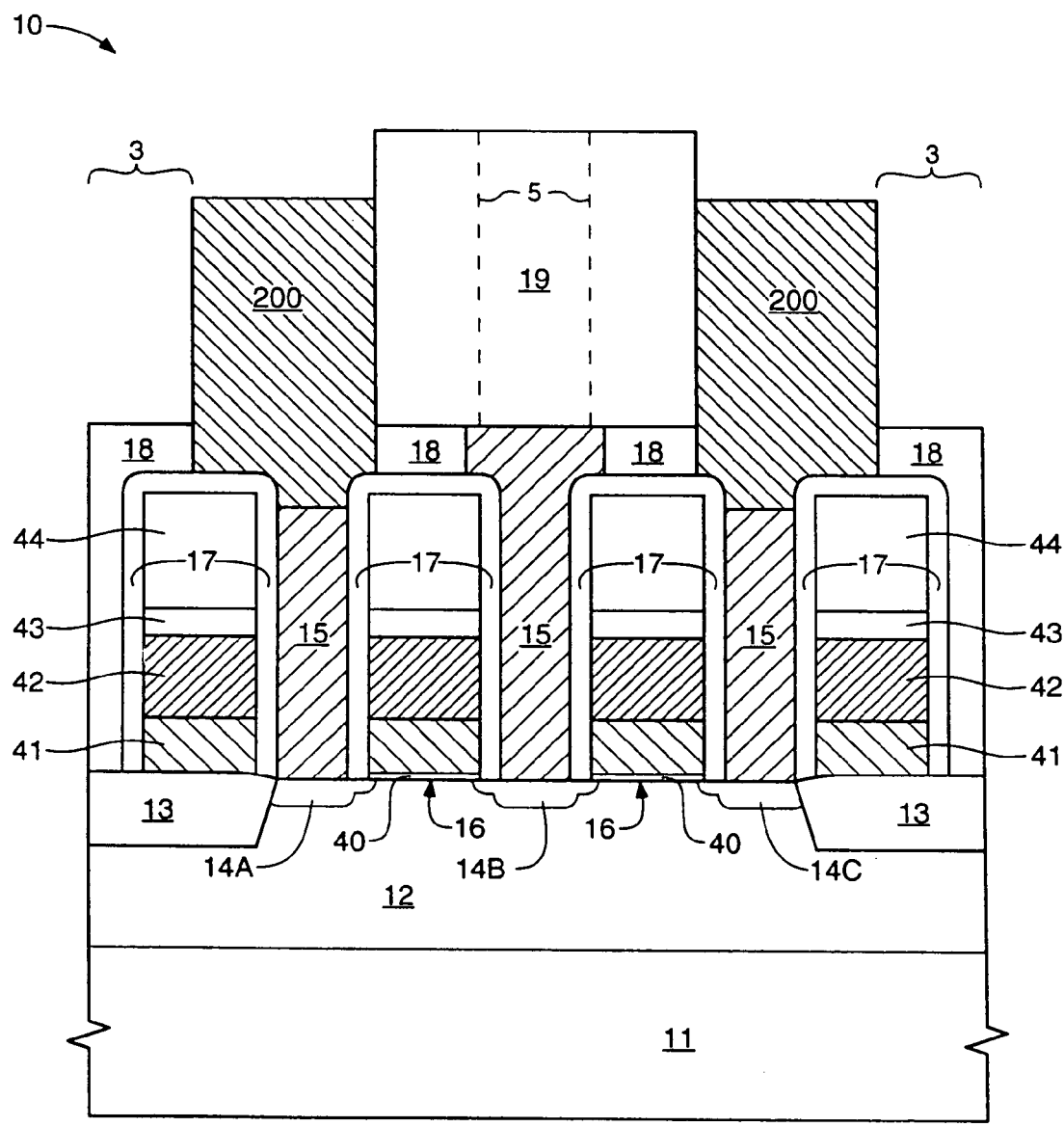
Figure 16F:
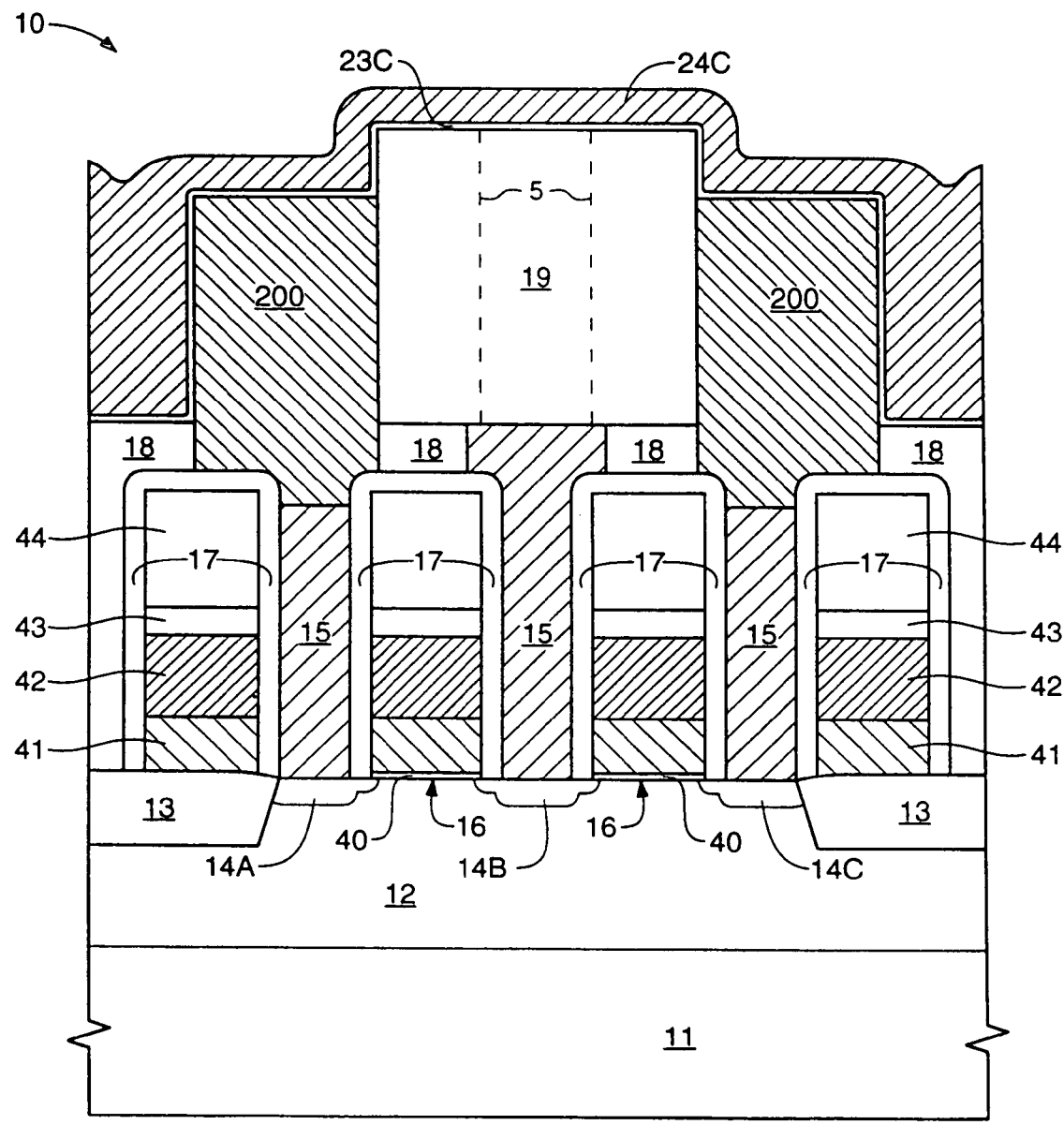

Moreover, this process of ensuring adequate spacing between conductive layer 24C and contact sites 5 is not limited to container capacitors. FIGS. 16A-G demonstrate that the process works on other vertical capacitors as well. These figures specifically illustrate the construction of a memory device incorporating stud capacitors similar to those discussed above in connection with FIG. 13. FIG. 16A illustrates that studs 200 serve as the bottom electrode for the in-process capacitors. These studs are recessed, as seen in FIG. 16B, by etching methods known in the art. Photoresist 400 is deposited and patterned, thereby covering the contact site 5 and the portion of dielectric 19 surrounding that site 5 (FIG. 16C). As in the previous embodiment, photoresist 400 is allowed to extend laterally beyond that portion of dielectric 19. Thus, in the event that the patterned photoresist 400 is misaligned with respect to the underlying dielectric 19, it is less likely that dielectric 19 will be exposed to the subsequent etch. Accordingly, a dry etch is then performed to form recesses 3 seen in FIG. 16D. Unlike the previous embodiment, the extension of patterned photoresist 400 does not require an additional wet etch, as extended portions of photoresist 400 merely cover the studs 200. The photoresist 400 is then removed (FIG. 16E) and capacitor dielectric 23C is deposited, followed by conductive layer 24C (FIG. 16F). It should be noted that, in this exemplary embodiment, the thickness of conductive layer 24C and the dimensions of the recesses 3 are such that conductive layer 24C fills rather than merely lines the recesses 3. Such a result may be provided for in any other exemplary embodiment discussed herein as well as others within the scope of the current invention. A CMP step achieves the state of the substrate assembly depicted in FIG. 16G, and further processing may proceed as discussed in previous exemplary embodiments.

Figure 16G:
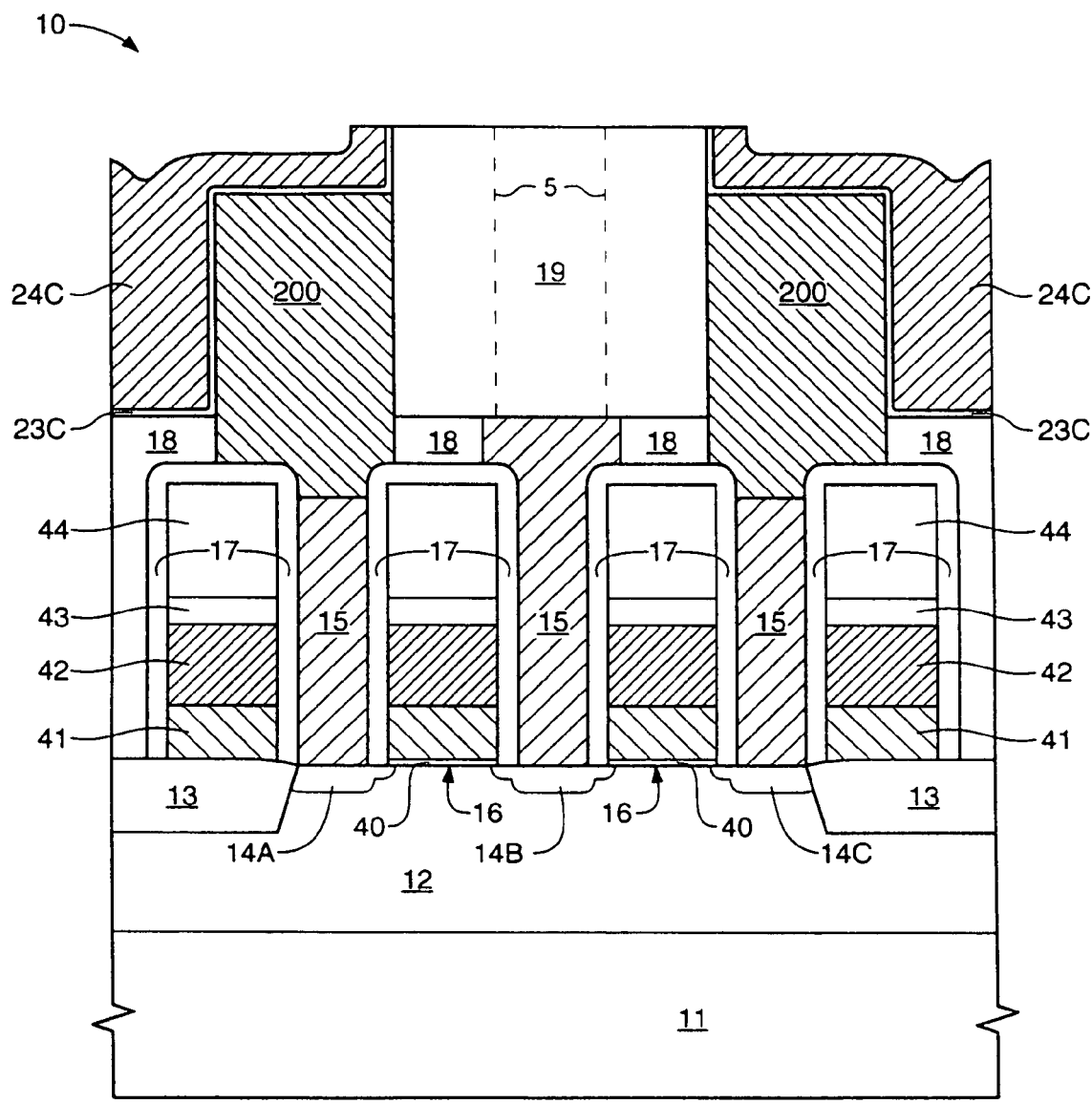
Figure 17A:
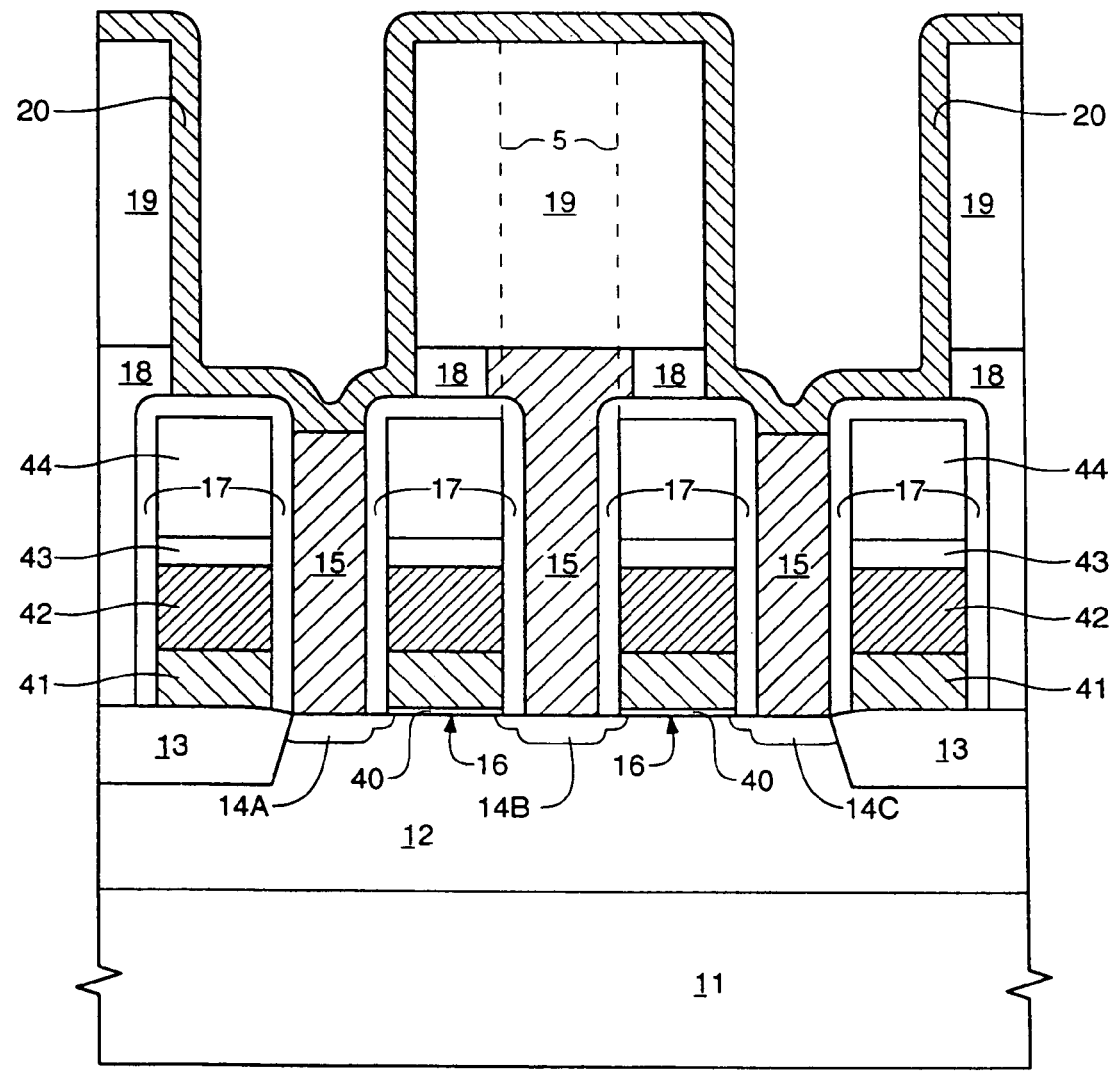
FIGS. 17A-G are cross-sectional views of another alternative exemplary embodiment of the current invention.
Figure 17B:
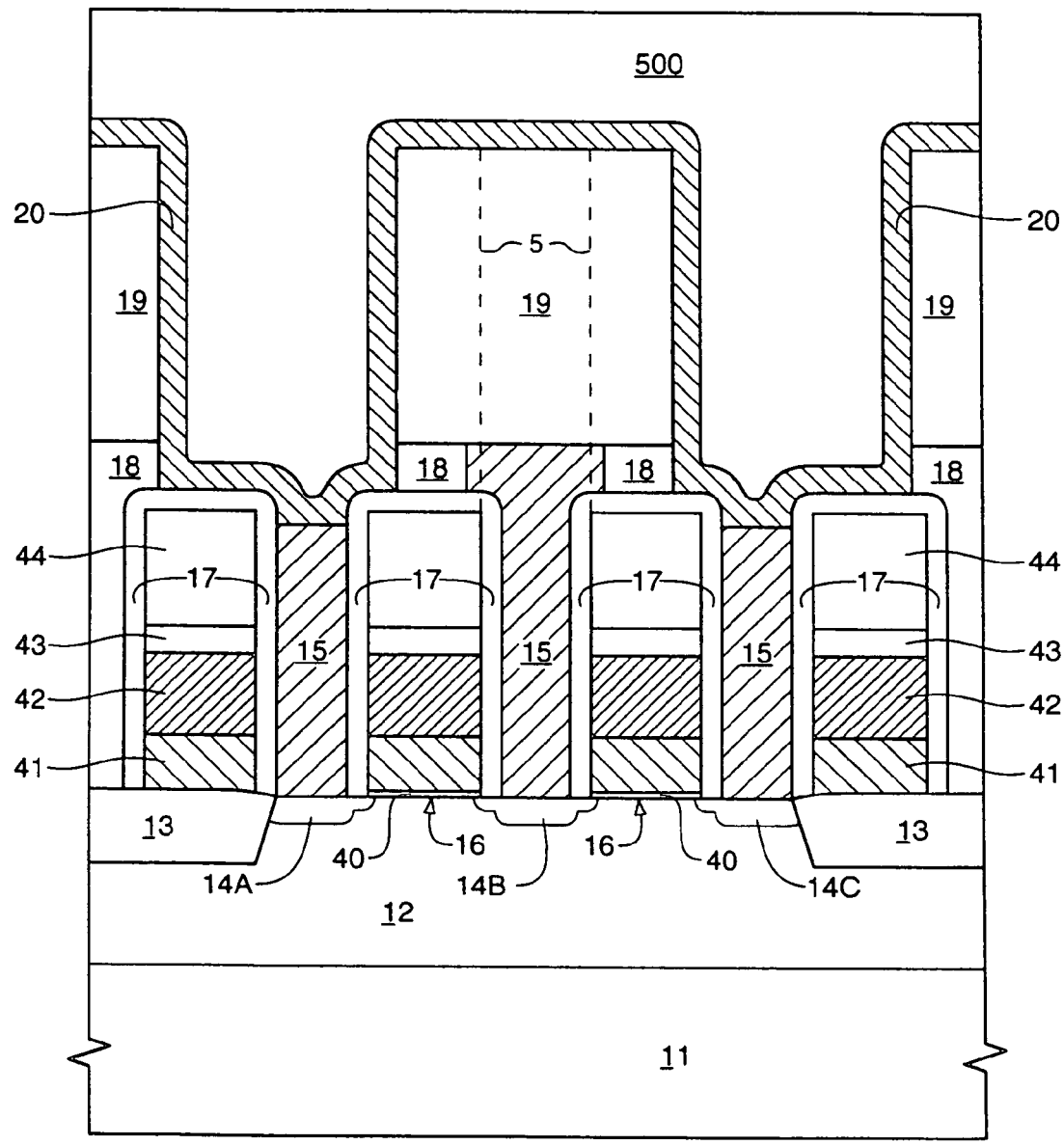

In addition, it should be noted that the last few embodiments described above involve two planarization steps: one to planarize conductive layer 20 (see, for example, FIG. 6), and another to planarize capacitor dielectric 23C and conductive layer 24C (FIGS. 14E, 16G). However, the current invention includes within its scope embodiments that have fewer planarization steps. One such exemplary embodiment appears in FIGS. 17A-17G. In FIG. 17A, conductive layer 20 has been deposited over dielectric 19. Rather than planarize conductive layer 20, FIG. 17B demonstrates that a photoresist layer 500 is deposited thereover. Subsequent patterning of photoresist layer 500 results in the substrate assembly depicted in FIG. 17C, wherein developed photoresist 500 covers the portion of the dielectric 19 that encompasses the contact site 5 and extends to conductive layer 20's vertical surfaces. Further, undeveloped photoresist 500' remains at the bottom of the container capacitor structures 8D. A subsequent anisotropic etch removes portions of the conductive layer 20 outside of the container capacitor structures 8D and recesses the conductive layer 20 within the container capacitor structures 8D; the result of this etch is seen in FIG. 17D. That figure also illustrates that the undeveloped photoresist 500' prevents the anisotropic etch from removing the conductive layer 20 from the bottom of the container capacitor structures 8D. However, even if there were no photoresist at the bottom of the container capacitor structures 8D, etching of the conductive layer 20 at the bottom is not necessarily detrimental, as doing so merely exposes another conductive material—the underlying conductive stud 15. The conductive material of stud 15 can serve as a part of the bottom plate in the event the overlying portion of conductive layer 20 is removed. It should be further noted that a container capacitor structure 8D can be tapered—becoming narrower closer to the bottom—to ensure the continuity of conductive material for the bottom plate. An anisotropic oxide etch is then performed to define the recesses 3 (FIG. 17E). Next, the photoresist 500, 500' is removed, and capacitor dielectric 23C and conductive layer 24C are deposited, as seen in FIG. 17F. A following CMP step removes portions of conductive layer 24C, capacitor dielectric 23C, and conductive layer 20 that overlie the contact site 5; and the result is depicted in FIG. 17G.

Figure 17C:
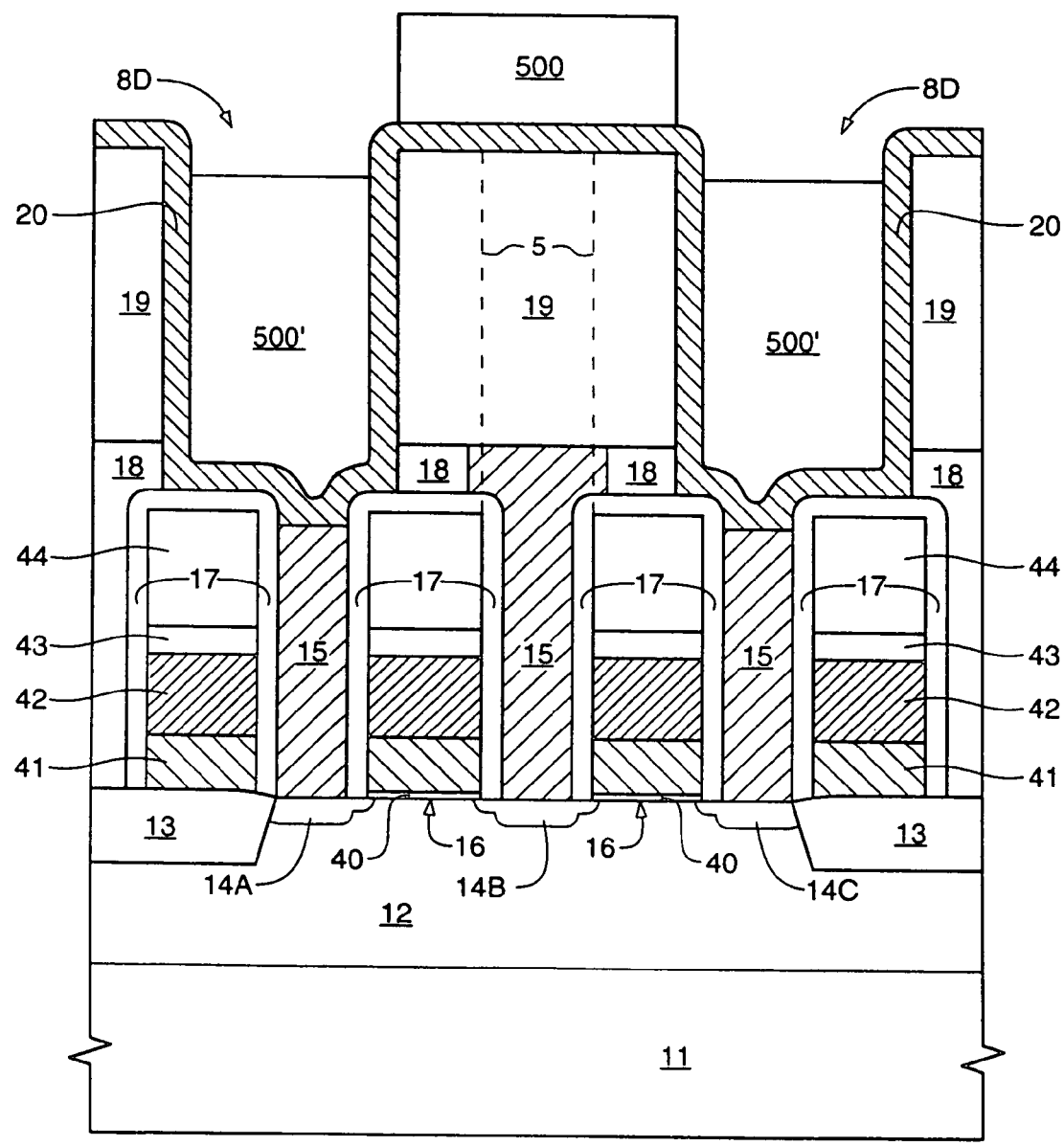
Figure 17D:
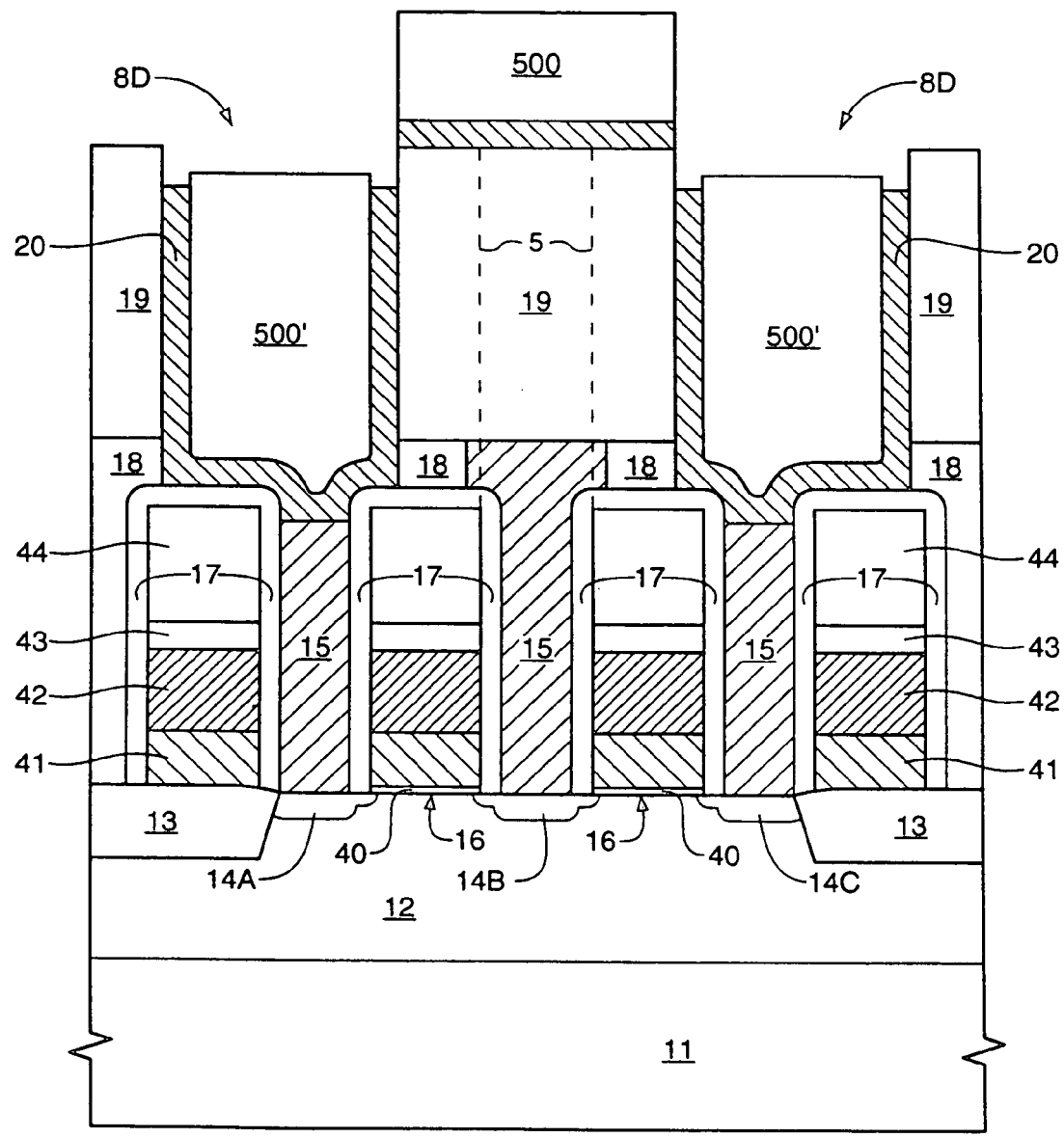
Figure 17E:
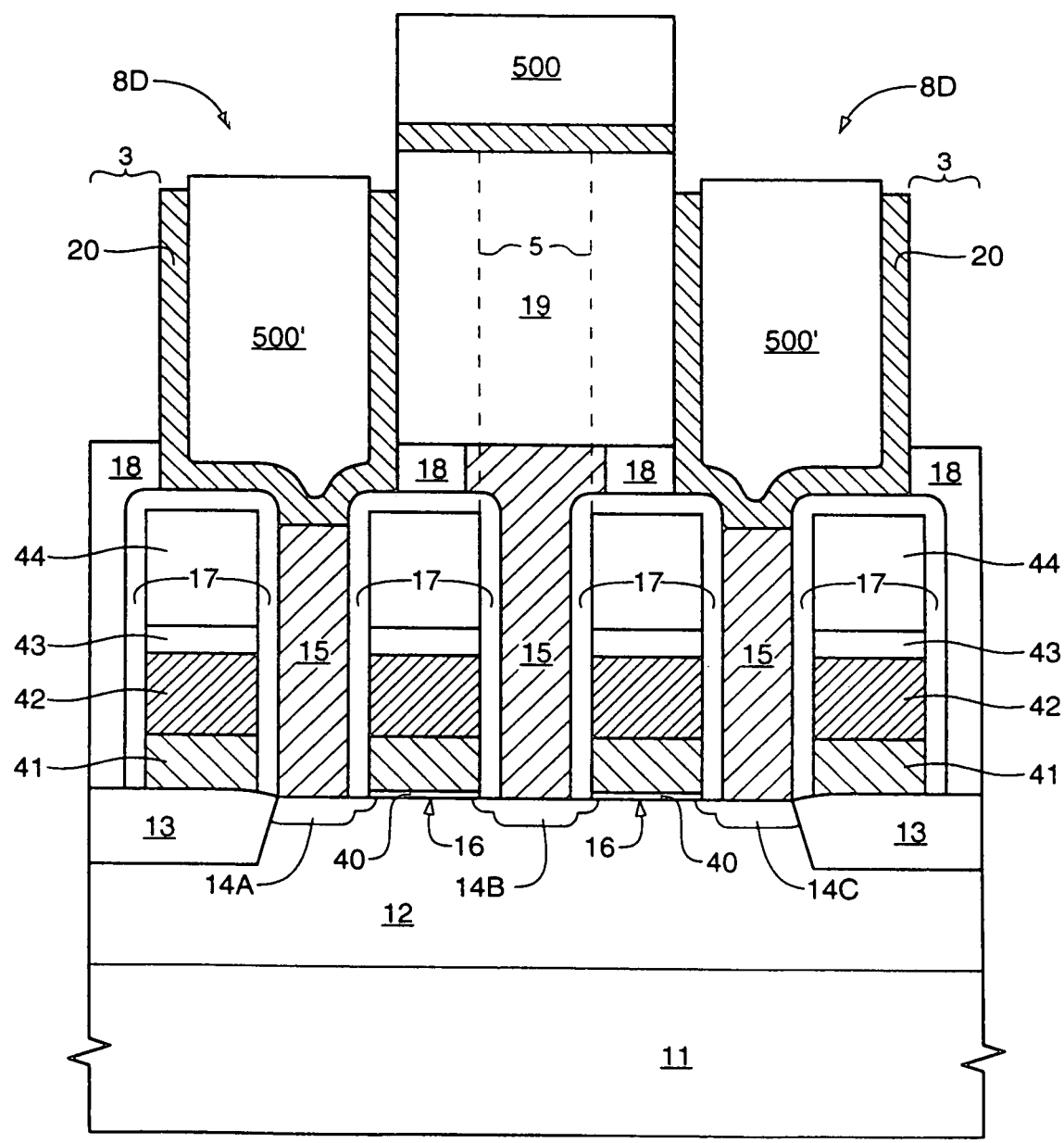
Figure 17F:
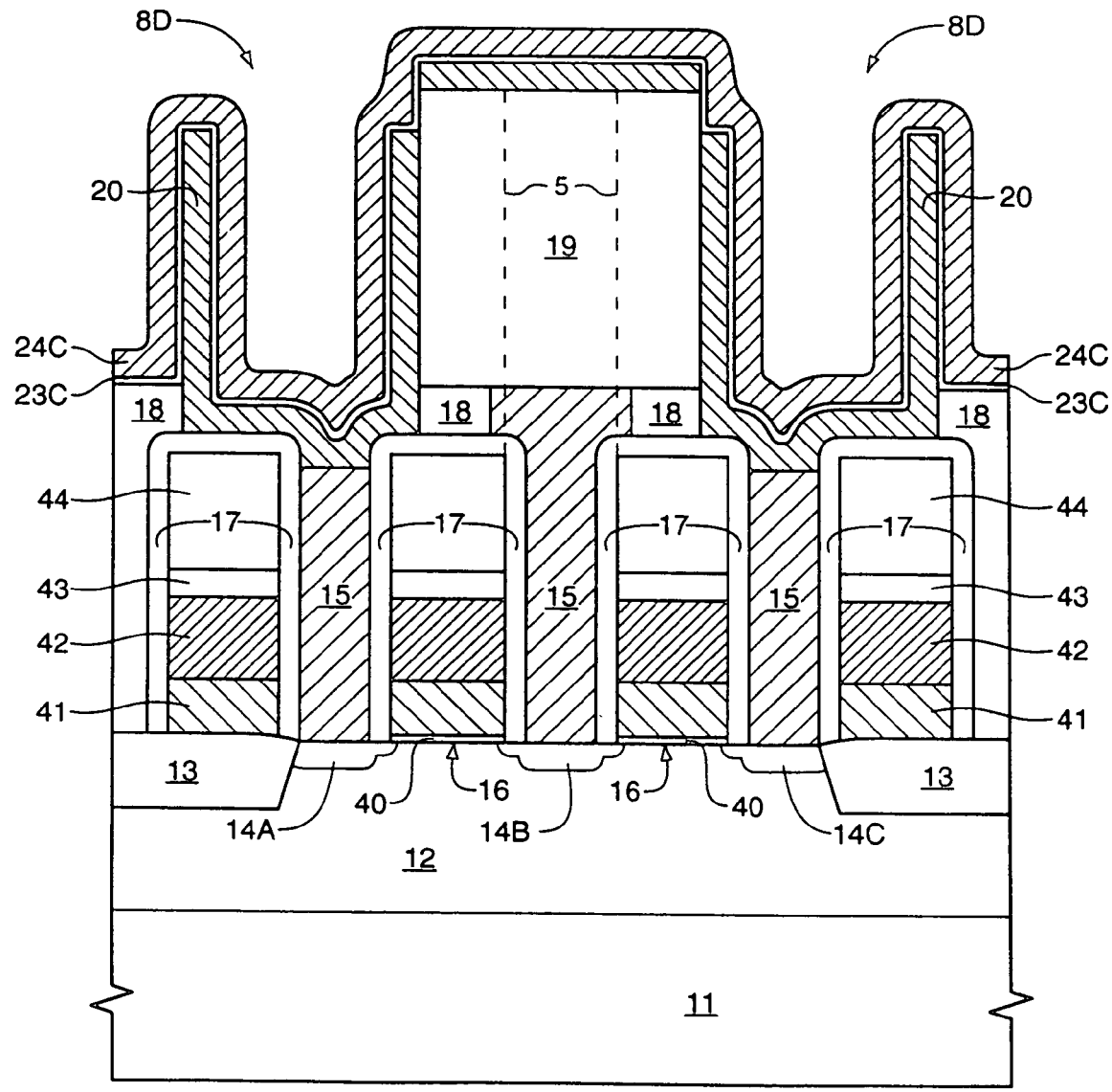
Figure 17G:
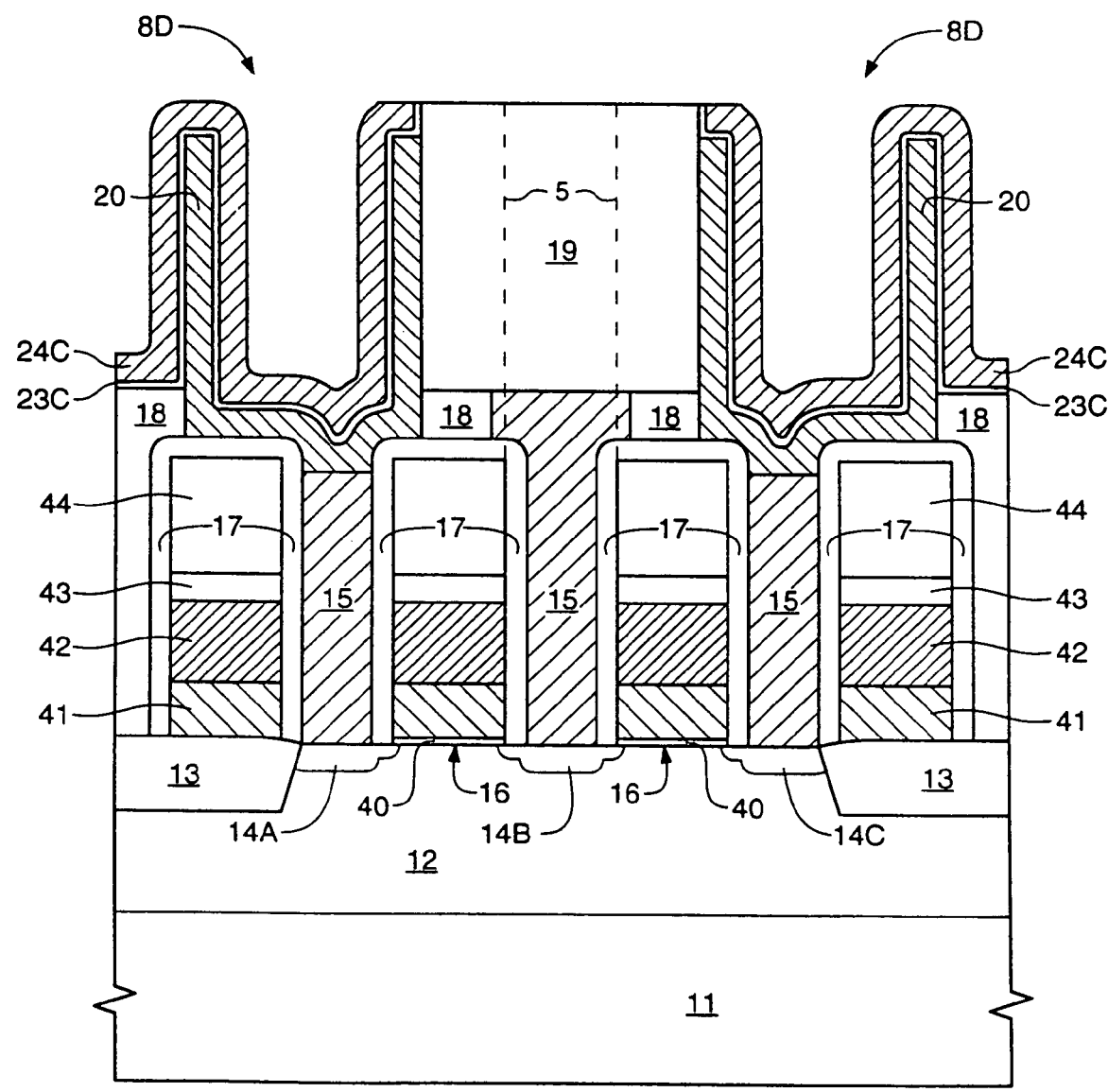
Figure 18A:
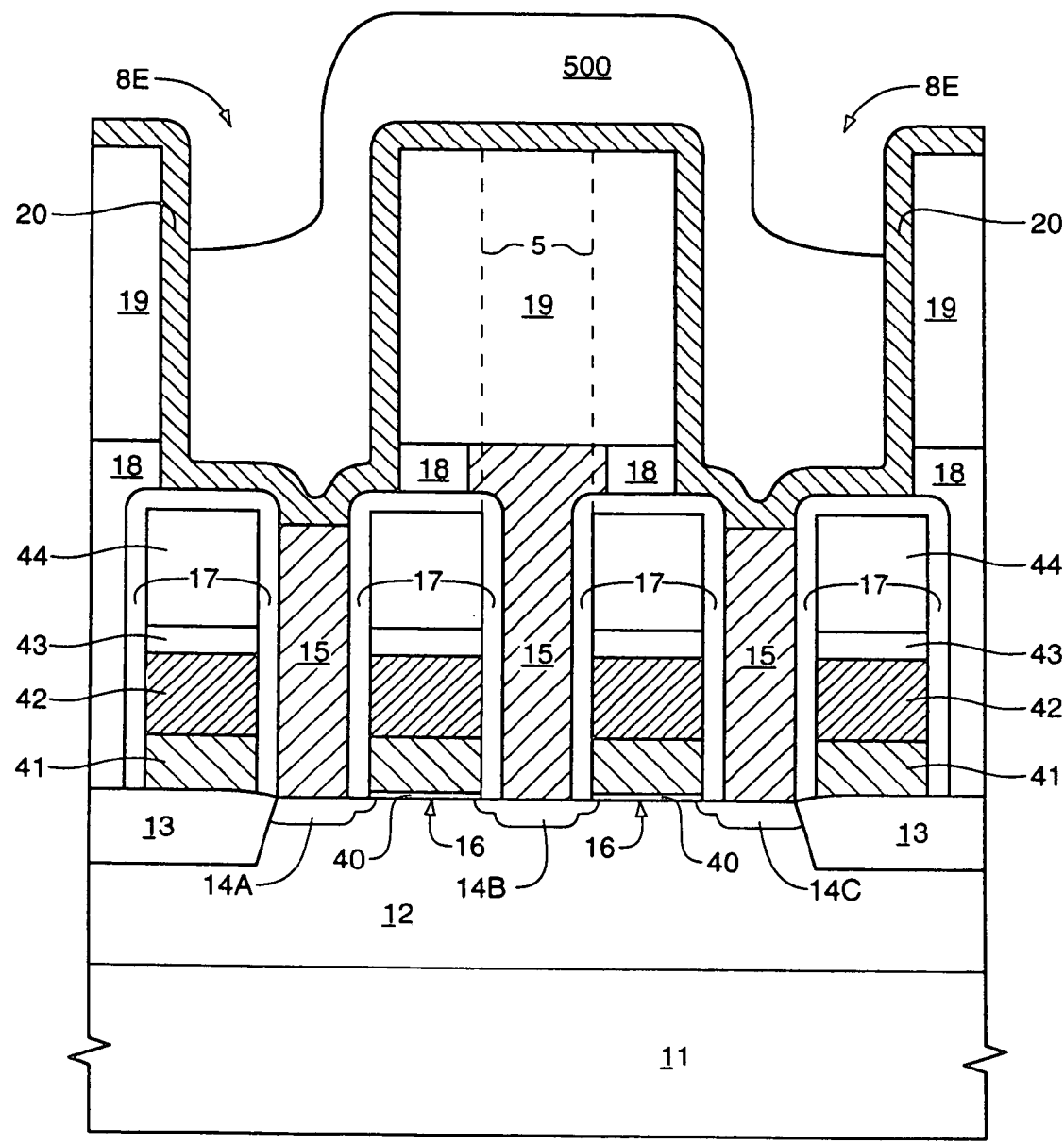
FIGS. 18A-G are cross-sectional views of another alternative exemplary embodiment of the current invention.
Figure 18B:
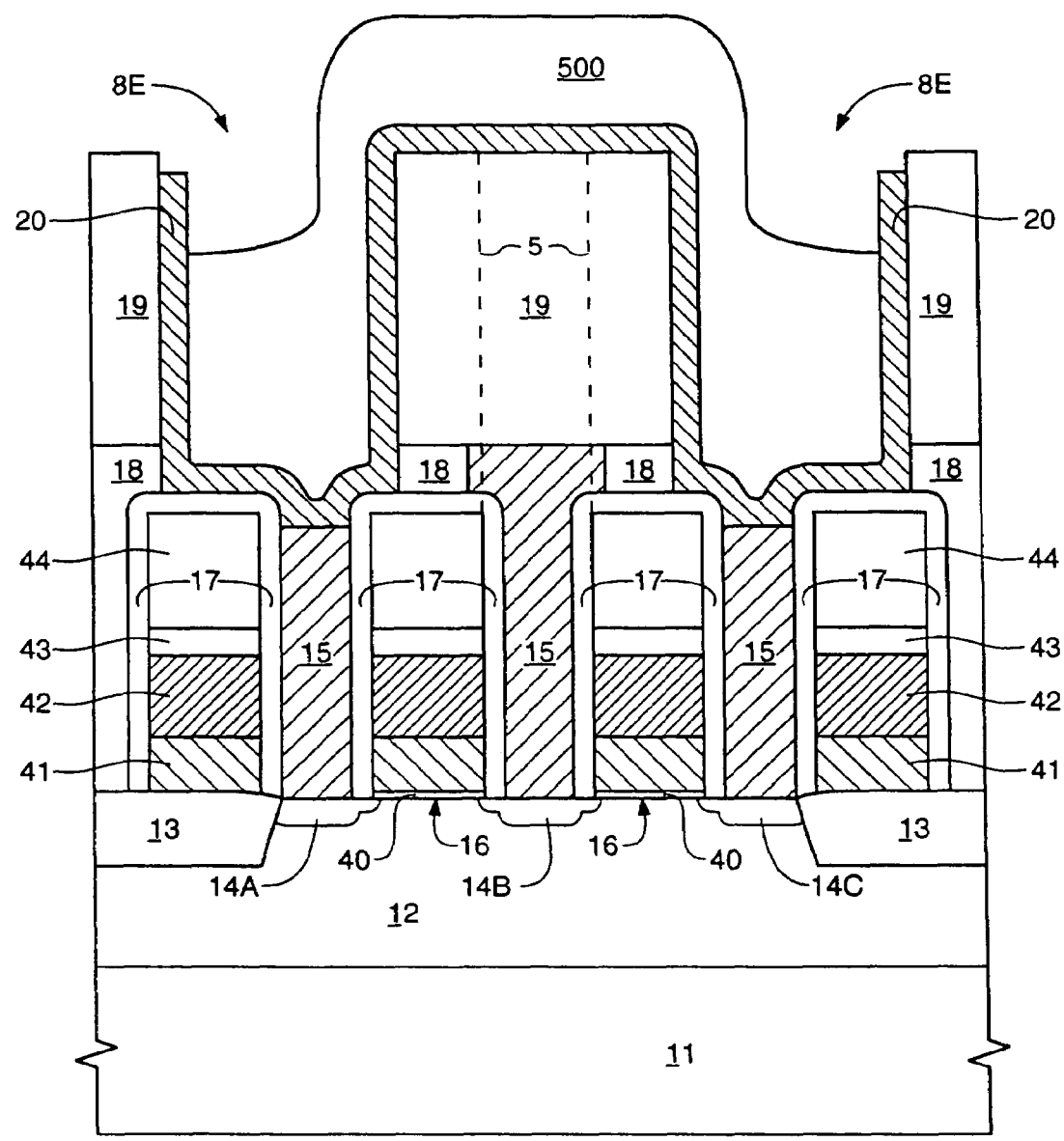
Figure 18C:
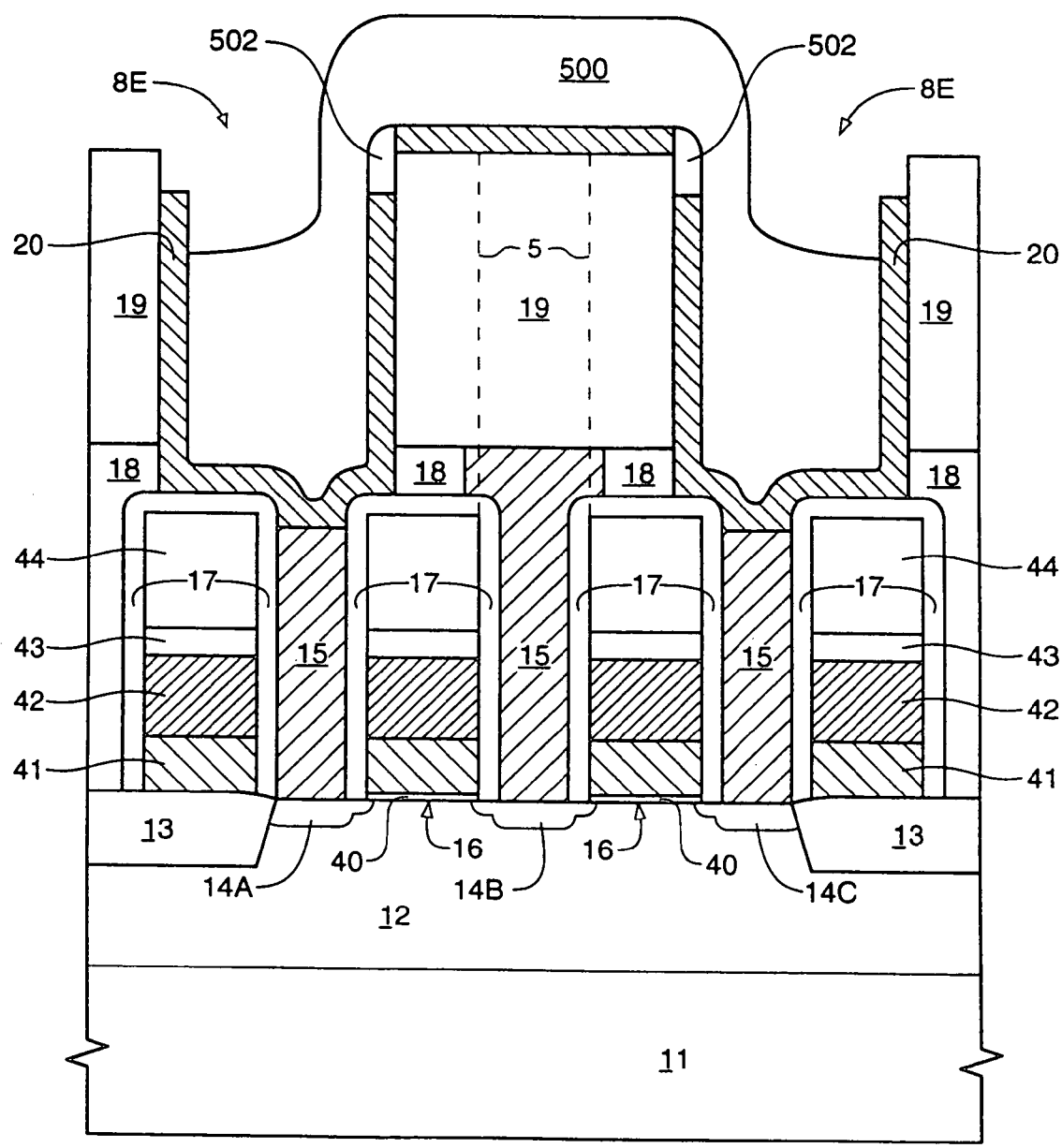
Figure 18D:
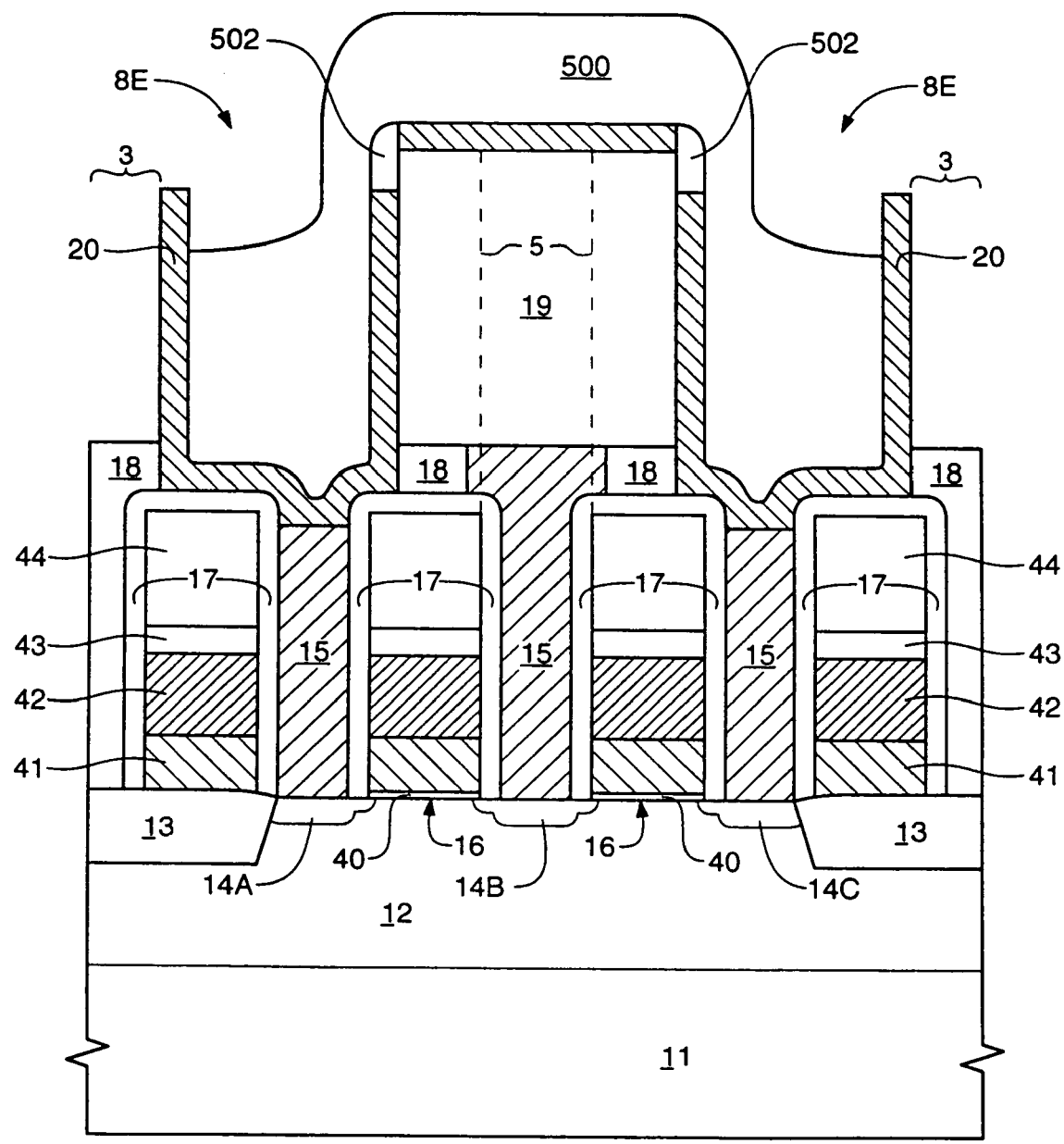
Figure 18E:
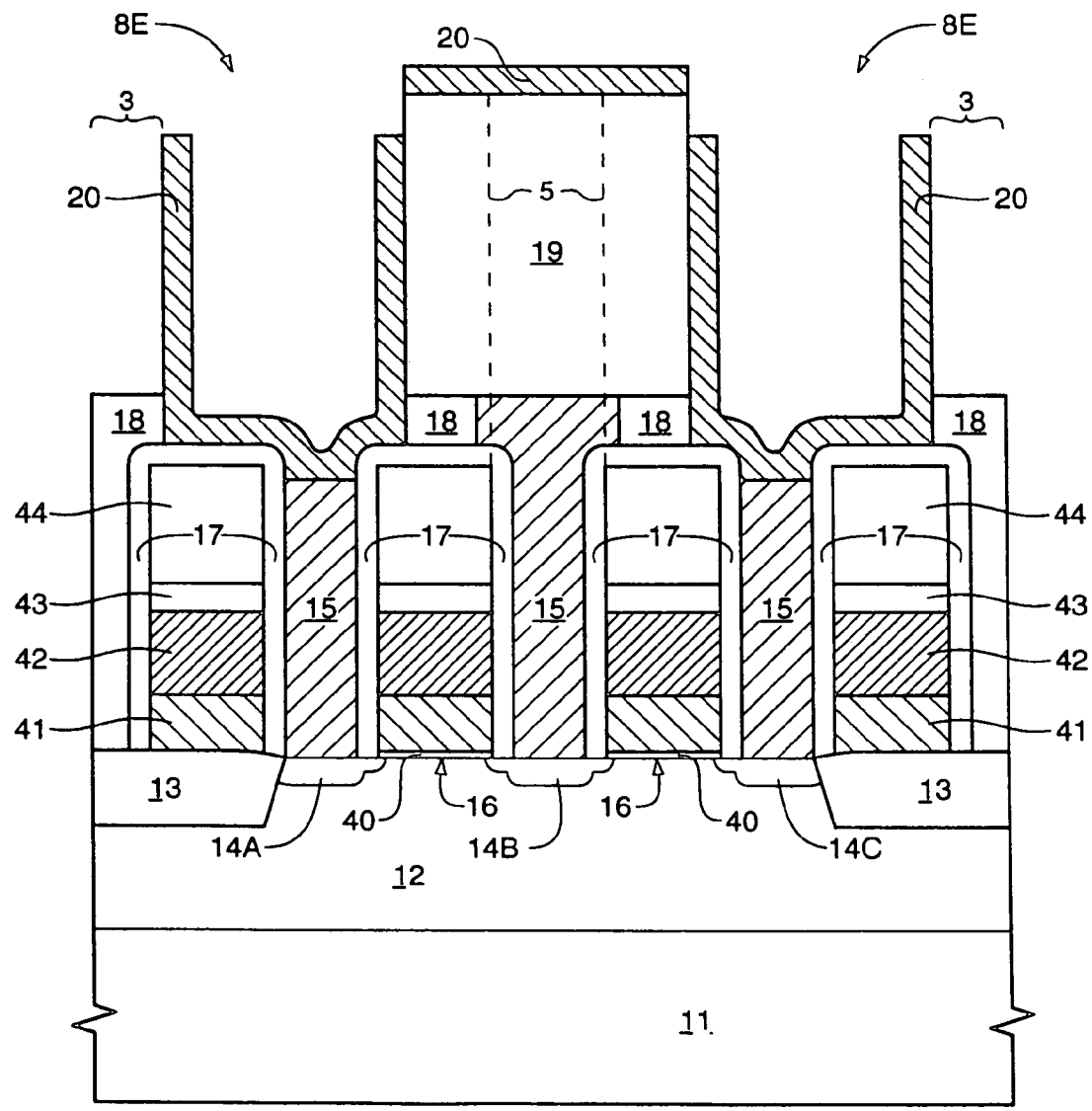
Figure 18F:
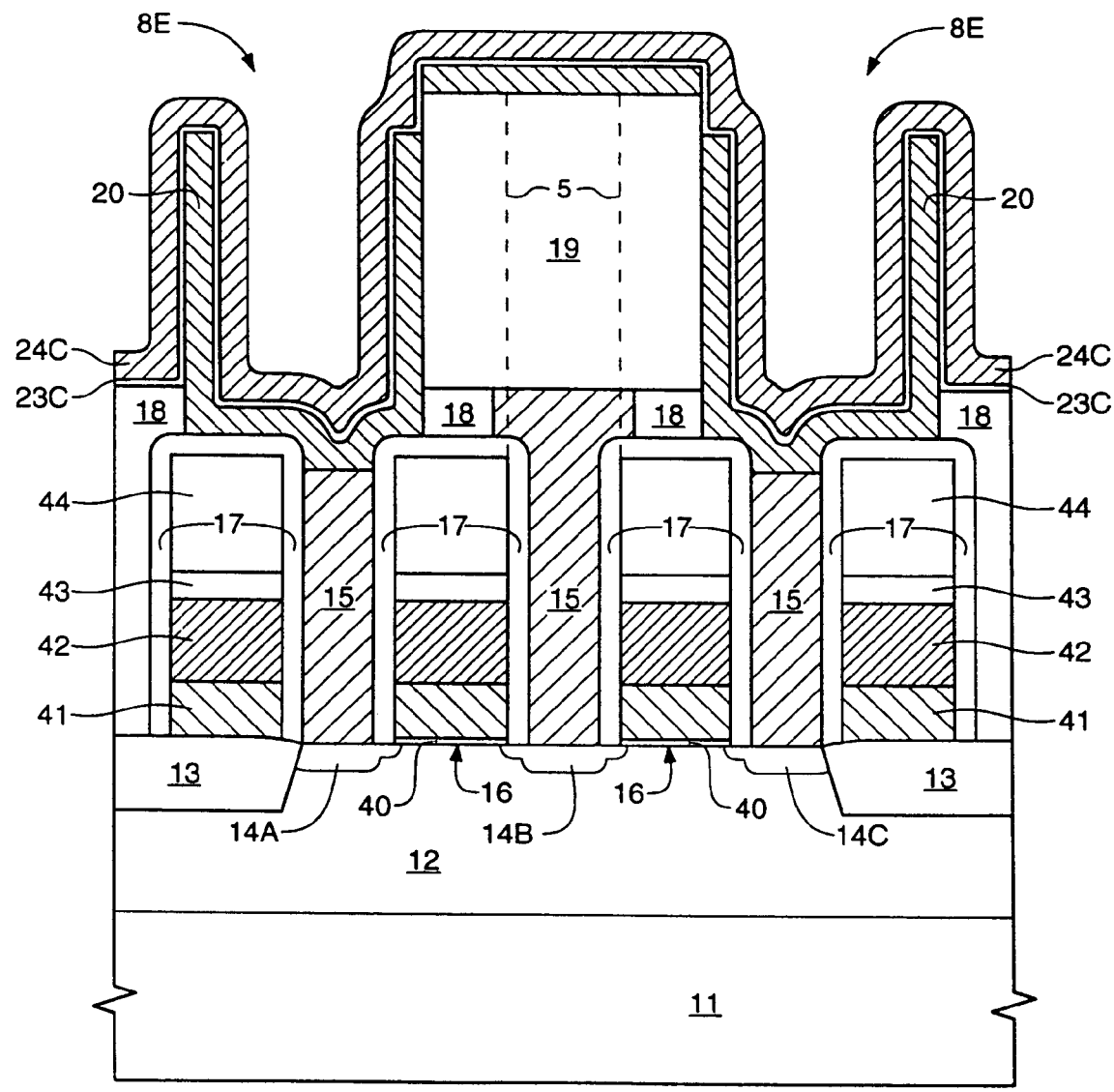
Figure 18G:
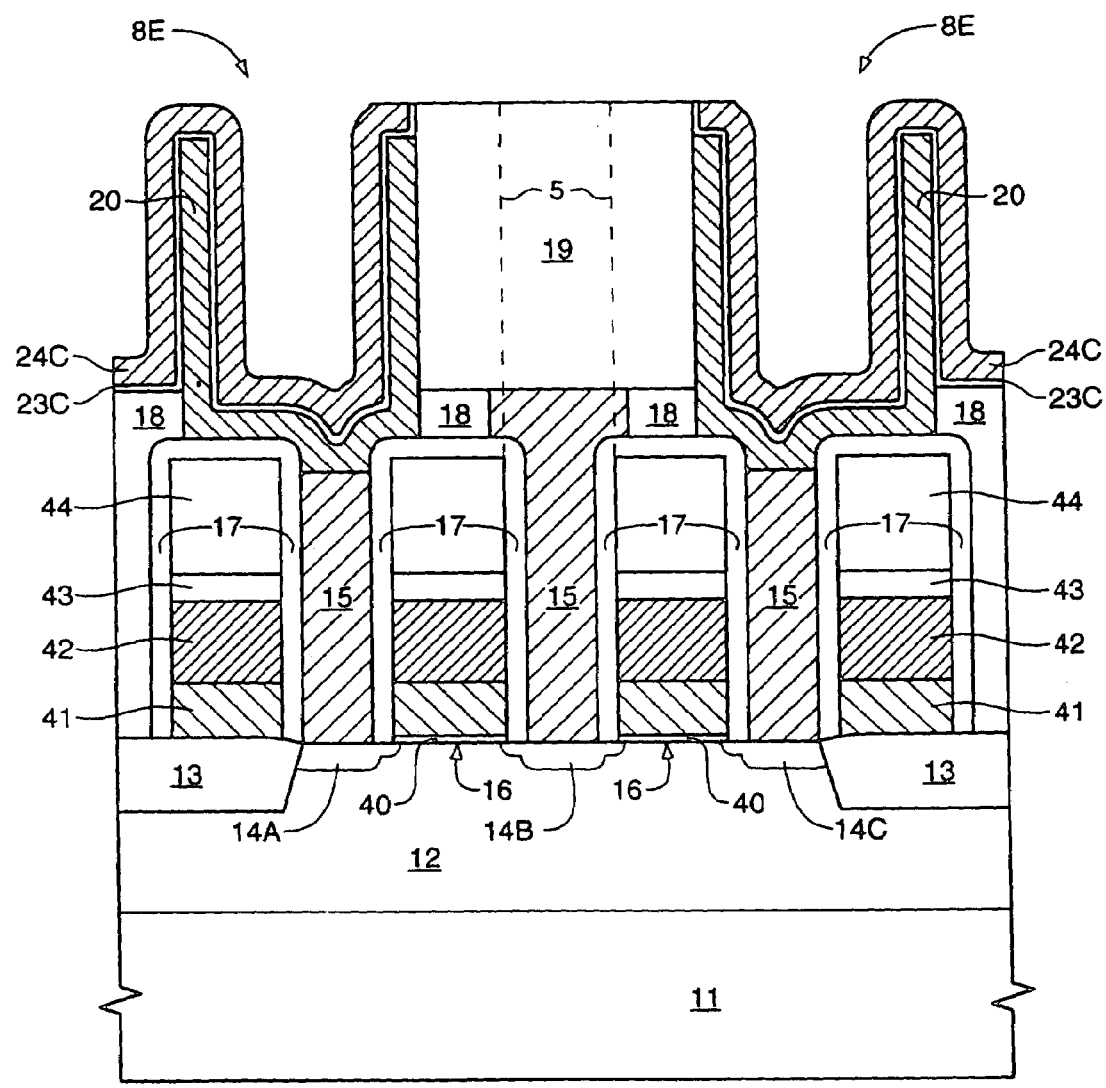

In the event that it is difficult to align the hardened photoresist 500 with the contact site 5 and dielectric 19 as depicted in FIG. 17C, then an alternative embodiment pictured in FIGS. 18A-18G may be pursued. After depositing photoresist 500 as seen in FIG. 17B, subsequent patterning results in the substrate assembly of FIG. 18A. In that figure, photoresist 500 is wider than the portion of dielectric 19 encompassing the contact site 5 and extending to the vertical surfaces of conductive layer 20. This helps to ensure coverage of this portion of dielectric 19 in the event of a misaligned pattern. As a result, photoresist may extend into the container capacitor structures 8E and cover parts of conductive layer 20 that face the contact site 5. Accordingly, the subsequent anisotropic etch (preferably a dry etch) of the conductive layer 20 will not affect those parts. Nevertheless, the etch will still remove portions of the conductive layer 20 outside of the container capacitor structures 8E and recess some the conductive layer 20 within the container capacitor structures 8D. The result of this etch is seen in FIG. 18B. In order to recess the remaining portion of conductive layer 20 within the container capacitor structures 8D, an isotropic etch, either dry or wet, is used. The result is pictured in FIG. 18C, wherein the conductive layer 20 is recessed along the entire circumference of the container capacitor structures 8E, leaving gaps 502 between the conductive layer 20, dielectric 19, and photoresist 500. What follows is an oxide etch defining the recesses 3 (FIG. 18D); removal of photoresist 500 (FIG. 18E); deposition of capacitor dielectric 23C and conductive layer 24C (FIG. 18F); and CMP of portions of conductive layer 24C, capacitor dielectric 23C, and conductive layer 20 that overlie the contact site 5 (FIG. 18G). Processing may then continue as described in previous exemplary embodiments.

The present invention has shown and described with respect to certain preferred embodiments. However, it will be readily appreciated to those of ordinary skill in the art that a wide variety of alternate embodiments, adaptations or variations of the preferred embodiments, and/or equivalent embodiments may be made without departing from the intended scope of the present invention as set forth in the appended claims. For instance, the current invention would generally apply to any circuit having a first device defining an axis and a second device with one side near the first device and another side far from the device. The second device would include an element that defines a plurality of layers at the far side and less than that plurality of layers on the near side, wherein the layers extend along the axis defined by the first circuit device. The current invention also includes methods for making the device described above. More specifically, the devices and methods of the current invention may be applied to metal-insulator-metal capacitors. Accordingly, the present invention is not limited except as by the claims.

What is claimed is:

1. A method of forming a memory cell comprising:
    forming a bottom electrode of a capacitor having a container shape with exterior and interior surfaces in a supporting dielectric insulation region, the dielectric insulation region abutting a portion of the exterior surface of the bottom electrode;
    forming a substantially vertically extending bit line contact site extending from a vertical height above the bottom electrode to a source/drain region of an access transistor, the dielectric insulation abutting an entire vertical exterior surface portion of the bottom electrode adjacent the bit line contact site;
    forming recesses in the supporting dielectric to expose surface portions of the exterior of the container at a level below the top of the container exterior, wherein forming recesses further comprises depositing an etch mask between the surface portions of the exterior; and removing the supporting dielectric not masked by the etch mask;
    forming a dielectric layer over the interior surface and the exterior surface not abutting the insulation region; and
    forming a top plate over the dielectric layer.

2. The method of claim 1, wherein the dielectric layer extends from the bottom electrode at two different levels.

3. The method of claim 2 wherein the two levels comprises a first level at the top of the container bottom electrode and a second level below the first level.

4. The method of claim 3 wherein the first and the second levels are separated by a vertical distance of at least 500 angstroms.

5. The method of claim 1, wherein the top plate extends from the container at two different levels, a first level substantially at the top of the container and a second level below the top of the container.

6. The method of claim 5 wherein the two levels are separated by a vertical spacing of at least 500 angstroms.

7. The method of claim 1, and further comprising:
forming a second memory cell adjacent the bit line contact, the exterior surfaces of the first and the second memory cell abutting a portion of the insulation region facing each other.

8. The method of claim 1, wherein the portion of the insulation region is the entire vertical surface of a portion of the bottom electrode facing the bit line contact.

9. The method of claim 1, and further comprising:
forming a second memory cell adjacent the bit line contact, the exposed surface portions of the first memory cell and the second memory cell facing each other.

10. The method of claim 1, wherein forming recesses further comprises:
exposing an entire vertical exterior surface of the container in one portion and less than the entire vertical exterior surface in another portion.

11. The method of claim 1, wherein forming the dielectric layer further comprises forming the layer with at least two elevations at which the dielectric layer extends away from the bottom electrode and toward the bit line contact.

12. A method of forming a memory cell, comprising:
forming a bottom electrode of a capacitor having a container shape with exterior and interior surfaces in a supporting dielectric insulation region abutting a portion of the exterior surface of the bottom electrode;
forming a substantially vertically extending bit line contact extending from a vertical height above the bottom electrode to a source/drain region of an access transistor;
forming a dielectric layer over the interior surface and the exterior surface not abutting the insulation region; and
forming a top plate over the dielectric layer; wherein forming the dielectric layer and top plate further comprises:
depositing an oxide over the insulation layer;
patterning the oxide to cover at least a portion of the insulation layer between the bottom electrode and a bit line contact site; and
etching uncovered portions of the insulation layer.

13. The method of claim 12, wherein the oxide is formed with a plasma deposition process.

14. The method of claim 12, and further comprising wet dripping after etching.

15. The method of claim 12, wherein patterning the oxide further comprises aligning the patterned oxide over the bit line contact site and the insulation layer portion surrounding the bit line contact site.

16. The method of claim 12, wherein depositing and patterning the oxide substantially stops encroachment of the top plate toward the bit line contact site.

17. The method of claim 12, wherein the dielectric layer and top plate are deposited over the bottom electrode and the oxide remaining after etching.

18. A method of forming a memory cell, comprising:
forming a bottom electrode of a capacitor having a container shape with exterior and interior surfaces in a supporting dielectric insulation region abutting a portion of the exterior surface of the bottom electrode;
forming a substantially vertically extending bit line contact extending from a vertical height above the bottom electrode to a source/drain region of an access transistor;
forming a patterned oxide layer above the insulation region and a top of the bottom electrode;
etching portions of the insulation region not covered by the oxide layer;
forming a dielectric layer over the interior surface, the exterior surface not abutting the insulation region, and the remaining oxide; and
forming a top plate over the dielectric layer.

19. The method of claim 18, wherein forming a top plate further comprises removing the oxide layer and a portion of the top plate over the bit line contact site.

* * * * *

UNITED STATES PATENT AND TRADEMARK OFFICE
CERTIFICATE OF CORRECTION

| | |
|---|---|
| PATENT NO. | : 7,625,795 B2 |
| APPLICATION NO. | : 11/217742 |
| DATED | : December 1, 2009 |
| INVENTOR(S) | : D. Mark Durcan et al. |

It is certified that error appears in the above-identified patent and that said Letters Patent is hereby corrected as shown below:

In column 14, line 11, in Claim 14, delete "dripping" and insert -- dipping --, therefor.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,625,795 B2 Page 1 of 1
APPLICATION NO. : 11/217742
DATED : December 1, 2009
INVENTOR(S) : Durcan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 462 days.

Signed and Sealed this

Twenty-first Day of December, 2010

David J. Kappos
*Director of the United States Patent and Trademark Office*